(12) United States Patent
Tsubaki et al.

(10) Patent No.: US 8,546,063 B2
(45) Date of Patent: Oct. 1, 2013

(54) ORGANIC SOLVENT DEVELOPMENT OR MULTIPLE DEVELOPMENT PATTERN-FORMING METHOD USING ELECTRON BEAMS OR EUV RAYS

(75) Inventors: Hideaki Tsubaki, Shizuoka (JP); Koji Shirakawa, Shizuoka (JP); Toru Tsuchihashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 67 days.

(21) Appl. No.: 13/202,389

(22) PCT Filed: Feb. 19, 2010

(86) PCT No.: PCT/JP2010/053014
§ 371 (c)(1),
(2), (4) Date: Aug. 19, 2011

(87) PCT Pub. No.: WO2010/095763
PCT Pub. Date: Aug. 26, 2010

(65) Prior Publication Data
US 2011/0300485 A1    Dec. 8, 2011

(30) Foreign Application Priority Data
Feb. 20, 2009 (JP) ................................ 2009-038666

(51) Int. Cl.
*G03C 5/00* (2006.01)
(52) U.S. Cl.
USPC ........... 430/296; 430/325; 430/326; 430/331; 430/942
(58) Field of Classification Search
USPC .......................... 430/296, 325, 326, 331, 942
See application file for complete search history.

(56) References Cited

U.S. PATENT DOCUMENTS

| | | | |
|---|---|---|---|
| 5,665,527 A | 9/1997 | Allen et al. | |
| 7,985,534 B2 | 7/2011 | Tsubaki | |
| 7,998,655 B2 | 8/2011 | Tsubaki | |
| 8,017,298 B2 | 9/2011 | Tsubaki | |
| 8,017,304 B2 | 9/2011 | Tarutani et al. | |
| 8,034,547 B2 | 10/2011 | Tsubaki et al. | |
| 8,071,272 B2 | 12/2011 | Tsubaki | |
| 8,088,557 B2 | 1/2012 | Tsubaki | |
| 8,227,183 B2 * | 7/2012 | Tsubaki et al. ............... | 430/434 |
| 8,241,840 B2 | 8/2012 | Tsubaki et al. | |
| 2006/0147836 A1 | 7/2006 | Hatakeyama et al. | |
| 2006/0189138 A1 | 8/2006 | Nishimura et al. | |
| 2007/0087288 A1 | 4/2007 | Nishiyama et al. | |
| 2008/0187860 A1 | 8/2008 | Tsubaki et al. | |
| 2008/0261150 A1 | 10/2008 | Tsubaki et al. | |
| 2011/0045413 A1 | 2/2011 | Tsubaki | |
| 2011/0229832 A1 | 9/2011 | Kamimura et al. | |
| 2011/0250543 A1 | 10/2011 | Tsubaki | |
| 2011/0300485 A1 | 12/2011 | Tsubaki et al. | |
| 2011/0305992 A1 | 12/2011 | Tarutani et al. | |
| 2012/0088194 A1 | 4/2012 | Tsubaki | |
| 2012/0135355 A1 | 5/2012 | Tsubaki | |

FOREIGN PATENT DOCUMENTS

| | | |
|---|---|---|
| EP | 1338921 A2 | 8/2003 |
| EP | 1939691 A2 | 7/2008 |
| JP | 62-175739 A | 8/1987 |
| JP | 7-261392 A | 10/1995 |
| JP | 3277114 B2 | 2/2002 |
| JP | 2002-148806 A | 5/2002 |
| JP | 2006-227174 A | 8/2006 |
| JP | 2008-268935 A | 11/2008 |
| JP | 2008-292975 A | 12/2008 |

OTHER PUBLICATIONS

International Search Report [PCT/ISA/210] issued in corresponding International application No. PCT/JP2010/053014 on Mar. 23, 2010.
Written Opinion of the International Searching Authority [PCT/ISA/237] issued in corresponding International application No. PCT/JP2010/053014 on Mar. 23, 2010.
Extended European Search Report dated Jun. 12, 2012 issued by the European Patent Office in counterpart European Application No. 10743883.0.
Office Action dated Jan. 9, 2013 in U.S. Appl. No. 13/588,762.

* cited by examiner

*Primary Examiner* — Christopher Young
(74) *Attorney, Agent, or Firm* — Sughrue Mion, PLLC

(57) ABSTRACT

Provided is a pattern-forming method including, in the following order: (1) a process of forming a film with an actinic ray-sensitive or radiation-sensitive resin composition comprising a resin which contains an acid-decomposable repeating unit and is capable of decreasing the solubility in an organic solvent by the action of an acid; (2) a process of exposing the film with an electron beam or an EUV ray; and (4) a process of developing the film with a developer containing an organic solvent.

33 Claims, No Drawings

ORGANIC SOLVENT DEVELOPMENT OR MULTIPLE DEVELOPMENT PATTERN-FORMING METHOD USING ELECTRON BEAMS OR EUV RAYS

TECHNICAL FIELD

The present invention relates to a pattern-forming method with a developer containing an organic solvent which is preferably used in super-micro-lithography process such as the manufacture of super LSI and high capacity microchips, and other photo-fabrication processes. More specifically, the invention relates to a pattern forming method with a developer containing an organic solvent capable of being preferably used in fine process of semiconductor devices using an electron beam or an EUV (wavelength: around 13 nm) ray.

BACKGROUND ART

In manufacturing process of semiconductor devices such as IC and LSI, fine process by lithography with a photoresist composition has been conventionally carried out. In recent years, ultrafine pattern formation of a sub-micron region and a quarter micron region has been required with higher integration of integrated circuits. In such a circumstance, exposure wavelength also shows a tendency to become shorter such as from a g line to an i line, and further to a KrF excimer laser ray. Further, besides a KrF excimer laser ray, development of lithography using an electron beam, an X-ray or an EUV ray is also now progressing.

Lithography using electron beam, X-ray or EUV ray is positioned as a pattern-forming technique of the next generation or the next of the next generation, and resist compositions of high sensitivity and high resolution are desired.

In particular, for shortening processing time of wafers, increase of sensitivity is a very important subject. However, pursuit of higher sensitization is accompanied by lowering of pattern form and resolution that is represented by limiting resolution line width, accordingly development of a resist composition satisfying these characteristics at the same time is strongly desired.

High sensitivity, high resolution and good pattern form are in a relationship of trade-off, and it is very important how to meet these characteristics at the same time.

There are generally two types of actinic ray-sensitive or radiation-sensitive resin compositions, that is, one is a "positive" resin composition using a resin hardly soluble or insoluble in an alkali developer and capable of forming a pattern by making an exposed part soluble in an alkali developer by exposure with radiation, and another is a "negative" resin composition using a resin soluble in an alkali developer and capable of forming a pattern by making an exposed part hardly soluble or insoluble in an alkali developer by exposure with radiation.

As such actinic ray-sensitive or radiation-sensitive resin compositions suitable for lithographic process using electron beams, X-rays or EUV rays, chemical amplification positive resist compositions primarily utilizing acid catalytic reaction are examined from the viewpoint of the increase in sensitivity, and chemical amplification positive resist composition comprising phenolic resin having a property insoluble or hardly soluble in an alkali developer and capable of being soluble in an alkali developer by the action of an acid (hereinafter abbreviated to a phenolic acid-decomposable resin), and an acid generator as the main components are effectively used.

On the other hand, in manufacturing semiconductor devices and the like, there are requirements to form patterns having various shapes such as lines, trenches, holes, etc. For meeting the requirements for forming patterns having various shapes, not only positive compositions but also negative actinic ray-sensitive or radiation-sensitive resin compositions have also been developed (for example, refer to JP-A-2002-148806 (The term "JP-A" as used herein refers to an "unexamined published Japanese patent application".) and JP-A-2008-268935).

In forming super fine patterns, further improvements of the reductions of resolution and a pattern form are required.

For solving these problems, a method of developing an acid-decomposable resin with a developer other than an alkali developer is also proposed (for example, refer to JP-A-62-175739, JP-A-2006-227174 and JP-A-2008-292975).

Further, there is known a pattern-forming method to utilize that the main chain of a resin is directly cut by exposure (for example, refer to Japanese Patent No. 3277114).

However, it is the present state of things that high sensitivity, high resolution, a good pattern form and a residual film rate in a super fine processing region are not satisfied at the same time.

SUMMARY OF INVENTION

An object of the invention is to solve the problems in the techniques for improving performance in fine processing of semiconductor devices using electron beams or EUV rays, and another object is to provide a pattern-forming method which satisfies high sensitivity, high resolution, a good pattern form and a residual film rate at the same time.

As a result of eager examinations, the present inventors have found that the above objects are achieved by pattern exposure of an actinic ray-sensitive or radiation-sensitive resin composition containing a resin capable of decreasing the solubility in an organic solvent by the action of an acid, and then development of an unexposed part with a developer containing an organic solvent.

That is, the invention is as follows.

1. A pattern-forming method comprising, in the following order: (1) a process of forming a film with an actinic ray-sensitive or radiation-sensitive resin composition comprising a resin which contains an acid-decomposable repeating unit and is capable of decreasing the solubility in an organic solvent by the action of an acid; (2) a process of exposing the film with an electron beam or an EUV ray; and (4) a process of developing the film with a developer containing an organic solvent.

2. The pattern-forming method as described in the above item 1, further comprising: a process of developing the film with an alkali aqueous solution.

3. The pattern-forming method as described in the above item 1 or 2, wherein the organic solvent contained in the developer used in the process (4) is one or more solvents selected from the group consisting of an ester solvent, a ketone solvent, an alcohol solvent, an amide solvent, an ether solvent, and a hydrocarbon solvent.

4. The pattern-forming method as described in the above item 3, wherein the organic solvent contained in the developer used in the process (4) is a solvent represented by the following formula (S1):

$$R-C(=O)-O-R' \qquad (S1)$$

wherein each of R and R' independently represents a hydrogen atom, an alkyl group, a cycloalkyl group, an alkoxy group, an alkoxycarbonyl group, a carboxyl group, a hydroxyl group, a cyano group, or a halogen atom, and R and R' may be bonded to each other to form a ring.

5. The pattern-forming method as described in the above item 3, wherein the organic solvent contained in the developer used in the process (4) is a solvent represented by the following formula (S2):

R"—C(=O)—O—R'"—O—R"" (S2)

wherein each of R" and R"" independently represents a hydrogen atom, an alkyl group, a cycloalkyl group, an alkoxy group, an alkoxycarbonyl group, a carboxyl group, a hydroxyl group, a cyano group, or a halogen atom, and R" and R"" may be bonded to each other to form a ring; and R'" represents an alkylene group or a cycloalkylene group.

6. The pattern-forming method as described in the above item 3, wherein the organic solvent contained in the developer used in the process (4) is one or more solvents selected from the group consisting of butyl acetate, pentyl acetate, isopentyl acetate, propylene glycol monomethyl ether acetate, and anisole.

7. The pattern-forming method as described in any of the above items 1 to 6, further comprising: (5) a process of rinsing the film with a rinsing liquid containing an organic solvent after the process (4).

8. The pattern-forming method as described in the above item 7, wherein the organic solvent contained in the rinsing liquid used in the process (5) is one or more solvents selected from the group consisting of a monohydric alcohol and a hydrocarbon solvent.

9. The pattern-forming method as described in the above item 7, wherein the organic solvent contained in the rinsing liquid used in the process (5) is one or more solvents selected from the group consisting of 1-hexanol, 4-methyl-2-pentanol, and decane.

10. The pattern-forming method as described in any of the above items 1 to 9, further comprising: (3) a baking process between the exposure process (2) and the development process (4).

11. The pattern-forming method as described in any of the above items 1 to 10, wherein the actinic ray-sensitive or radiation-sensitive resin composition comprises: (A) the resin containing an acid-decomposable repeating unit and being capable of decreasing the solubility in an organic solvent by the action of an acid; (B) a compound generating an acid upon irradiation with an actinic ray or radiation; and (C) a solvent.

12. The pattern-forming method as described in the above item 11, wherein the resin (A) is a resin containing a repeating unit represented by the following formula (1):

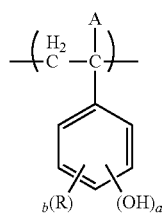

(1)

wherein A represents a hydrogen atom, an alkyl group, a cycloalkyl group, a halogen atom, or a cyano group; R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group or an aryloxycarbonyl group, and when two or more R's are present, each R may be the same as or different from every other R or when two or more R's are present, they may form a ring in combination with each other; a represents an integer of 1 to 3; and b represents an integer of 0 to (3-a).

13. The pattern-forming method as described in the above item 11 or 12, wherein the resin (A) is a resin containing a repeating unit represented by the following formula (AI):

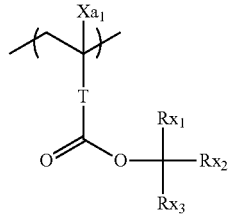

(AI)

wherein $Xa_1$ represents a hydrogen atom or an alkyl group; T represents a single bond or a divalent linking group; and each of $Rx_1$, $Rx_2$ and $Rx_3$ independently represents an alkyl group or a cycloalkyl group, and $Rx_2$ and $Rx_3$ may be bonded to each other to form a cyclic structure.

14. The pattern-forming method as described in the above item 12 or 13, wherein the content of the repeating unit represented by the formula (1) in the resin (A) is 1 to 40 mol %.

15. The pattern-forming method as described in any of the above items 1 to 14, which is a method for forming a fine circuit of a semiconductor device.

DESCRIPTION OF EMBODIMENTS

The best mode for carrying out the invention will be described below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

In the specification, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the invention, the "light" means an actinic ray or radiation.

Further, "exposure" in the specification includes not only exposure with far UV rays, X-rays and EUV rays represented by a mercury lamp and an excimer laser but also imaging by corpuscular rays such as an electron beam and an ion beam unless otherwise indicated.

Pattern-Forming Method

A pattern-forming method in the invention is described in the first place.

A pattern-forming method in the invention includes, in the following order (1) a process of forming a film with an actinic ray-sensitive or radiation-sensitive resin composition containing a resin which contains an acid-decomposable repeating unit and is capable of decreasing the solubility in an organic solvent by the action of an acid, (2) a process of exposing the film, and (4) a process of developing the film with a developer containing an organic solvent.

(1) Film Forming

The film forming can be performed by dissolving the later-described components of an actinic ray-sensitive or radiation-sensitive resin composition in a solvent, filtering, if necessary, through a filter, and applying the resulting solution on a support (a substrate). As the filter, a filter made of polytetrafluoroethylene, polyethylene, or nylon having a pore size of 0.1 μm or less, more preferably 0.05 μm or less, and still more preferably 0.03 μm or less is preferably used.

The composition is applied on a substrate such as the one used in manufacture of an integrated circuit device (e.g., silicon, silicon dioxide coating) by a proper coating method, e.g., with a spin coater or the like. The coated substrate is then dried to form a photosensitive film. In the drying process, to perform heating (prebaking) is preferred.

The film thickness is not especially restricted, but it is preferably adjusted to the range of 10 to 500 nm, more preferably to the range of 10 to 200 nm, and still more preferably to the range of 10 to 80 nm. When the actinic ray-sensitive or radiation-sensitive resin composition is applied with a spinner, the revolution speed is generally 500 to 3,000 rpm, preferably 800 to 2,000 rpm, and more preferably 100 to 1,500 rpm.

The temperature of heating (prebaking) is preferably 60 to 200° C., more preferably 80 to 150° C., and still more preferably 90 to 140° C.

The time of heating (prebaking) is not especially restricted, but the time is preferably 30 to 300 seconds, more preferably 30 to 180 seconds, and still more preferably 30 to 90 seconds.

Heating can be performed with a unit attached to ordinary exposing and developing apparatus, and a hot plate and the like may also be used.

If necessary, a commercially available inorganic or organic antireflection film can be used. Further, an antireflection film may be provided as the under layer of an actinic ray-sensitive or radiation-sensitive resin composition. As the antireflection films, either an inorganic film, e.g., titanium, titanium dioxide, titanium nitride, chromium oxide, carbon, amorphous silicon, etc., or an organic film comprising a light absorber and a polymer material may be used. As organic antireflection films, commercially available organic antireflection films, such as DUV 30 series and DUV 40 series (manufactured by Brewer Science) and AR-2, AR-3 and AR-5 (manufactured by Shipley Company L.L.C.) may also be used.

(2) Exposure

The formed film is irradiated with EUV rays (in the vicinity of 13 nm) through a prescribed mask. Incidentally, in irradiation with electron beams (EB), imaging (direct drawing) not via a mask is generally carried out.

(3) Baking

After exposure, it is preferred to perform baking (heating) before development.

Heating temperature is preferably 60 to 150° C., more preferably 80 to 150° C., and still more preferably 90 to 140° C.

Heating time is not especially restricted but is preferably 30 to 300 seconds, more preferably 30 to 180 seconds, and still more preferably 30 to 90 seconds.

Heating can be performed with a unit attached to ordinary exposing and developing apparatus, and a hot plate and the like may also be used.

The reaction at an exposed part is expedited by baking and sensitivity and a pattern profile are improved. It is also preferred to contain a heating process (post bake) after a rinsing process. The heating temperature and heating time are as described above. The developer and rinsing liquid remaining between patterns and inside of the pattern are removed by baking.

(4) Development

In the invention, development is performed with a developer containing an organic solvent.

Developer

The vapor pressure of a developer (in the case of a mixed solvent, the vapor pressure as a whole) at 20° C. is preferably 5 kPa or less, more preferably 3 kPa or less, and especially preferably 2 kPa or less. By making the vapor pressure of an organic solvent 5 kPa or less, evaporation of the developer on a substrate or in a developing cup is inhibited and evenness of temperature in a wafer surface is improved, as a result dimensional evenness in the wafer surface is bettered.

As organic solvents used for the developer, various organic solvents are widely used. For example, ester solvents, ketone solvents, alcohol solvents, amide solvents, ether solvents and hydrocarbon solvents can be used.

In the invention, the ester solvents are solvents having an ester group in the molecule, the ketone solvents are solvents having a ketone group in the molecule, the alcohol solvents are solvents having an alcoholic hydroxyl group in the molecule, the amide solvents are solvents having an amide group in the molecule, and the ether solvents are solvents having an ether bond in the molecule. Of these solvents, solvents having a plurality of functional groups in one molecule are present. In such a case, these solvents are to come within the purview of all the kinds of solvents containing the functional groups that the solvents have. For example, diethylene glycol monomethyl ether is applicable to both of the alcohol solvents and the ether solvents of the above classification. Further, the hydrocarbon solvents are solvents not having a substituent.

In particular, a developer containing at least one solvent selected from the ketone solvents, ester solvents, alcohol solvents and ether solvents is preferred as the developer.

As the examples of the ester solvents, e.g., methyl acetate, ethyl acetate, butyl acetate, pentyl acetate, isopropyl acetate, amyl acetate, isoamyl acetate, ethyl methoxyacetate, ethyl ethoxyacetate, propylene glycol monomethyl ether acetate (PGMEA, another name: 1-methoxy-2-acetoxypropane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxy-butyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl-2-hydroxy propionate, ethyl-2-hydroxy propionate, methyl-3-methoxy propionate, ethyl-3-methoxy propionate, ethyl-3-ethoxy propionate, and propyl-3-methoxy propionate are exemplified.

As the examples of the ketone solvents, e.g., 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylene carbonate, and γ-butyrolactone are exemplified.

As the examples of the alcohol solvents, alcohols, e.g., methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol, 3-methoxy-1-butanol, etc., glycol solvents, e.g., ethylene glycol, diethylene glycol, triethylene glycol, etc., and glycol ether solvents having a hydroxyl group, e.g., ethylene glycol monomethyl ether, propylene glycol monomethyl ether (PGME, another name: 1-methoxy-2-propanol), diethylene glycol monomethyl ether, triethylene glycol monoethyl ether, methoxymethylbutanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, propylene glycol monophenyl ether, etc., are exemplified. Of these alcohol solvents, the glycol ether solvents are preferably used.

As the examples of the ether solvents, besides the glycol ether solvents having a hydroxyl group as above, glycol ether solvents not having a hydroxyl group, e.g., propylene glycol dimethyl ether, propylene glycol diethyl ether, diethylene glycol dimethyl ether, diethylene glycol diethyl ether, etc., aromatic ether solvents, e.g., anisole, phenetole, etc., and dioxane, tetrahydrofuran, tetrahydropyran, perfluoro-2-butyl tetrahydrofuran, perfluorotetrahydrofuran, 1,4-dioxane, etc., are exemplified. Glycol ether solvents and aromatic ether solvents such as anisole are preferably used.

As the examples of the amide solvents, e.g., N-methyl-2-pyrrolidone, N,N-dimethylacetamide, N,N-dimethylformamide, hexamethyl phosphoric triamide, 1,3-dimethyl-2-imidazolidinone, etc., can be used.

As the examples of the hydrocarbon solvents, aliphatic hydrocarbon solvents, e.g., pentane, hexane, octane, decane, 2,2,4-trimethylpentane, 2,2,3-trimethylhexane, perfluorohexane, perfluoroheptane, etc., and aromatic hydrocarbon solvents e.g., toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene, dipropylbenzene, etc., are exemplified. Of these hydrocarbon solvents, aromatic hydrocarbon solvents are preferably used.

Two or more of these solvents may be blended, or they may be used as mixture with solvents other than the above solvents and water.

The concentration of the organic solvent (when two or more solvents are blended, as total) in a developer is preferably 50% by mass or more, more preferably 70% by mass or more, and still more preferably 90% by mass or more. Especially preferred is the case consisting of organic solvents alone. Incidentally, the case consisting of organic solvents alone includes the case containing a trace amount of a surfactant, an antioxidant, a stabilizer, a defoaming agent, etc.

Of the above solvents, it is more preferred to contain one or more solvents selected from the group consisting of butyl acetate, pentyl acetate, isopentyl acetate, propylene glycol monomethyl ether acetate, and anisole.

When the above solvents are used for the actinic ray-sensitive or radiation-sensitive resin composition containing the later-described resin A-1, an organic solvent for use as the developer is preferably an ester solvent.

As the ester solvents, it is more preferred to use the later-described solvent represented by formula (S1) or the later-described solvent represented by formula (S2), it is still more preferred to use the solvent represented by formula (S1), it is especially preferred to use alkyl acetate, and it is most preferred to use butyl acetate, pentyl acetate, or isopentyl acetate.

R—C(=O)—O—R'  (S1)

In formula (S1), each of R and R' independently represents a hydrogen atom, an alkyl group, a cycloalkyl group, an alkoxy group, an alkoxycarbonyl group, a carboxyl group, a hydroxyl group, a cyano group, or a halogen atom, and R and R' may be bonded to each other to form a ring.

The number of carbon atoms in the alkyl group, alkoxyl group and alkoxycarbonyl group of R and R' is preferably from 1 to 15, and the number of carbon atoms in the cycloalkyl group is preferably from 3 to 15.

Each of R and R' preferably represents a hydrogen atom or an alkyl group, and the alkyl group, cycloalkyl group, alkoxyl group and alkoxycarbonyl group of R and R' and the ring formed by bonding R and R' to each other may be substituted with a hydroxyl group, a carbonyl group-containing group (e.g., acyl, aldehyde, alkoxycarbonyl), or a cyano group.

As the examples of the solvents represented by formula (S1), e.g., methyl acetate, butyl acetate, ethyl acetate, isopropyl acetate, amyl acetate, isoamyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl-2-hydroxy propionate, ethyl-2-hydroxy propionate, etc., are exemplified.

Of the above, each of R and R' is preferably an unsubstituted alkyl group.

The solvent represented by formula (S1) is preferably alkyl acetate, and more preferably butyl acetate, pentyl acetate or isopentyl acetate.

The solvent represented by formula (S1) may be used in combination with one or more other organic solvents. The solvents for use in combination in this case are not especially restricted so long as they can be mixed with the solvent represented by formula (S1) without separation. The solvents represented by formula (S1) may be mixed with each other. The solvent represented by formula (S1) may be used as mixture with the solvent selected from other ester solvents, ketone solvents, alcohol solvents, amide solvents, ether solvents and hydrocarbon solvents. One or more solvents may be used in combination, but for obtaining stable performance, the solvent to be used in combination is preferably one kind. When one kind of a solvent is used in combination as mixture, the mixing ratio of the solvents represented by formula (S1) and the solvent to be used in combination is generally 20/80 to 99/1 as mass ratio, preferably 50/50 to 97/3, more preferably 60/40 to 95/5, and most preferably 60/40 to 90/10.

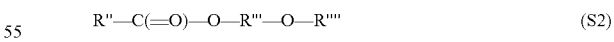

R"—C(=O)—O—R'"—O—R""  (S2)

In formula (S2), each of R" and R"" independently represents a hydrogen atom, an alkyl group, a cycloalkyl group, an alkoxy group, an alkoxycarbonyl group, a carboxyl group, a hydroxyl group, a cyano group, or a halogen atom, and R" and R"" may be bonded to each other to form a ring. Each of R" and R"" preferably represents a hydrogen atom or an alkyl group. The number of carbon atoms in the alkyl group, alkoxyl group and alkoxycarbonyl group of R" and R"" is preferably from 1 to 15, and the number of carbon atoms in the cycloalkyl group is preferably from 3 to 15.

R'" represents an alkylene group or a cycloalkylene group. R'" preferably represents an alkylene group. The number of carbon atoms in the alkylene group of R''' is preferably from 1 to 10, and the number of carbon atoms in the cycloalkylene group of R''' is preferably from 3 to 10.

The alkyl group, cycloalkyl group, alkoxyl group and alkoxycarbonyl group of R'' and R'''', the alkylene group and cycloalkylene group of R''', and the ring formed by bonding R'' and R'''' to each other may be substituted with a hydroxyl group, a carbonyl group-containing group (e.g., acyl, aldehyde, alkoxycarbonyl), or a cyano group.

The alkylene group of R''' in formula (S2) may have an ether bond in the alkylene chain.

The examples of the solvents represented by formula (S2) include, for example, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monoethyl ether acetate, propylene glycol monopropyl ether acetate, methyl-3-methoxy propionate, ethyl-3-methoxy propionate, ethyl-3-ethoxy propionate, propyl-3-methoxy propionate, ethyl methoxyacetate, ethyl ethoxyacetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, etc., with propylene glycol monomethyl ether acetate being preferred.

Of the above, preferably, each of R'' and R'''' represents an unsubstituted alkyl group and R''' represents an unsubstituted alkylene group; more preferably, each of R'' and R'''' represents either a methyl group or an ethyl group; still more preferably, each of R'' and R'''' represents a methyl group.

The solvent represented by formula (S2) may be used in combination with one or more other organic solvents. The solvents for use in combination in this case are not especially restricted so long as they can be mixed with the solvent represented by formula (S2) without separation. The solvents represented by formula (S2) may be mixed with each other. The solvent represented by formula (S2) may be used as mixture with the solvent selected from other ester solvents, ketone solvents, alcohol solvents, amide solvents, ether solvents and hydrocarbon solvents. One or more solvents may be used in combination, but for obtaining stable performance, the solvent to be used in combination is preferably one kind. When one kind of a solvent is used in combination as mixture, the mixing ratio of the solvents represented by formula (S2) and the solvent to be used in combination is generally 20/80 to 99/1 as mass ratio, preferably 50/50 to 97/3, more preferably 60/40 to 95/5, and most preferably 60/40 to 90/10.

When the above solvents are used for the actinic ray-sensitive or radiation-sensitive resin composition containing the later-described resin A-2, organic solvents for use as the developer are preferably ether solvents.

As the ether solvents that can be used, the above-described ether solvents are exemplified. Of the above ether solvents, ether solvents having one or more aromatic rings are preferred, more preferably a solvent represented by the following formula (S3), and most preferably anisole.

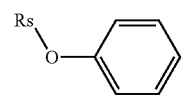

(S3)

In formula (S3), Rs represents an alkyl group. The alkyl group is preferably an alkyl group having 1 to 4 carbon atoms, more preferably a methyl group or an ethyl group, and most preferably a methyl group.

In the present invention, the water content of the developer is usually 10% by mass or less, preferably 5% by mass or less, more preferably 1% by mass or less, and it is most preferred that the developer contains substantially no water.

Surfactant

The developer containing an organic solvent may contain an appropriate amount of a surfactant according to necessity.

As the solvent, the same solvents as those used in the later-described actinic ray-sensitive or radiation-sensitive resin composition can be used.

The amount of the surfactant to be used is generally 0.001 to 5% by mass of all the amount of the developer, preferably 0.005 to 2% by mass, and more preferably 0.01 to 0.5% by mass.

Developing Method

As a method of development, for example, a method of dipping a substrate in a tank filled with a developer for a prescribed time (a dipping method), a method of development by swelling a developer by surface tension to slightly above the surface of a substrate and standing still for a prescribed time (a paddling method), a method of spraying a developer on the surface of a substrate (a spraying method), and a method of continuously ejecting a developer by scanning a developer ejecting nozzle at a constant speed on a substrate revolving at a constant speed (a dynamic dispensing method) can be applied.

After the developing process, a process of stopping development while replacing the developer with other solvent may be performed.

The developing time is not especially restricted so long as it is sufficient for the resin in an unexposed part to be dissolved thoroughly, and is generally 10 to 300 seconds, and preferably 20 to 120 seconds.

The temperature of the developer is preferably 0 to 50° C., and more preferably 15 to 35° C.

(5) Rinsing

In the pattern-forming method in the invention, (5) a rinsing process of cleaning the substrate with a rinsing liquid containing an organic solvent can be included after the developing process (4).

Rinsing Liquid

The vapor pressure of a rinsing liquid to be used after development (in the case of a mixed solvent, the vapor pressure as a whole) at 20° C. is preferably 0.05 kPa or more and 5 kPa or less, more preferably 0.1 kPa or more and 5 kPa or less, and most preferably 0.12 kPa or more and 3 kPa or less. By making the vapor pressure of a rinsing liquid 0.05 kPa or more and 5 kPa or less, evenness of in-plane temperature of a wafer is improved, swelling attributable to the immersion of a rinsing liquid is restrained, and evenness of in-plane dimension of a wafer is bettered.

Various organic solvents are used as the rinsing liquid, and it is preferred to use a rinsing liquid containing at least one organic solvent selected from hydrocarbon solvents, ketone solvents, ester solvents, alcohol solvents, amide solvents, and ether solvents, or water.

When the above rinsing liquid is used for the actinic ray-sensitive or radiation-sensitive resin composition containing the later-described resin A-1, it is more preferred to perform a rinsing process with a rinsing liquid containing at least one organic solvent selected from ketone solvents, ester solvents, alcohol solvents, amide solvents, and hydrocarbon solvents after development. More preferred is to perform a rinsing process with a rinsing liquid containing an alcohol solvent or a hydrocarbon solvent after development.

Especially preferred is to use a rinsing liquid containing one or more solvents selected from monohydric alcohols and hydrocarbon solvents.

As the monohydric alcohols for use in the rinsing process after development, straight chain, branched, or cyclic monohydric alcohols are exemplified. Specifically, 1-butanol, 2-butanol, 3-methyl-1-butanol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol, 4-methyl-3-pentanol, cyclohexanol, 5-methyl-2-hexanol, 4-methyl-2-hexanol, 4,5-dityl-2-hexanol, 6-methyl-2-heptanol, 7-methyl-2-octanol, 8-methyl-2-nonal, 9-methyl-2-decanol, etc., can be used. Of these alcohols, 1-hexanol, 2-hexanol, 1-pentanol, 3-methyl-1-butanol, 3-methyl-2-pentanol, 3-methyl-3-pentanol, 4-methyl-2-pentanol, and 4-methyl-3-pentanol are preferred, and 1-hexanol and 4-methyl-2-pentanol are most preferred.

As the hydrocarbon solvents, aromatic hydrocarbon solvents such as toluene, xylene, etc., and aliphatic hydrocarbon solvents such as octane, decane, etc., are exemplified.

The rinsing liquid more preferably contains one or more selected from the group consisting of 1-hexanol, 4-methyl-2-pentanol and decane.

When the above rinsing liquid is used for the actinic ray-sensitive or radiation-sensitive resin composition containing the later-described resin A-2, it is more preferred to perform a rinsing process with a rinsing liquid containing a hydrocarbon solvent after development.

Two or more of the above components may be mixed, or the above solvents may be mixed with organic solvents other than the above. The above solvents may be mixed with water but the water content in a rinsing liquid is generally 60% by mass or less, preferably 30% by mass or less, more preferably 10% by mass or less, and most preferably 5% by mass or less. By making the water content 60% by mass or less, good rinsing characteristics can be secured.

A proper amount of a surfactant may be contained in a rinsing liquid.

As the surfactant, the same surfactants as those used in the later-described actinic ray-sensitive or radiation-sensitive resin composition can be used, and the amount of the surfactant is generally 0.001 to 5% by mass of all the amount of the rinsing liquid, preferably 0.005 to 2% by mass, and more preferably 0.01 to 0.5% by mass.

Rinsing Method

In a rinsing process, a developed wafer is subjected to rinsing treatment with a rinsing liquid containing the above organic solvent.

The method of rinsing treatment is not especially restricted, and, for example, a method of continuously ejecting a rinsing liquid on a substrate rotating at a constant speed (a rotary ejecting method), a method of dipping a substrate in a tank filled with a rinsing liquid for a prescribed time (a dipping method), and a method of spraying a rinsing liquid on the surface of a substrate (a spraying method) can be applied. Of these methods, it is preferred to perform cleaning process by the rotary ejecting method and, after cleaning, remove the rinsing liquid from the substrate by revolving the substrate by revolution of 2,000 to 4,000 rpm.

The time of rinsing is not particularly limited, and it is generally 10 to 300 seconds, preferably 10 to 180 seconds, and most preferably 20 to 120 seconds.

The temperature of the rinsing liquid is preferably 0 to 50° C., and more preferably 15 to 35° C.

Further, after development or rinsing process, the developer or the rinsing liquid adhered on a pattern can be removed by supercritical fluid.

Further, after the development process or rinsing process or the process by supercritical fluid, heating process can be carried out for taking clear away the solvent remaining in the pattern. The temperature of heating is not especially restricted so long as a good resist pattern can be obtained, and is generally 40 to 160° C., preferably 50° C. or more and 150° C. or less, and most preferably 50° C. or more and 110° C. or less. The heating time is not especially restricted so long as a good resist pattern can be obtained, and is generally 15 to 300 seconds and preferably 15 to 180 seconds.

Alkali Development

The pattern-forming method in the invention can further include a process of development with an alkali aqueous solution to form a resist pattern (an alkali development process), by which a further finer pattern can be formed.

In the invention, a part where exposure strength is weak is removed by the organic solvent developing process (4), and a part where exposure strength is strong is also removed by further performing the alkali development process. By multiple development process of performing a plurality of development processes like this, a pattern can be formed without dissolving an area of intermediate exposure strength alone, so that a pattern that is finer than a usual pattern can be formed (the same mechanism as disclosed in JP-A-2008-292975 [0077]).

The alkali development may be performed either before or after the developing process (4) with a developer containing an inorganic solvent, but it is more preferred to be performed before the organic solvent developing process (4).

As the alkali aqueous solution for use in the alkali development, for example, alkaline aqueous solutions such as inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, di-n-butylamine, etc., tertiary amines, e.g., triethylamine, methyldiethylamine, etc., alcohol amines, e.g., dimethylethanolamine, triethanolamine, etc., quaternary ammonium salts, e.g., tetramethylammonium hydroxide, tetraethylammonium hydroxide, etc., and cyclic amines, e.g., pyrrole, piperidine, etc., are exemplified.

Further, appropriate amounts of alcohols and surfactants can be added to the above alkaline aqueous solutions.

The alkali concentration of the alkali developer is generally 0.1 to 20% by mass.

The pH of the alkali developer is generally 10.0 to 15.0.

A 2.38% by mass aqueous solution of tetramethylammonium hydroxide is especially preferred.

The time of alkali development is not especially restricted and the time is generally 10 to 300 seconds and preferably 20 to 120 seconds.

The temperature of the alkali developer is preferably 0 to 50° C. and more preferably 15 to 35° C.

After development with an alkali aqueous solution, a rinsing process can be carried out. Pure water is preferred as a rinsing liquid in the rinsing process, and a proper amount of a surfactant can also be added.

Further, after the development process or the rinsing process, heating treatment can be conducted for the purpose of removing the water content remaining in a pattern.

Further, processing for removing the residual developer or rinsing liquid can be done by heating. The heating temperature is not especially restricted so long as a good resist pattern can be obtained, and it is generally 40 to 160° C., preferably 50° C. or more and 150° C. or less, and most preferably 50° C. or more and 110° C. or less. The heating time is not especially restricted so long as a good resist pattern can be obtained, and it is generally 15 to 300 seconds and preferably 15 to 180 seconds.

[An Actinic Ray-Sensitive or Radiation-Sensitive Resin Composition Containing a Resin Capable of Decreasing the Solubility in an Organic Solvent by the Action of an Acid]

An actinic ray-sensitive or radiation-sensitive resin composition containing a resin capable of decreasing the solubility in an organic solvent by the action of an acid (hereinafter also referred to as merely "a resist composition") which is used in the pattern-forming method of the invention will be described below.

The resist composition containing a resin containing an acid-decomposable repeating unit and being capable of decreasing the solubility in an organic solvent by the action of an acid preferably contains (A) a resin containing an acid-decomposable repeating unit and being capable of decreasing the solubility in an organic solvent by the action of an acid, (B) a compound generating an acid upon irradiation with actinic ray or radiation, and (C) a solvent.

[1] (A) A Resin Containing an Acid-Decomposable Repeating Unit and being Capable of Decreasing the Solubility in an Organic Solvent by the Action of an Acid The resin containing an acid-decomposable repeating unit and being capable of decreasing the solubility in an organic solvent by the action of an acid in the invention is a resin capable of increasing the polarity by the action of an acid and capable of increasing the solubility in an alkali aqueous solution (hereinafter also referred to as "resin (A)" or "resin of component (A)").

The resin (A) of the invention is not especially restricted so long as it is a resin capable of decreasing the solubility in an organic solvent by the action of an acid, but from the viewpoint of secondary electron generating rate in exposure with electron beams and EUV rays, it is preferred for the resin of component (A) to have a benzene ring and more preferred to contain a repeating unit represented by formula (1).

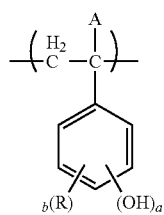

(1)

In formula (1), A represents a hydrogen atom, an alkyl group, a cycloalkyl group, a halogen atom, or a cyano group; R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group or an aryloxycarbonyl group, and when two or more R's are present, each R may be the same as or different from every other R or when two or more R's are present, they may form a ring (preferably a 5- or 6-membered ring) in combination with each other; a represents an integer of 1 to 3, and preferably 1; and b represents an integer of 0 to (3-a), preferably 0 or 1, and more preferably 0.

In formula (1), the alkyl group represented by A may have a substituent, and an alkyl group having 1 to 3 carbon atoms, such as methyl group and ethyl group, is preferred. The cycloalkyl group represented by A may further have a substituent, and may be monocyclic or polycyclic. Examples thereof include a monocyclic cycloalkyl group having 3 to 8 carbon atoms, such as cyclopropyl group, cyclopentyl group and cyclohexyl group. As the halogen atom represented by A, Cl, Br, F, etc., can be exemplified. A preferably represents a hydrogen atom or an alkyl group having 1 to 3 carbon atoms, and especially preferably a hydrogen atom or a methyl group.

R represents a halogen atom, an alkyl group, an alkenyl group, a cycloalkyl group, an aryl group, an aralkyl group, an alkoxy group, an alkylcarbonyloxy group, an alkylsulfonyloxy group, an alkyloxycarbonyl group or an aryloxycarbonyl group, and R may further have a substituent. As the halogen atom represented by R, Cl, Br, F, I, etc., can be exemplified.

R preferably represents a substituted or unsubstituted, straight chain or branched alkyl group having 1 to 8 carbon atoms, a substituted or unsubstituted alkenyl group having 2 to 8 carbon atoms, a substituted or unsubstituted cycloalkyl group having 5 to 10 carbon atoms, a substituted or unsubstituted aryl group having 6 to 15 carbon atoms, a substituted or unsubstituted aralkyl group having 7 to 16 carbon atoms, a substituted or unsubstituted alkoxy group having 1 to 8 carbon atoms, a substituted or unsubstituted alkylcarbonyloxy group having 2 to 8 carbon atoms, a substituted or unsubstituted alkylsulfonyloxy group having 1 to 8 carbon atoms, a substituted or unsubstituted alkyloxycarbonyl group having 1 to 8 carbon atoms, or a substituted or unsubstituted aryloxycarbonyl group having 7 to 16 carbon atoms.

Each of R more preferably independently represents a halogen atom, a substituted or unsubstituted alkyl group having 1 to 4 carbon atoms, a substituted or unsubstituted alkoxy group having 1 to 4 carbon atoms, or a substituted or unsubstituted alkylcarbonyloxy group having 2 to 4 carbon atoms, and especially preferably represents a hydrogen atom, a chlorine atom, a bromine atom, an iodine atom, an alkyl group having 1 to 3 carbon atoms (e.g., a methyl group, an ethyl group, a propyl group, an isopropyl group), or an alkoxy group having 1 to 3 carbon atoms (e.g., a methoxy group, an ethoxy group, a propyloxy group, an isopropyloxy group).

The examples of the substituents that A and R may further have include a halogen atom (e.g., Cl, Br, F), an alkyl group (e.g., a methyl group, an ethyl group, a propyl group, an isopropyl group, a butyl group, a t-butyl group, a hexyl group, etc.), an aryl group (e.g., a phenyl group, a naphthyl group, etc.), an aralkyl group, a hydroxyl group, an alkoxy group (e.g., a methoxy group, an ethoxy group, a butoxy group, an octyloxy group, a dodecyloxy group, etc.), an acyl group (e.g., an acetyl group, a propanoyl group, a benzoyl group, etc.), and an oxo group, and the number of carbon atoms of the substituent is preferably 15 or less.

The hydroxyl group represented by —(OH)a in formula (1) may be positioned at any of a para-position, a meta-position and an ortho-position to the bond from the main chain of the resin, but it is preferred that a hydroxyl group is present at least at either an ortho-position or a meta-position.

The specific examples of the repeating unit represented by formula (1) are shown below, but the invention is not restricted thereto.

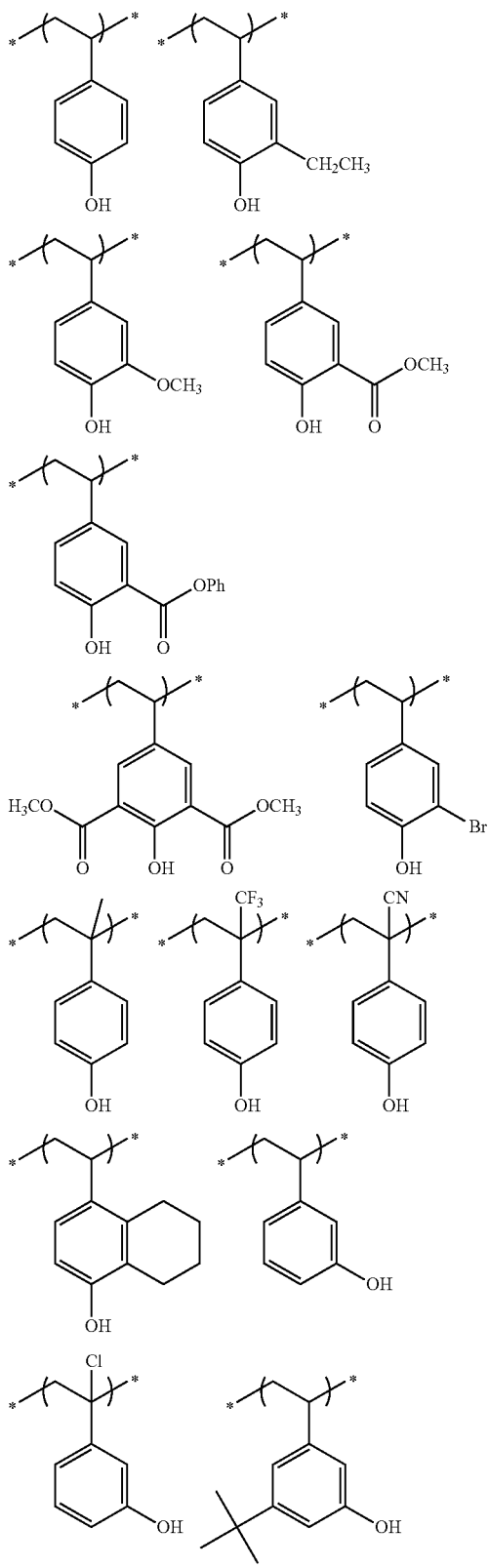

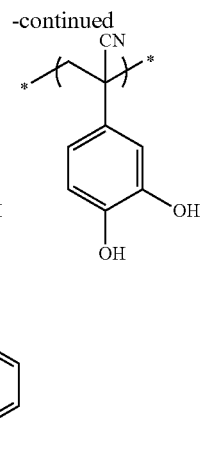

The resin of component (A) for use in the invention has a group capable of decomposing by the action of an acid and generating an alkali-soluble group (hereinafter also referred to as "an acid-decomposable group").

It is preferred for the acid-decomposable group to have such a structure that an alkali-soluble group is protected with a group capable of decomposing and leaving by the action of an acid (i.e. a leaving group).

The solubility in an organic solvent of the alkali-soluble group is lower than that of the alkali-soluble group in the state of being protected with the leaving group. That is, the acid-decomposable group is a group capable of decreasing the solubility in an organic solvent by the action of an acid.

The alkali-soluble group is not especially restricted so long as it is a group capable of dissociating in an alkali developer and becoming an ion, and a carboxyl group, a fluorinated alcohol group (preferably hexafluoroisopropanol), a sulfonic acid group, and a phenolic hydroxyl group are exemplified.
(Resin A-1)

As more preferred resin in the invention, a resin (A-1) having, together with the repeating unit represented by formula (1), a repeating unit having a group protecting a group selected from a carboxyl group, a fluorinated alcohol group (preferably hexafluoroisopropanol), and a sulfonic acid group with a group capable of decomposing and leaving by the action of an acid, as an acid-decomposable group, is exemplified. According to this constitution, a pattern having especially high resolution is obtained by exposure with electron beams and EUV rays, and so preferred.

As the group capable of leaving by the action of an acid of resin A-1, for example, —C($R_{36}$)($R_{37}$)($R_{38}$), —C($R_{36}$)($R_{37}$)(O$R_{39}$), and —C($R_{01}$)($R_{02}$)(O$R_{39}$) can be exemplified.

In the above formulae, each of $R_{36}$ to $R_{39}$ independently represents an alkyl group, a cycloalkyl group, an aryl group, an aralkyl group, or an alkenyl group, and $R_{36}$ and $R_{37}$ may be bonded to each other to form a ring.

Each of $R_{01}$ and $R_{02}$ independently represents a hydrogen atom, an alkyl group, a cycloalkyl group, an aryl group, an aralkyl group, or an alkenyl group.

The alkyl group of $R_{36}$ to $R_{39}$, $R_{01}$ and $R_{02}$ is preferably an alkyl group having 1 to 8 carbon atoms, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be monocyclic or polycyclic. The monocyclic cycloalkyl group is preferably a cycloalkyl group having 3 to 8 carbon atoms, and examples thereof include a cyclopropyl group, a cyclobutyl group, a cyclopentyl group, a cyclohexyl group and a cyclooctyl group. The polycyclic cycloalkyl group is preferably a cycloalkyl group having 6 to 20 carbon atoms, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. A part of carbon atoms in the cycloalkyl group may be replaced with a heteroatom such as oxygen atom.

The aryl group of $R_{36}$ to $R_{39}$, $R_{01}$ and $R_{02}$ is preferably an aryl group having 6 to 10 carbon atoms, and examples thereof include a phenyl group, a naphthyl group and an anthryl group.

The aralkyl group of $R_{36}$ to $R_{39}$, $R_{01}$ and $R_{02}$ is preferably an aralkyl group having 7 to 12 carbon atoms, and examples thereof include a benzyl group, a phenethyl group and a naphthylmethyl group.

The alkenyl group of $R_{36}$ to $R_{39}$, $R_{01}$ and $R_{02}$ is preferably an alkenyl group having 2 to 8 carbon atoms, and examples thereof include a vinyl group, an allyl group, a butenyl group and a cyclohexenyl group.

The examples of the acid-decomposable groups of resin A-1 preferably include a cumyl ester group, an enol ester group, an acetal ester group, and a tertiary alkyl ester group, and more preferably a tertiary alkyl ester group.

As the repeating unit having an acid-decomposable group that resin A-1 can contain, a repeating unit represented by the following formula (AI) is preferred.

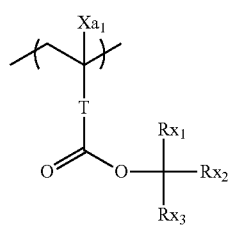

(AI)

In formula (AI), $Xa_1$ represents a hydrogen atom or an alkyl group. The alkyl group is preferably a methyl group which may have a substituent, or a group represented by —$CH_2$—$R_9$. $R_9$ represents a hydroxyl group, a halogen atom, a cyano group, or a monovalent organic group, and the monovalent organic group is, for example, an alkyl group having 5 or less carbon atoms, or an acyl group, preferably an alkyl group having 3 or less carbon atoms, and more preferably a methyl group. $Xa_1$ preferably represents a hydrogen atom, a methyl group, a trifluoromethyl group, or a hydroxymethyl group.

T represents a single bond or a divalent linking group.

Each of $Rx_1$, $Rx_2$ and $Rx_3$ independently represents an alkyl group (straight chain or branched), or a cycloalkyl group (monocyclic or polycyclic).

$Rx_2$ and $Rx_3$ may be bonded to each other to form a cycloalkyl group (monocyclic or polycyclic).

As the examples of the divalent linking groups represented by T, an alkylene group, a —COO-Rt- group, an —O-Rt- group and a group formed by combining two or more of these groups are exemplified. In the formulae, Rt represents an alkylene group or a cycloalkylene group. The total number of carbon atoms in the divalent linking group of T is preferably from 1 to 20, more preferably from 1 to 15, still more preferably from 2 to 10.

T preferably represents a single bond or a —COO-Rt- group. Rt preferably represents an alkylene group having 1 to 5 carbon atoms, and more preferably a —$CH_2$— group or a —$(CH_2)_3$— group.

As the alkyl group represented by each of $Rx_1$, $Rx_2$ and $Rx_3$, alkyl groups having 1 to 4 carbon atoms, such as a methyl group, an ethyl group, an n-propyl group, an isopropyl group, an n-butyl group, an isobutyl group, and a t-butyl group are preferably exemplified.

As the cycloalkyl group represented by each of $Rx_1$, $Rx_2$ and $Rx_3$, monocyclic cycloalkyl groups, e.g., a cyclopentyl group and a cyclohexyl group, and polycyclic cycloalkyl groups, e.g., a norbornyl group, a tetracyclodecanyl group, a tetracyclododecanyl group, and an adamantyl group are preferably exemplified.

The cycloalkyl group formed by bonding $Rx_2$ and $Rx_3$ is preferably a monocyclic cycloalkyl group, e.g., a cyclopentyl group and a cyclohexyl group, or a polycyclic cycloalkyl group, e.g., a norbornyl group, a tetracyclodecanyl group, a tetracyclododecanyl group, and an adamantyl group, more preferably a monocyclic cycloalkyl group having 5 or 6 carbon atoms.

The embodiment of $Rx_1$ being the methyl group or the ethyl group, and $Rx_2$ and $Rx_3$ forming the cycloalkyl group by bonding is preferred.

Each of the above groups may have a substituent. As the examples of the substituents, an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms) are exemplified, and the number of carbon atoms of the substituents is preferably 8 or less.

The specific examples of the repeating unit having a preferred acid-decomposable group are shown below, but the invention is not restricted thereto.

In the specific examples, each of Rx and $Xa_1$ represents a hydrogen atom, $CH_3$, $CF_3$ or $CH_2OH$. Each of Rxa and Rxb represents an alkyl group having 1 to 4 carbon atoms. Each of Z, when two or more Z's are present, independently represents a substituent containing a polar group. p represents 0 or a positive integer. $(Z)_p$ specifically has the same meaning with that of $(R_{10})_n$ in the later-shown formula (2-1).

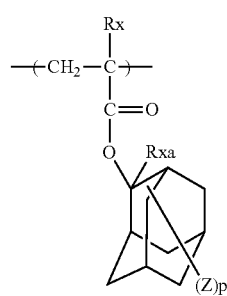

1

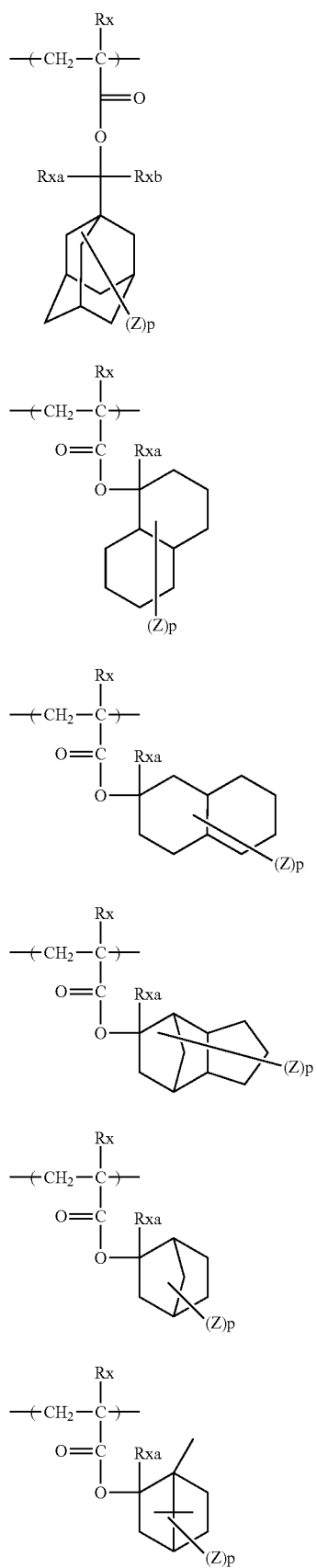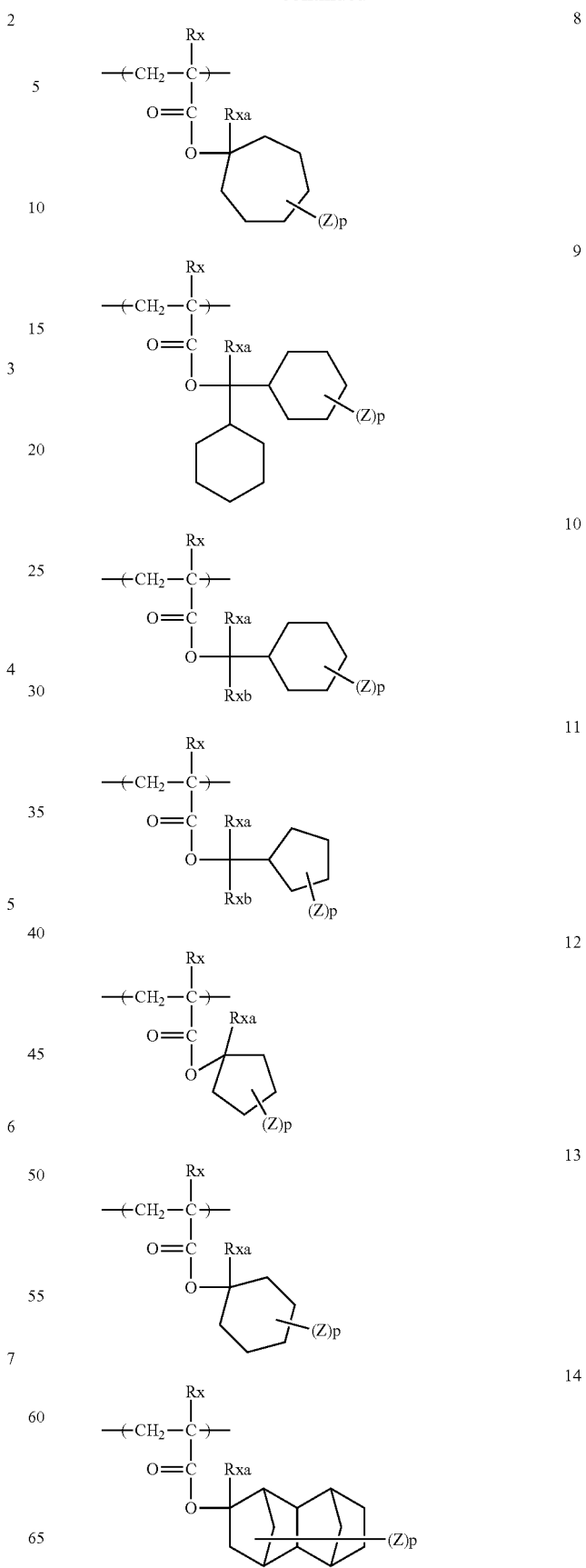

15
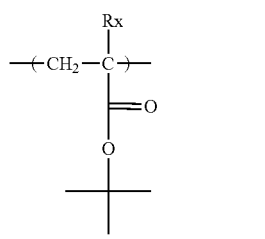
16
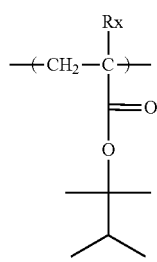
17
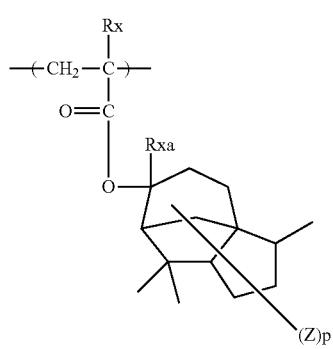
18
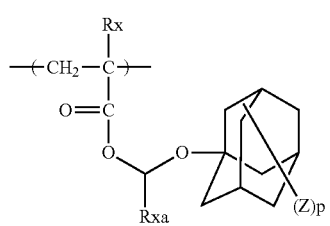
19
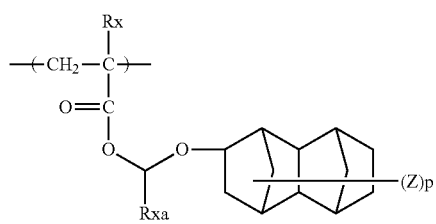
20
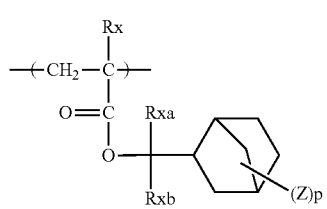
21
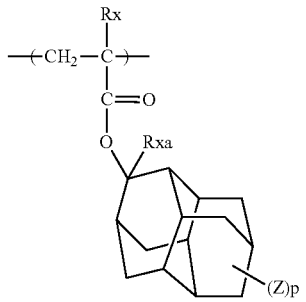
22
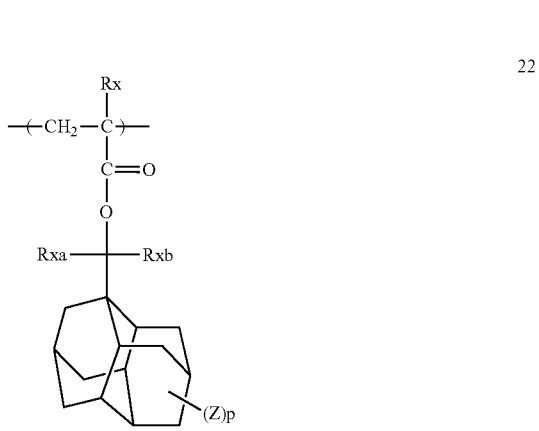
23
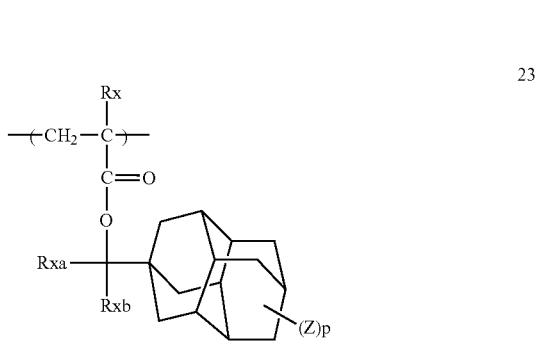
24
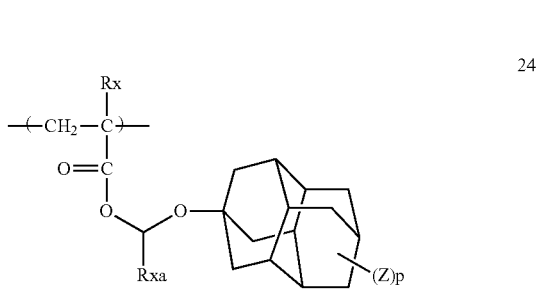
25
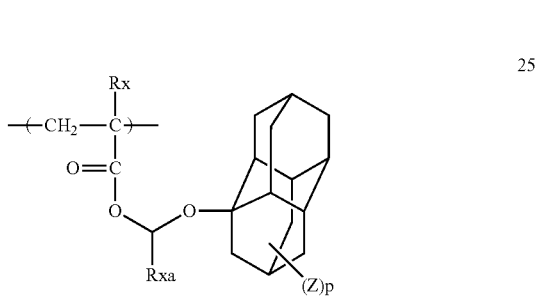

-continued
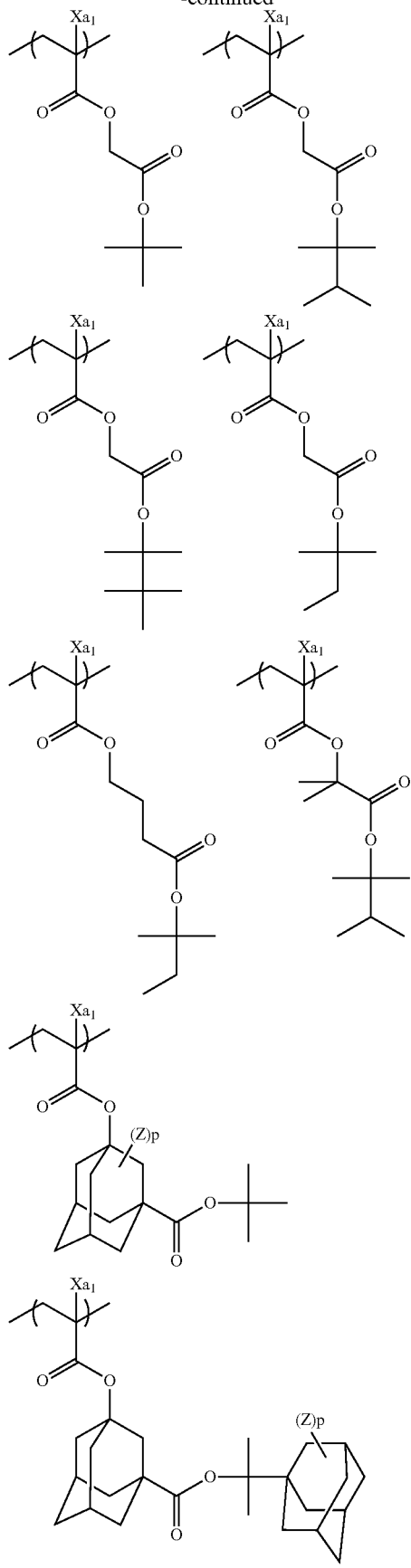
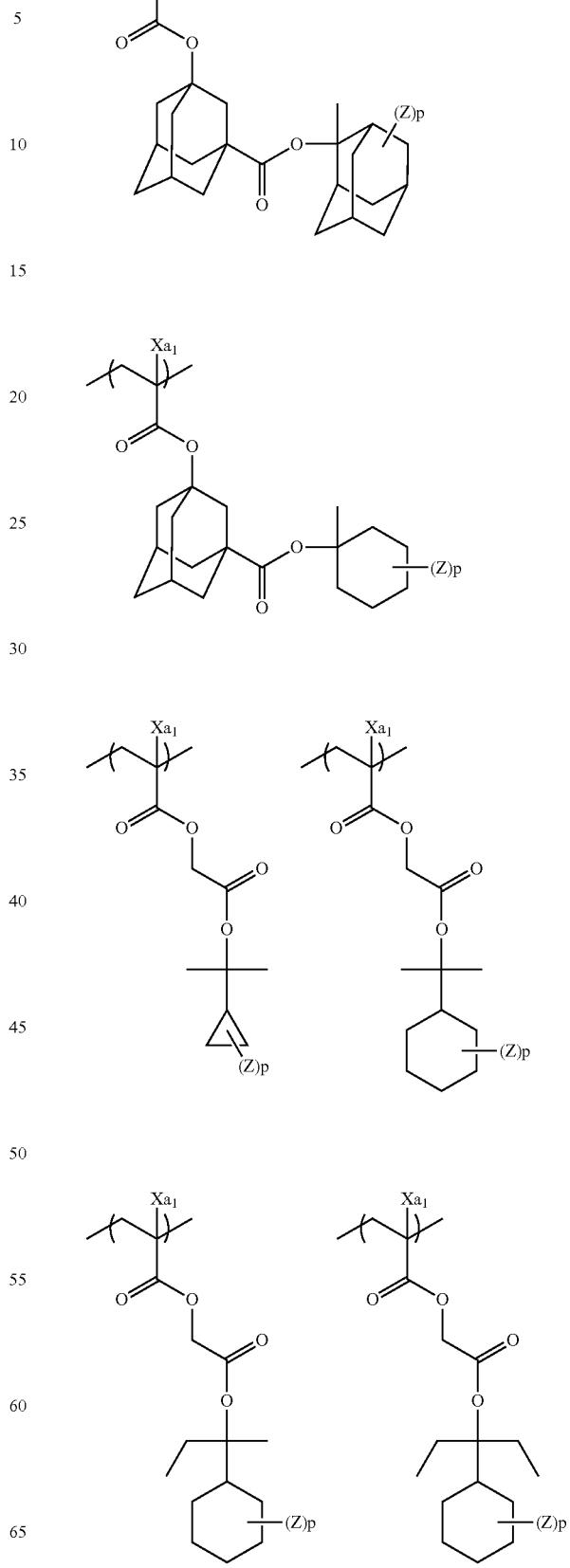

25
-continued
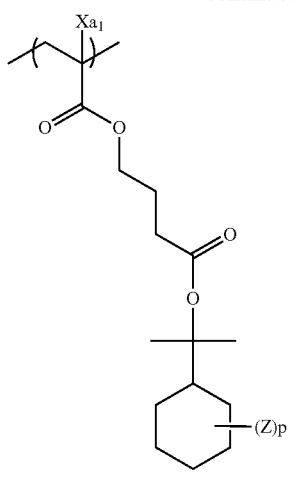
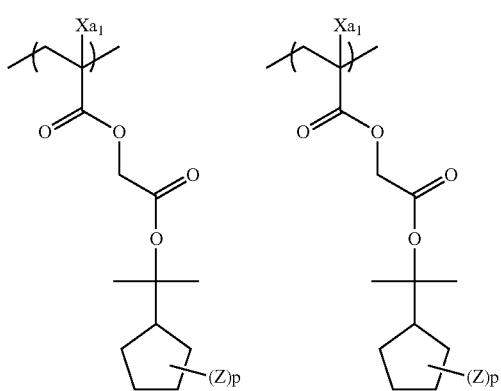
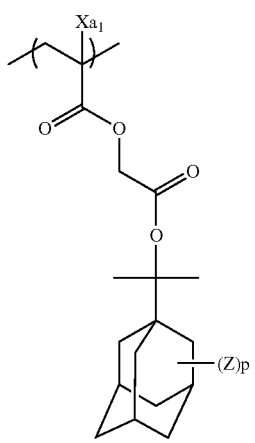
26
-continued
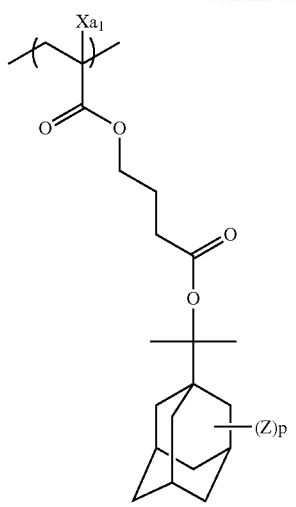
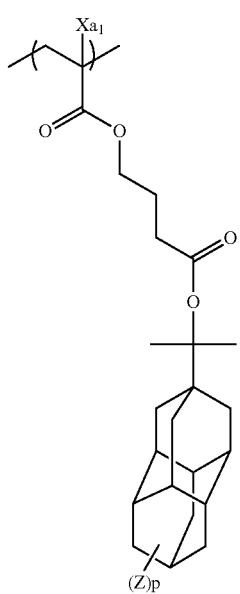
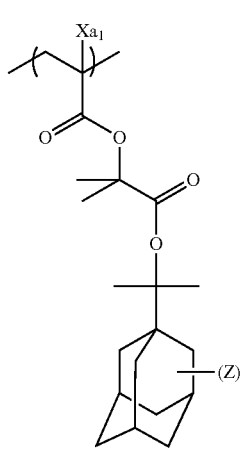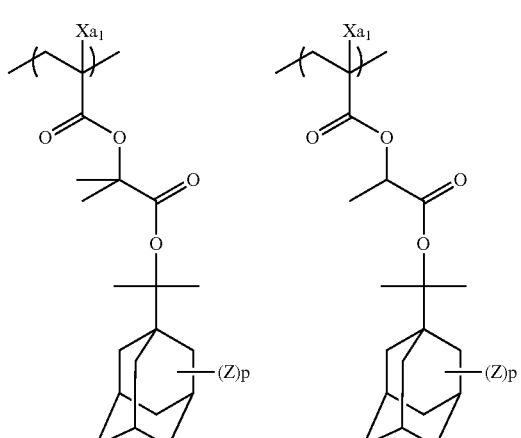

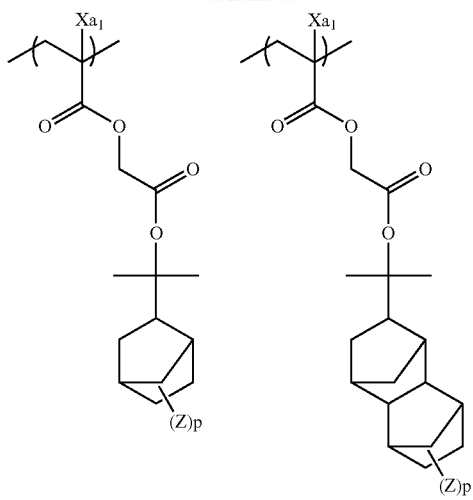
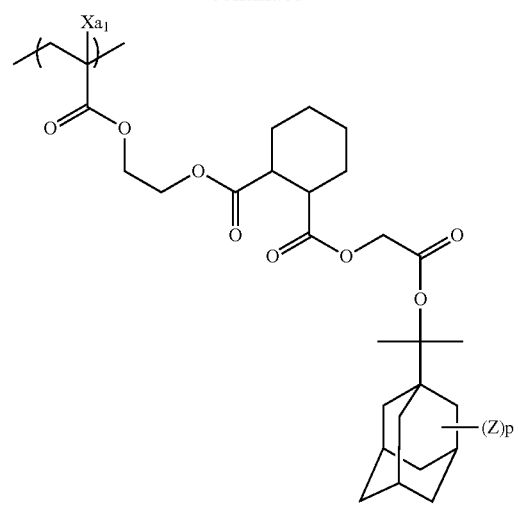
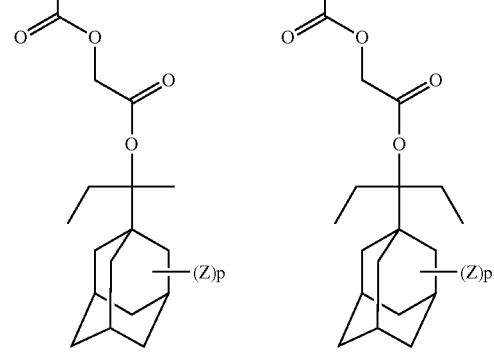
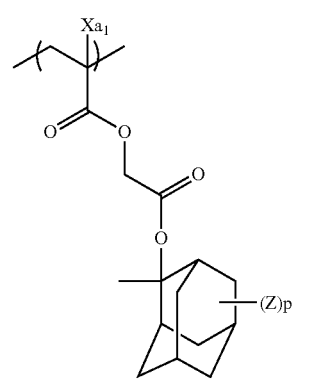
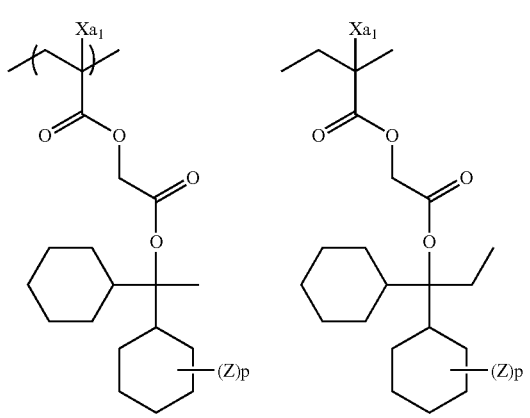
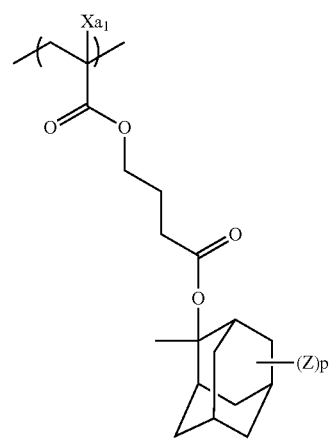

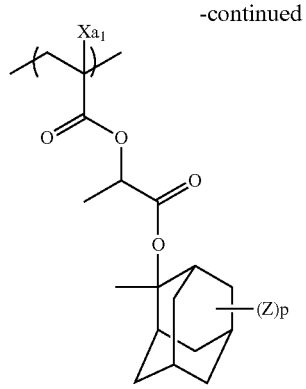
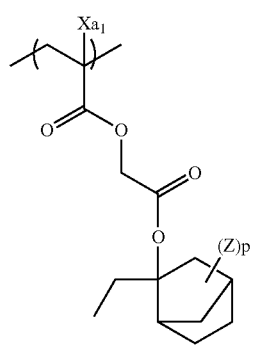
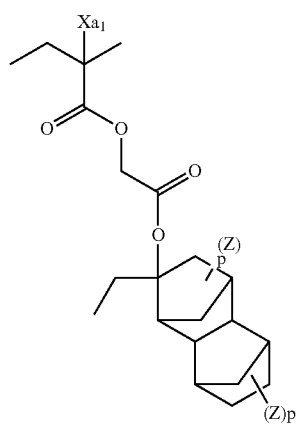
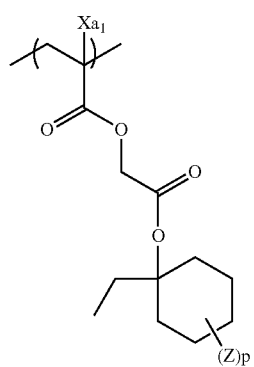
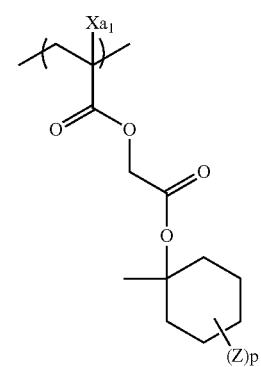
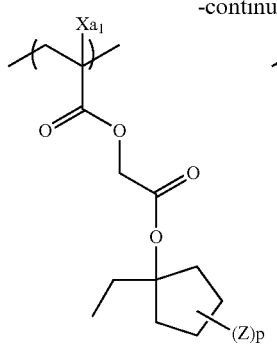
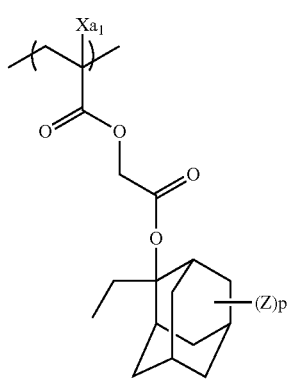
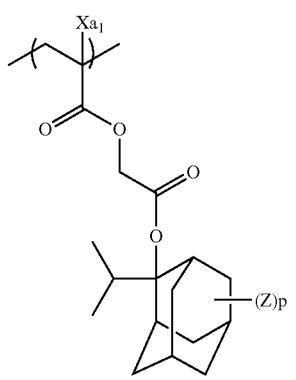
It is more preferred that resin A-1 is a resin having at least either a repeating unit represented by formula (AI-1) or a repeating unit represented by formula (AI-2) as the repeating unit represented by formula (AI).
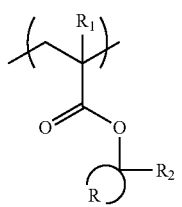
(AI-1)

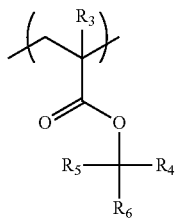
(AI-2)

In formulae (AI-1) and (AI-2), each of $R_1$ and $R_3$ independently represents a hydrogen atom, a methyl group which may have a substituent, or a group represented by —$CH_2$—$R_9$. $R_9$ represents a monovalent organic group. Examples of the monovalent organic group include an alkyl group having 5 or less carbon atoms, and an acyl group, and the monovalent organic group is preferably an alkyl group having 3 or less carbon atoms, more preferably a methyl group.

Each of $R_2$, $R_4$, $R_5$ and $R_6$ independently represents an alkyl group or a cycloalkyl group.

Each of R independently represents an atomic group necessary to form an alicyclic structure with a carbon atom.

$R_1$ preferably represents a hydrogen atom, a methyl group, a trifluoromethyl group, or a hydroxymethyl group.

The alkyl group represented by $R_2$ may be straight chain or branched chain, and may have a substituent.

The cycloalkyl group represented by $R_2$ may be monocyclic or polycyclic, and may have a substituent.

$R_2$ preferably represents an alkyl group, more preferably an alkyl group having 1 to 10 carbon atoms, and still more preferably having 1 to 5 carbon atoms, and, e.g., a methyl group and an ethyl group are exemplified.

Examples of the substituent which the alkyl group of $R_2$ may further have include an aryl group (e.g., phenyl, naphthyl), an aralkyl group, a hydroxyl group, an alkoxy group (e.g., methoxy, ethoxy, butoxy, octyloxy, dodecyloxy), an acyl group (e.g., acetyl, propanoyl, benzoyl) and an oxo group, and the number of carbon atoms of the substituent is preferably 15 or less.

Examples of the substituent which the cycloalkyl group of $R_2$ may further have include an alkyl group (e.g., methyl, ethyl, propyl, isopropyl, butyl, tert-butyl hexyl) and the groups described above as the substituent which the alkyl group of $R_2$ may further have, and the number of carbon atoms of the substituent is preferably 15 or less.

Each of R independently represents an atomic group necessary to form an alicyclic structure with a carbon atom. The alicyclic structure formed by R is preferably a monocyclic alicyclic structure, and carbon atom number is preferably 3 to 7 and more preferably 5 or 6.

$R_3$ preferably represents a hydrogen atom or a methyl group, and more preferably a methyl group.

The alkyl group represented by each of $R_4$, $R_5$ and $R_6$ may be straight chain or branched chain, and may have a substituent. The alkyl group is preferably an alkyl group having 1 to 4 carbon atoms, e.g., a methyl group, an ethyl group, an n-propyl group, an isopropyl group, an n-butyl group, an isobutyl group, or a t-butyl group.

The cycloalkyl group represented by each of $R_4$, $R_5$ and $R_6$ may be monocyclic or polycyclic, and may have a substituent. As the cycloalkyl group, a monocyclic cycloalkyl group, e.g., a cyclopentyl group and a cyclohexyl group, and a polycyclic cycloalkyl group, e.g., a norbornyl group, a tetracyclodecanyl group, a tetracyclododecanyl group, and an adamantyl group are preferably exemplified.

The repeating unit represented by formula (AI-2) is preferably a repeating unit represented by the following formula (2-1).

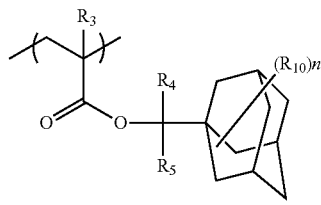
(2-1)

In formula (2-1), $R_3$, $R_4$ and $R_5$ are the same as those in formula (AI-2).

$R_{10}$ represents a substituent having a polar group. When a plurality of $R_{10}$'s are present, each $R_{10}$ may be the same with or different from every other $R_{10}$. As the substituents having a polar group, for example, a hydroxyl group, a cyano group, an amino group, an alkylamido group, a sulfonamide group, and straight chain or branched alkyl group and cycloalkyl group having any of the above groups are exemplified, preferably straight chain or branched alkyl group and cycloalkyl group having a hydroxyl group, a cyano group, an amino group, an alkylamido group, or a sulfonamide group, more preferably an alkyl group having a hydroxyl group, and still more preferably a branched alkyl group having a hydroxyl group. $R_{10}$ more preferably represents a partial structure represented by —$C(R_4)(R_5)$—OH. $R_4$ and $R_5$ are the same with those in formula (2-1). More preferably both $R_4$ and $R_5$ represent an alkyl group (preferably having 1 to 3 carbon atoms). n represents an integer of 0 to 15, preferably 0 to 2, and more preferably 0 or 1.

The preferred examples of the combinations in the case where resin A-1 contains the above acid-decomposable repeating unit are shown below.

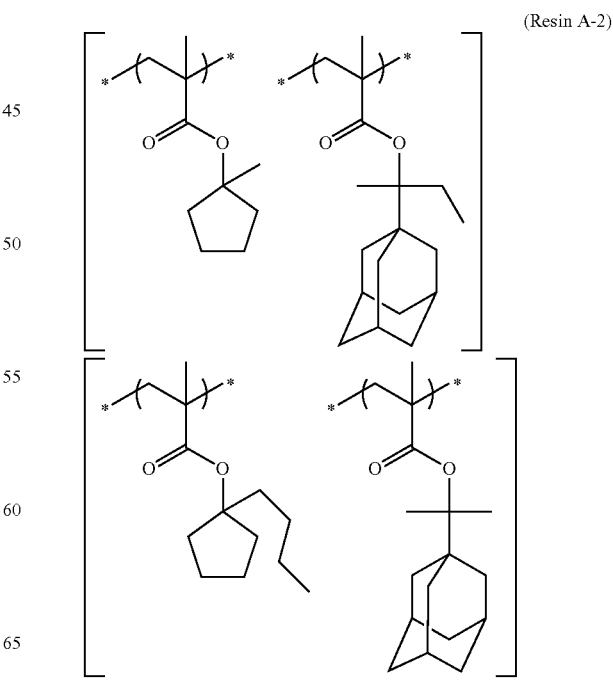
(Resin A-2)

33
-continued
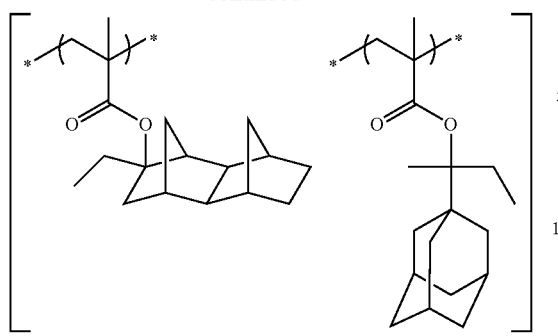
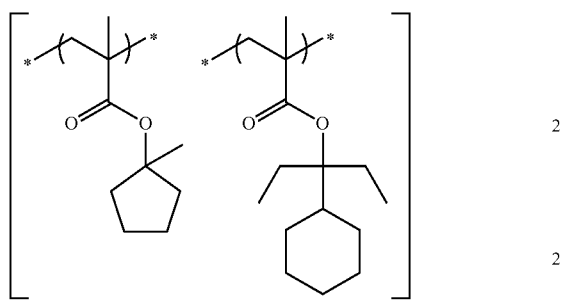
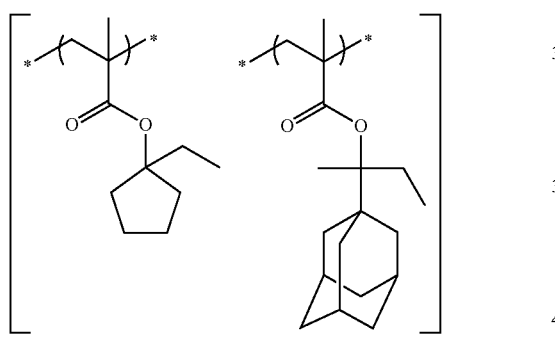
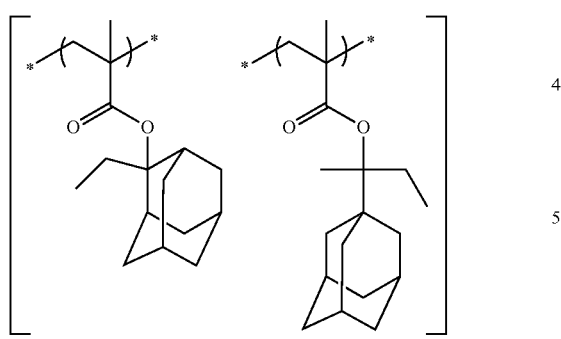
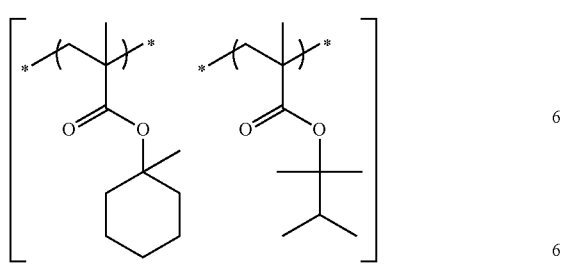
34
-continued
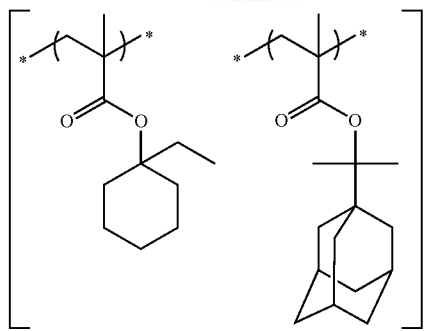
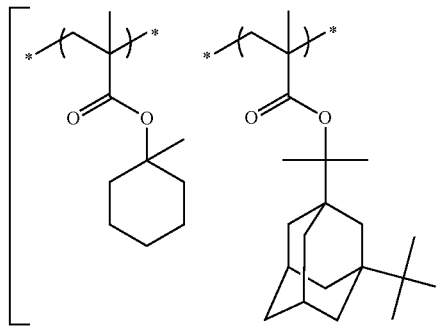
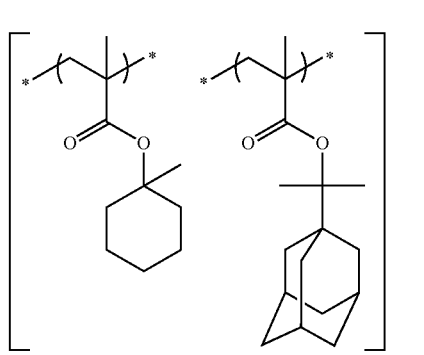
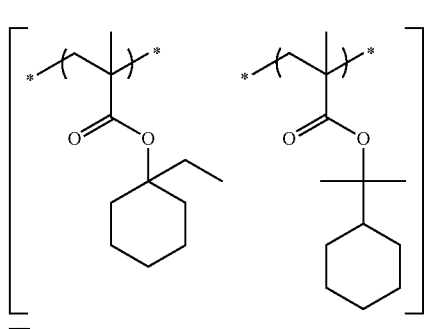
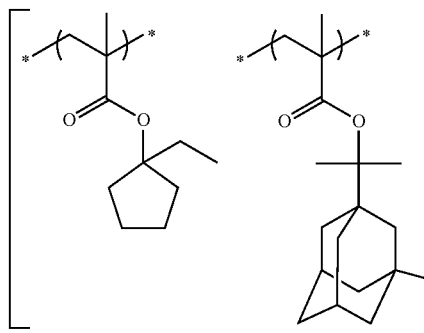

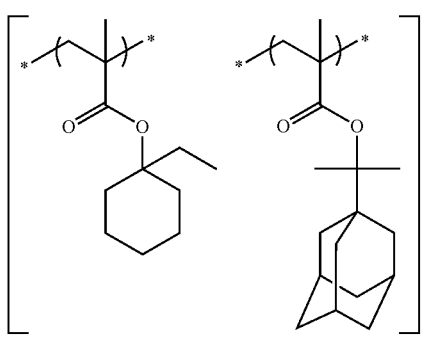
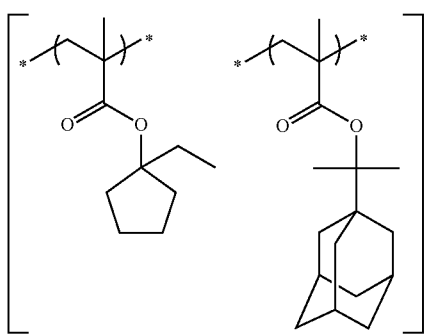
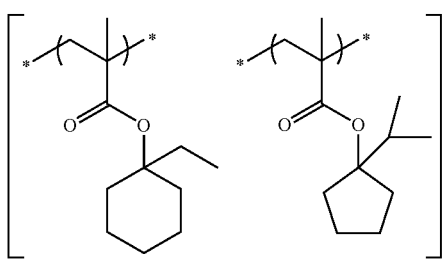
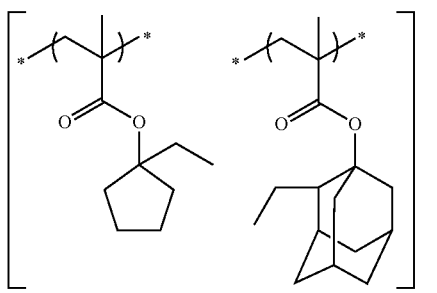
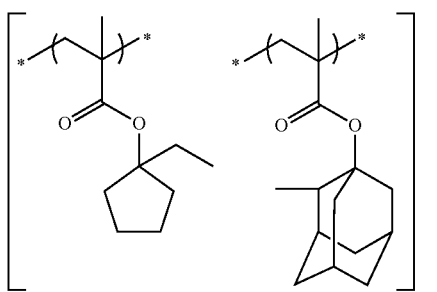
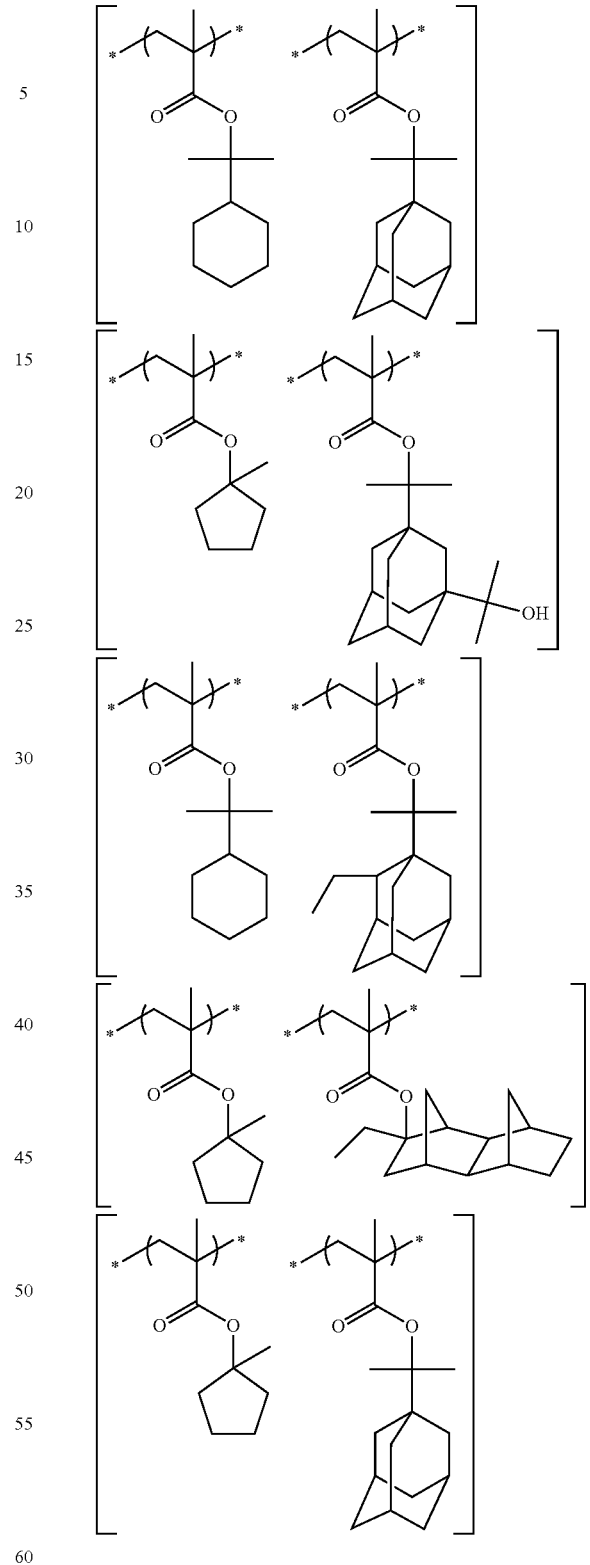
As another embodiment of more preferred resin in the invention, a resin having, together with the repeating unit represented by formula (1), (B) a repeating unit having a group of protecting a phenolic hydroxyl group with a group capable of decomposing and leaving by the action of an acid, as an acid-decomposable group, is exemplified. According to this constitution, a pattern having especially high sensitivity is obtained by exposure with electron beams and EUV rays, and so preferred.

As the repeating unit (B) having a group of protecting a phenolic hydroxyl group with a group capable of decomposing and leaving by the action of an acid, for example, a repeating structural unit represented by the following formula (I) is preferred.

In formula (I), each of $R_{01}$, $R_{02}$ and $R_{03}$ independently represents a hydrogen atom, an alkyl group, a cycloalkyl group, a halogen atom, a cyano group, or an alkoxycarbonyl group. Further, $R_{03}$ may represent an alkylene group to form a 5- or 6-membered ring by bonding to $Ar_1$.

$Ar_1$ represents a (n+1)-valent aromatic ring group.

Each of n Y's independently represents a hydrogen atom or a group capable of leaving by the action of an acid, but at least one of Y's represents a group capable of leaving by the action of an acid.

n represents an integer of 1 to 4, preferably 1 or 2, and more preferably 1.

As the alkyl group represented by each of $R_{01}$, $R_{02}$ and $R_{03}$ in formula (I), a substituted or unsubstituted alkyl group having 20 or less carbon atoms, e.g., a methyl group, an ethyl group, a propyl group, an isopropyl group, an n-butyl group, a sec-butyl group, a hexyl group, a 2-ethylhexyl group, an octyl group, or a dodecyl group is preferably exemplified, and more preferably an alkyl group having 8 or less carbon atoms.

As the alkyl group contained in the alkoxycarbonyl group, the same alkyl groups represented by $R_{01}$, $R_{02}$ and $R_{03}$ are preferred.

The cycloalkyl group may be a monocyclic or polycyclic cycloalkyl group. Preferably a substituted or unsubstituted monocyclic cycloalkyl group having 3 to 8 carbon atoms, e.g., a cyclopropyl group, a cyclopentyl group, and a cyclohexyl group are exemplified.

As the halogen atom, a fluorine atom, a chlorine atom, a bromine atom and an iodine atom are exemplified, and a fluorine atom is more preferred.

When $R_{03}$ represents an alkylene group, an alkylene group having 1 to 8 carbon atoms, e.g., a methylene group, an ethylene group, a propylene group, a butylenes group, a hexylene group, and an octylene group are preferably exemplified as the alkylene group.

The aromatic ring represented by $Ar_1$ is preferably a substituted or unsubstituted aromatic ring having 6 to 14 carbon atoms, specifically represents an n+1-valent naphthyl residue or an n+1-valent phenyl residue, and more preferably represents an n+1-valent phenyl residue. $Ar_1$ may further have one or more substituents, and the substituents that $Ar_1$ may have are not especially restricted, for example, when two or more substituents are present, each may have independently a halogen atom, an alkyl group, a cycloalkyl group, an aryl group, an alkenyl group, an aralkyl group, an alkoxy group, or an alkylcarbonyloxy group.

$Ar_1$ preferably represents a benzene ring, a toluene ring, or a naphthalene ring.

Each of n Y's independently represents a hydrogen atom or a group capable of leaving by the action of an acid, however, at least one of n Y's represents a group capable of leaving by the action of an acid.

As group Y capable of leaving by the action of an acid, e.g., —C($R_{36}$)($R_{37}$)($R_{38}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)—($R_{38}$), and —CH($R_{36}$)(Ar) are exemplified.

In the above formulae, each of $R_{36}$ to $R_{39}$ independently represents an alkyl group, a cycloalkyl group, an aryl group, an aralkyl group or an alkenyl group, and $R_{36}$ and $R_{37}$ may be bonded to each other to form a ring.

Each of $R_{01}$ and $R_{02}$ independently represents a hydrogen atom, an alkyl group, a cycloalkyl group, an aryl group, an aralkyl group or an alkenyl group.

Ar represents an aryl group, and specifically the same groups with $Ar_1$ in formula (I) may be exemplified.

The alkyl group represented by each of $R_{36}$ to $R_{39}$, $R_{01}$ and $R_{02}$ is preferably an alkyl group having 1 to 8 carbon atoms, e.g., a methyl group, an ethyl group, a propyl group, an n-butyl group, a sec-butyl group, a hexyl group, and an octyl group are exemplified.

The cycloalkyl group represented by each of $R_{36}$ to $R_{39}$, $R_{01}$ and $R_{02}$ may be monocyclic or polycyclic. As the monocyclic cycloalkyl group, a cycloalkyl group having 3 to 8 carbon atoms is preferred and, e.g., a cyclopropyl group, a cyclobutyl group, a cyclopentyl group, a cyclohexyl group, and a cyclooctyl group are exemplified. As the polycyclic cycloalkyl group, a cycloalkyl group having 6 to 20 carbon atoms is preferred and, e.g., an adamantyl group, a norbornyl group, an isoboronyl group, a camphanyl group, a dicyclopentyl group, an α-pinel group, a tricyclodecanyl group, a tetracyclododecyl group, and an androstanyl group can be exemplified. The carbon atoms in the cycloalkyl group may be partially replaced with a hetero atom such as an oxygen atom.

The aryl group represented by each of $R_{36}$ to $R_{39}$, $R_{01}$, $R_{02}$ and Ar is preferably an aryl group having 6 to 10 carbon atoms and, for example, a phenyl group, a naphthyl group, and an anthryl group are exemplified.

The aralkyl group represented by each of $R_{36}$ to $R_{39}$, $R_{01}$ and $R_{02}$ is preferably an aralkyl group having 7 to 12 carbon atoms and, for example, a benzyl group, a phenethyl group, and a naphthylmethyl group are exemplified.

The alkenyl group represented by each of $R_{36}$ to $R_{39}$, $R_{01}$ and $R_{02}$ is preferably an alkenyl group having 2 to 8 carbon atoms and, for example, a vinyl group, an allyl group, a butenyl group and a cyclohexenyl group are exemplified.

The ring formed by $R_{36}$ and $R_{37}$ by bonding to each other may be monocyclic or polycyclic. As the monocyclic ring, a cycloalkane structure having 3 to 8 carbon atoms is preferred and, e.g., a cyclopropane structure, a cyclobutane structure, a cyclopentane structure, a cyclohexane structure, a cycloheptane structure, and a cyclooctane structure are exemplified. As the polycyclic structure, a cycloalkane structure having 6 to 20 carbon atoms is preferred and, e.g., an adamantane structure, a norbornane structure, a dicyclopentane structure, a tricyclodecane structure, and a tetracyclododecane structure are exemplified. The carbon atoms in the cycloalkane structure may be partially replaced with a hetero atom such as an oxygen atom.

The above groups represented by each of $R_{36}$ to $R_{39}$, $R_{01}$, $R_{02}$, $R_{03}$, Ar and $Ar_1$ may have a substituent. As the examples of the substituents, e.g., an alkyl group, a cycloalkyl group, an aryl group, an amino group, an amido group, a ureido group, a hydroxyl group, a carboxyl group, a halogen atom, an alkoxy group, a thioether group, an acyl group, an acyloxy group, an alkoxycarbonyl group, a cyano group, and a nitro group are exemplified, and the number of carbon atoms of the substituents is preferably 8 or less.

As group Y capable of leaving by the action of an acid, a structure represented by the following formula (II) is more preferred.

—C(L$_1$)(L$_2$)-O-M-Q　　　(II)

In formula (II), each of L$_1$ and L$_2$ independently represents a hydrogen atom, an alkyl group, a cycloalkyl group, an aryl group or an aralkyl group.

However, at least either L$_1$ or L$_2$ represents an alkyl group, a cycloalkyl group, an aryl group or an aralkyl group.

M represents a single bond or a divalent linking group.

Q represents an alkyl group, a cycloalkyl group, an alicyclic group which may contain a hetero atom, an aromatic ring group which may contain a hetero atom, an amino ring group, an ammonium group, a mercapto group, a cyano group, or an aldehyde group.

At least two of Q, M and L$_1$ may be bonded to form a 5- or 6-membered ring.

The alkyl group represented by each of L$_1$ and L$_2$ is, for example, an alkyl group having 1 to 8 carbon atoms, and specifically a methyl group, an ethyl group, a propyl group, an n-butyl group, a sec-butyl group, a hexyl group, and an octyl group can be preferably exemplified.

The cycloalkyl group represented by each of L$_1$ and L$_2$ is, for example, a cycloalkyl group having 3 to 15 carbon atoms, and specifically a cyclopentyl group, a cyclohexyl group, a norbornyl group, and an adamantyl group can be preferably exemplified.

The aryl group represented by each of L$_1$ and L$_2$ is, for example, an aryl group having 6 to 15 carbon atoms, and specifically a phenyl group, a tolyl group, a naphthyl group, and an anthryl group can be preferably exemplified.

The aralkyl group represented by each of L$_1$ and L$_2$ is, for example, an aralkyl group having 6 to 20 carbon atoms, and a benzyl group and a phenethyl group can be exemplified.

As the divalent linking group represented by M, for example, an alkylene group (e.g., a methylene group, an ethylene group, a propylene group, a butylene group, a hexylene group, an octylene group, etc.), a cycloalkylene group (e.g., a cyclopentylene group, a cyclohexylene group, etc.), an alkenylene group (e.g., an ethenylene group, a propenylene group, a butenylene group, etc.), an arylene group (e.g., a phenylene group, a tolylene group, a naphthylene group, etc.), —S—, —O—, —CO—, —SO$_2$—, —NR$_0$—, and divalent linking groups obtained by combining a plurality of groups of these are exemplified. R$_0$ represents a hydrogen atom or an alkyl group (e.g., an alkyl group having 1 to 8 carbon atoms, specifically a methyl group, an ethyl group, a propyl group, an n-butyl group, a sec-butyl group, a hexyl group, an octyl group, etc.).

The alkyl group and the cycloalkyl group represented by Q are the same as those represented by L$_1$ and L$_2$.

As the alicyclic group and the aromatic ring group of the alicyclic group which may contain a hetero atom and the aromatic ring group which may contain a hetero atom represented by Q, the cycloalkyl group and the aryl group represented by L$_1$ and L$_2$ are exemplified, and preferably the carbon atom number is 3 to 15.

As the alicyclic group which may contain a hetero atom and the aromatic ring group which may contain a hetero atom, groups having a heterocyclic structure, e.g., thiirane, cyclothioran, thiophene, furan, pyrrole, benzothiophene, benzofuran, benzopyrrole, triazine, imidazole, benzimidazole, triazole, thiadiazole, thiazole, and pyrrolidone are exemplified, but they are not restricted thereto so long as they have a structure generally called a heterocyclic structure (a ring formed by a carbon atom and a hetero atom, or a ring formed by a hetero atom).

As the 5- or 6-membered ring formed by bonding of at least two of Q, M and L$_1$, a case where at least two of Q, M and L$_1$ are bonded to form, e.g., a propylene group or a butylenes group, which contain an oxygen atom, is exemplified.

Each group represented by Q, M and L$_1$ in formula (II) may also have a substituent and, for example, the substituents exemplified above as the examples of the substituents that each of R$_{36}$ to R$_{39}$, R$_{01}$, R$_{02}$, R$_{03}$, Ar and Ar$_1$ may have are exemplified. The carbon atom number of the substituents is preferably 8 or less.

As the group represented by -M-Q, a group comprised of 1 to 30 carbon atoms is preferred, and a group comprised of 5 to 20 carbon atoms is more preferred.

As the preferred specific examples of the repeating unit (B), the specific examples of the repeating unit represented by formula (I) are shown below, but the invention is not restricted thereto.

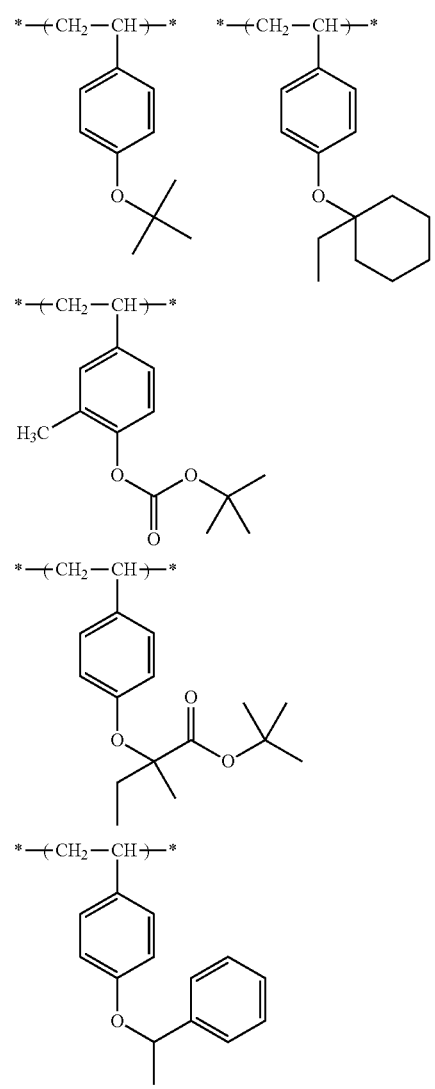

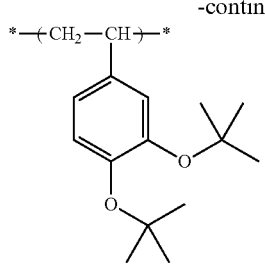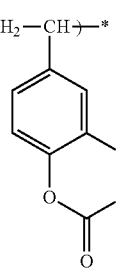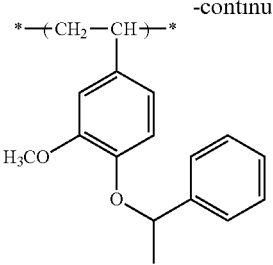
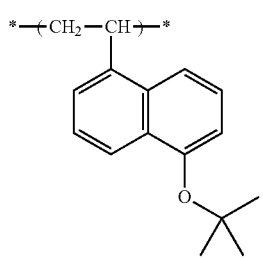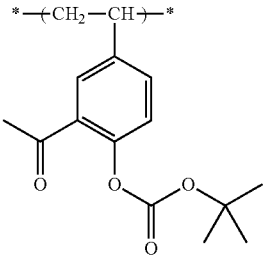
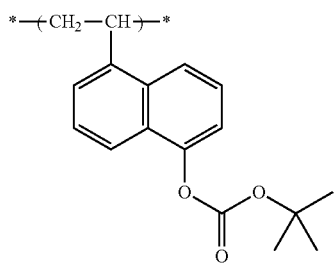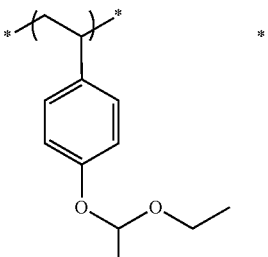
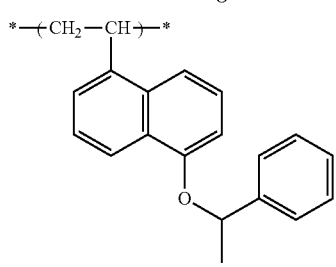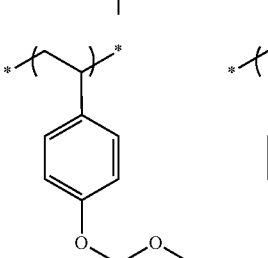
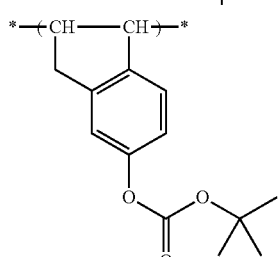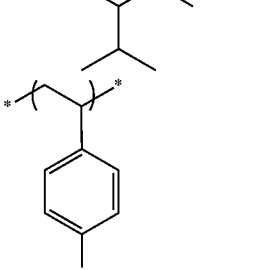
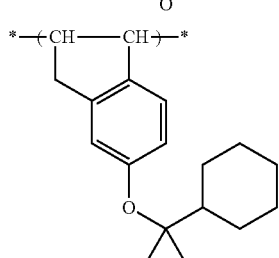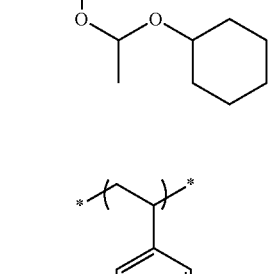
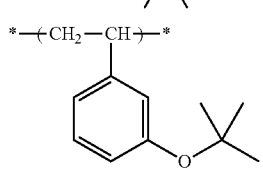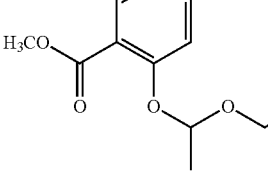

43
-continued
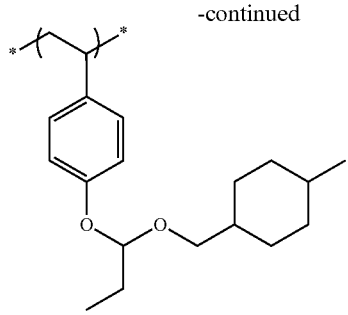
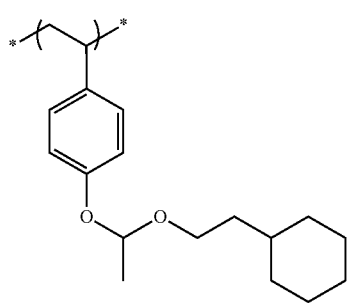
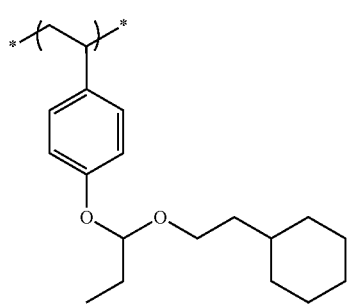
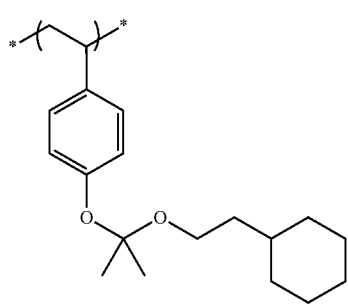
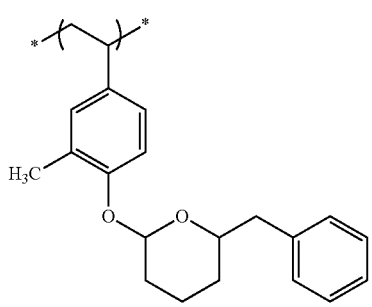
44
-continued
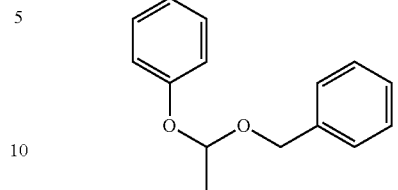
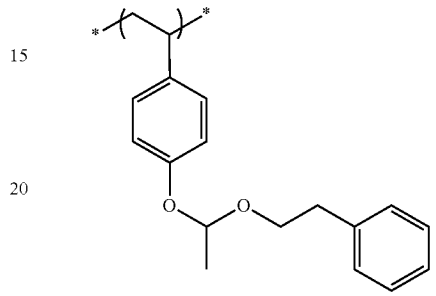
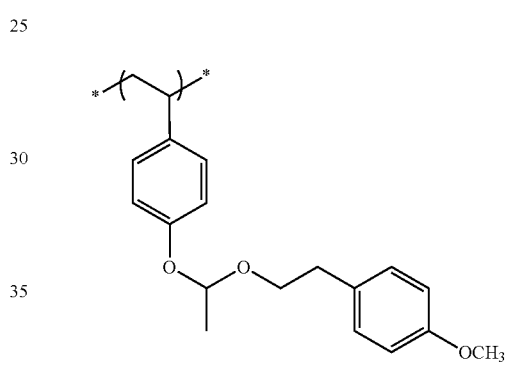
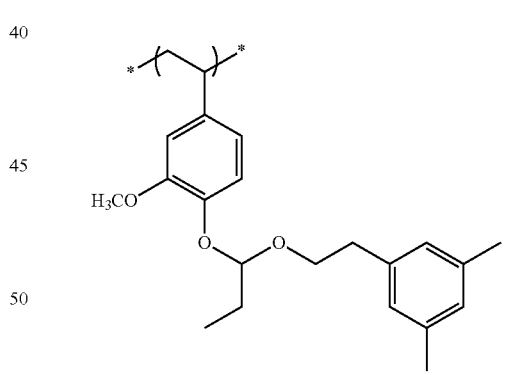
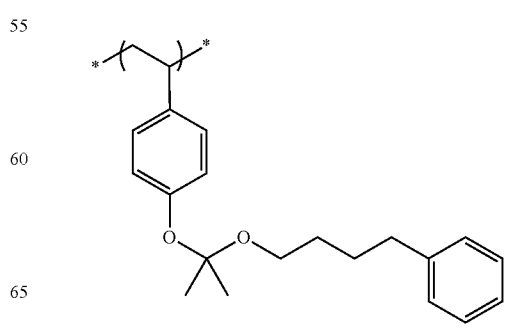

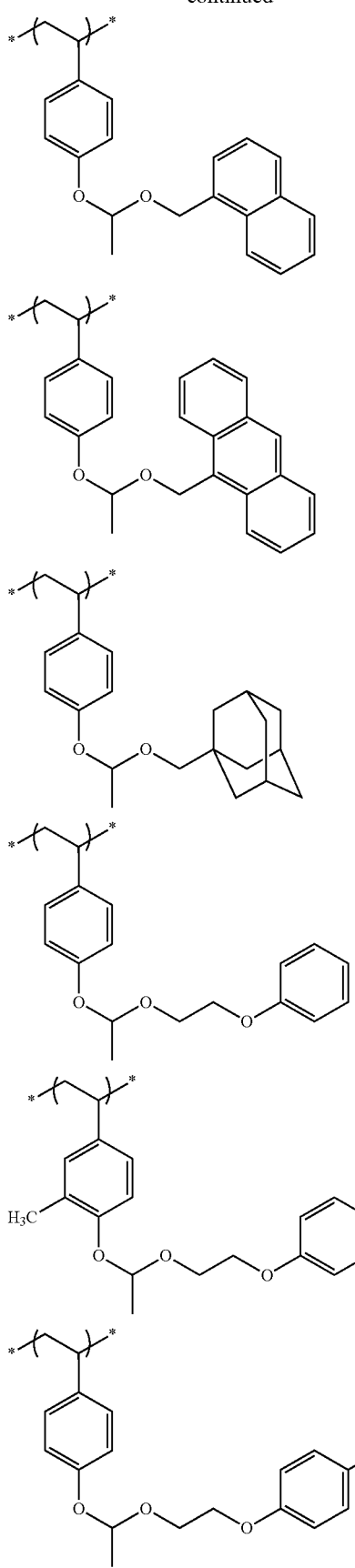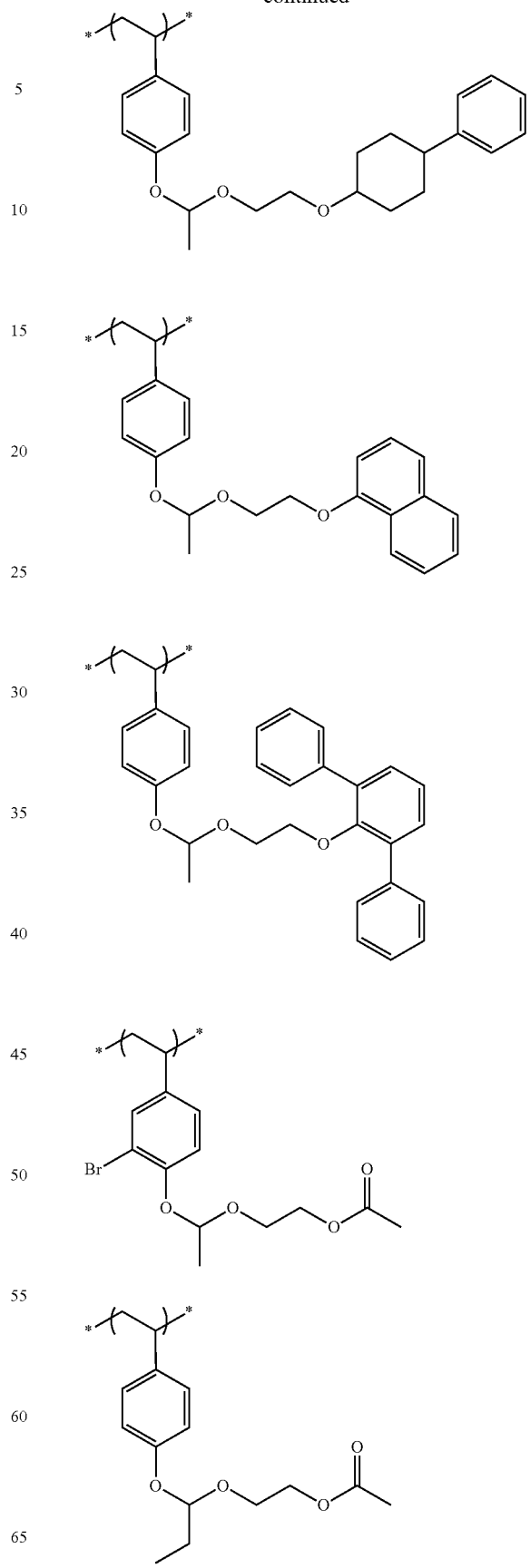

47 48
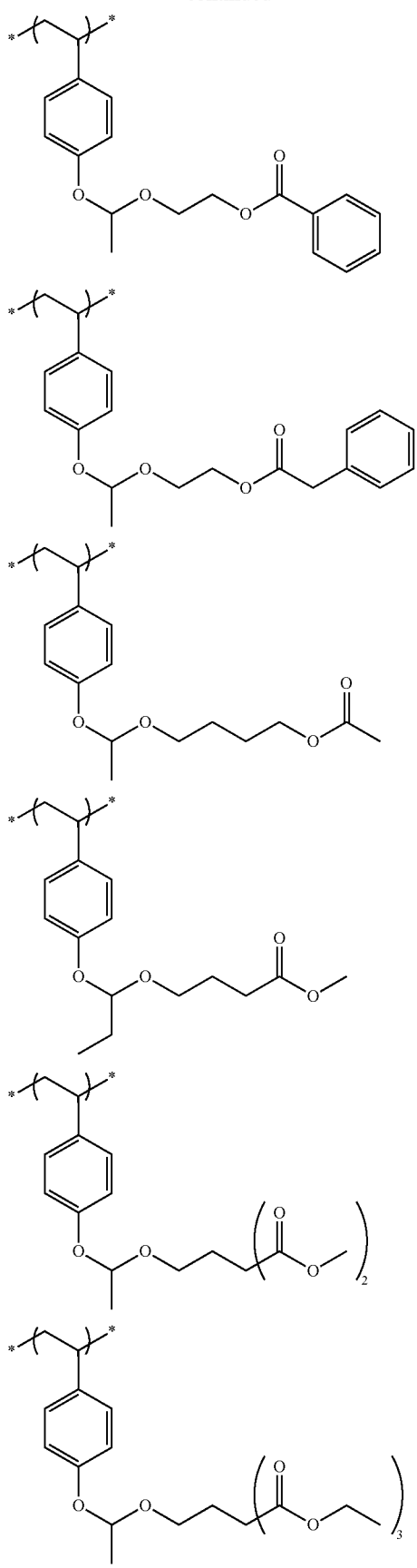
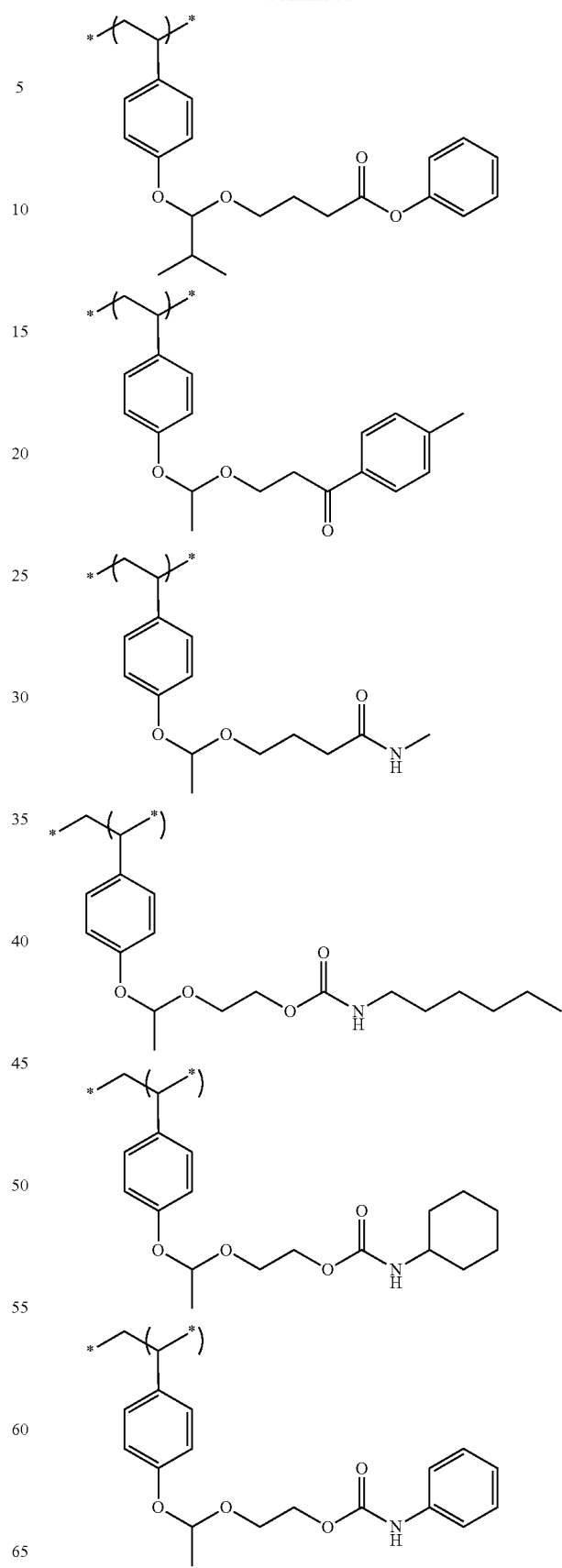

49
-continued
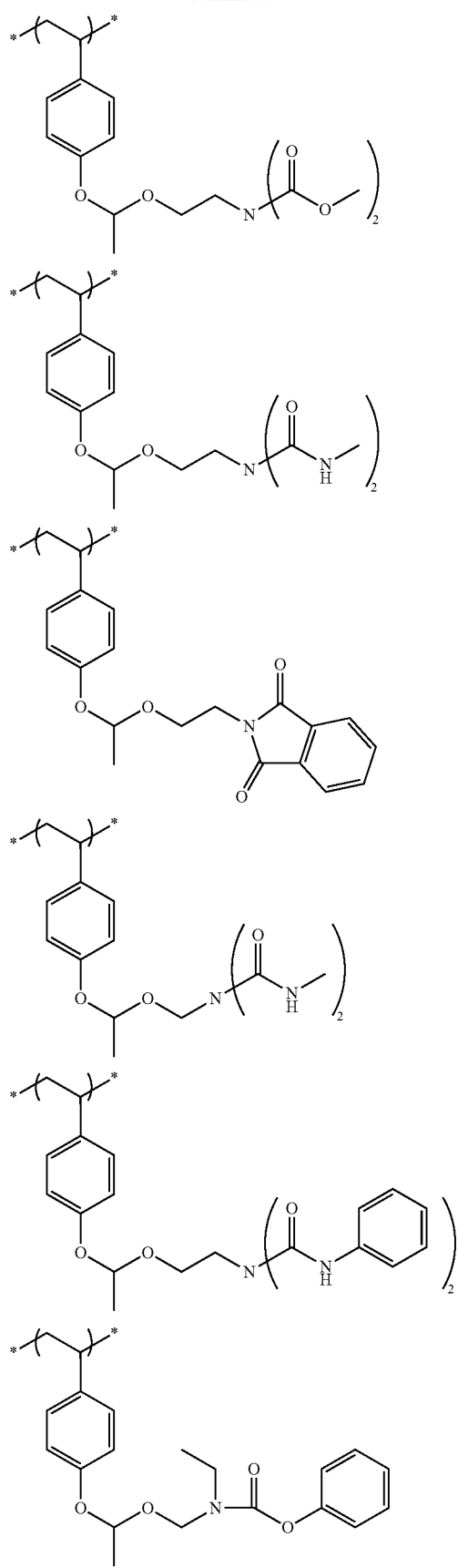
50
-continued
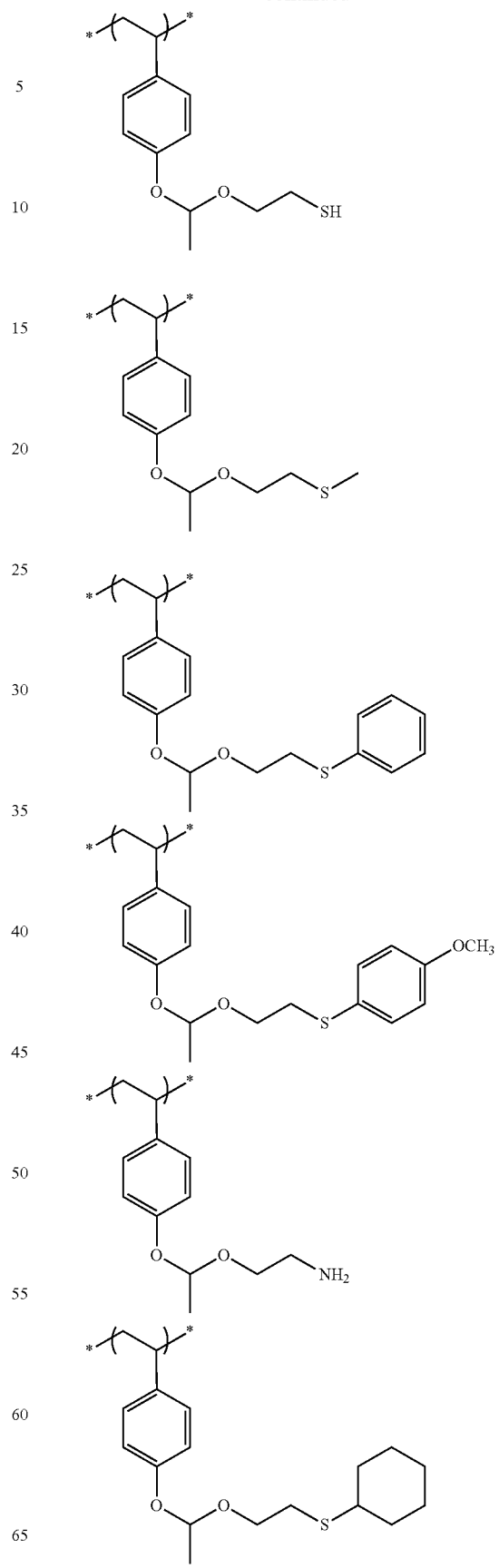

51
-continued
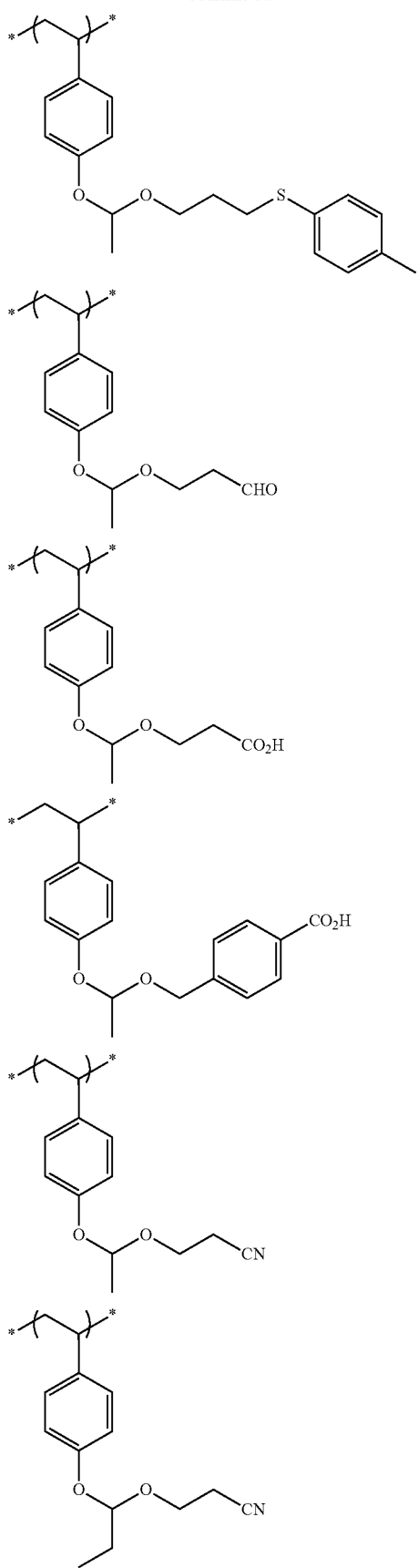
52
-continued
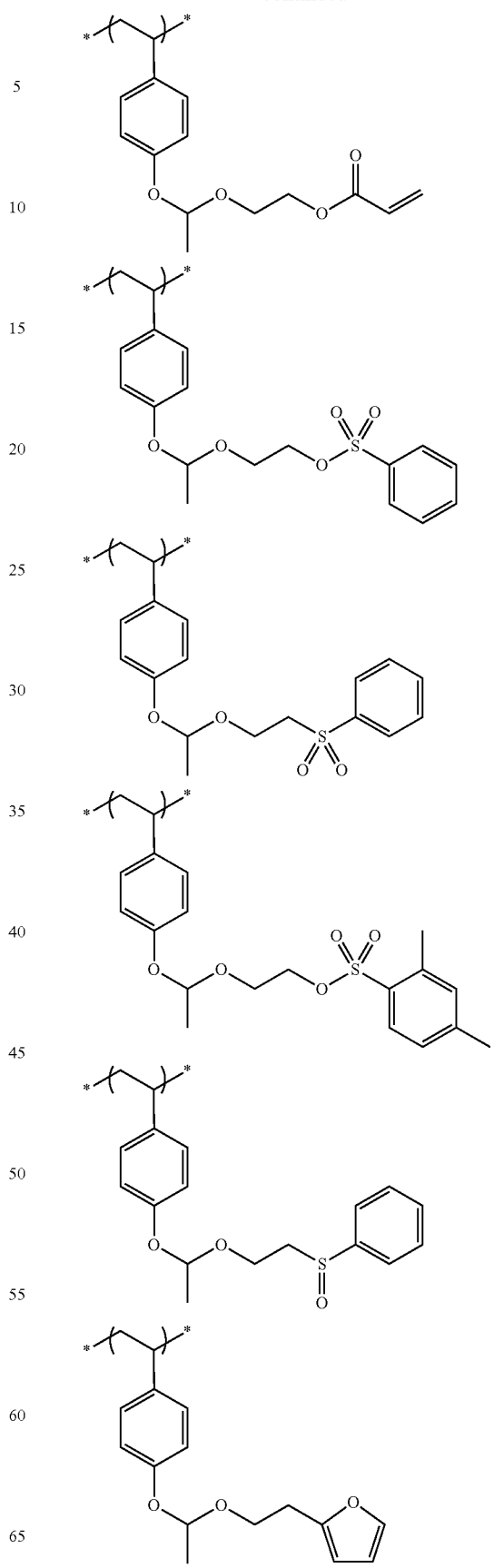

53 -continued
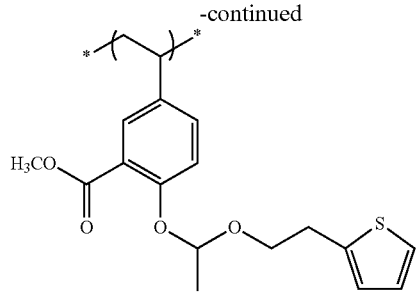
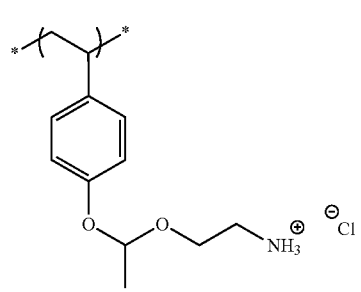
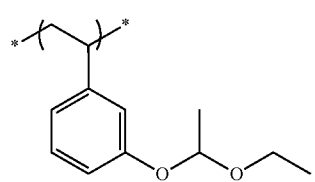
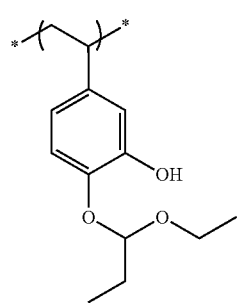
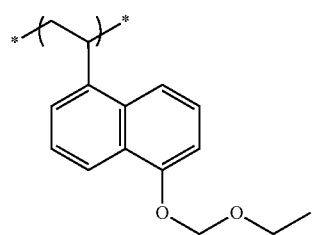
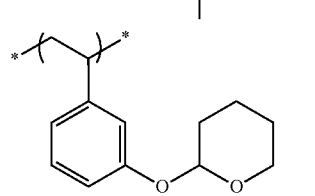
54 -continued
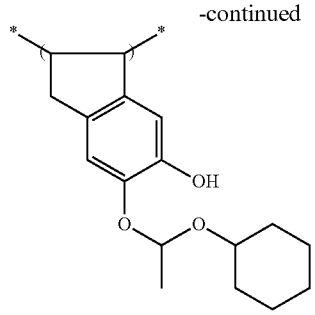
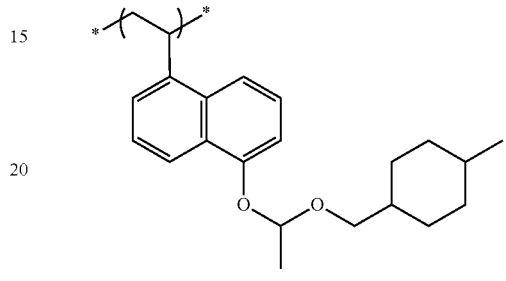
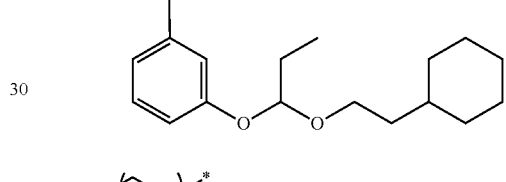
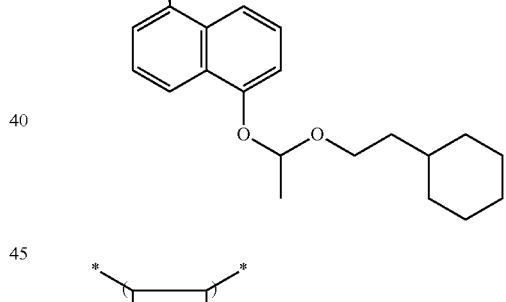
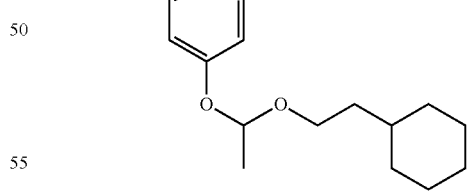
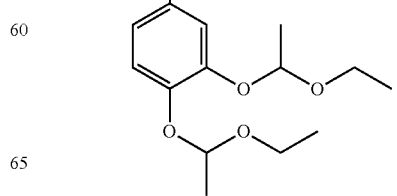

55
-continued
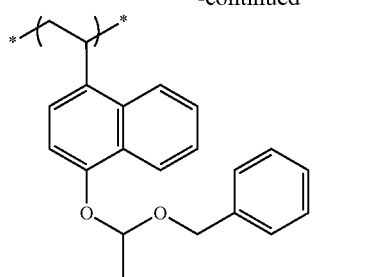
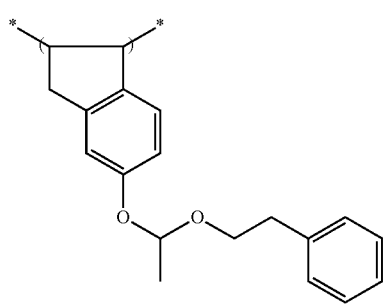
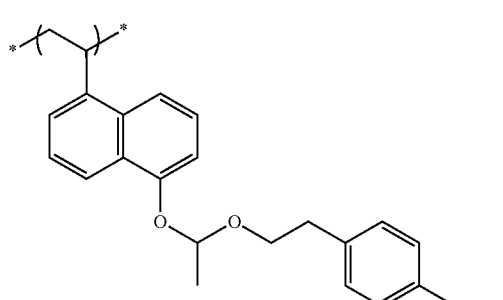
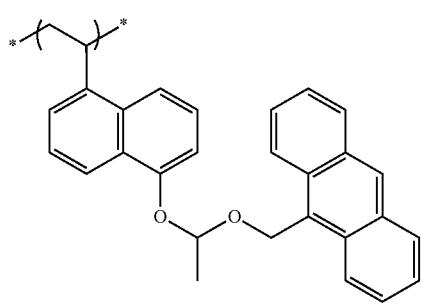
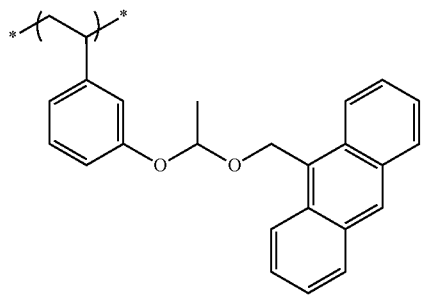
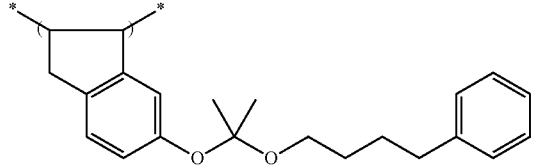
56
-continued
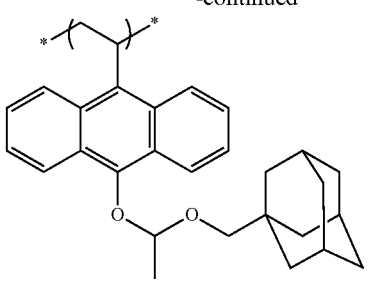
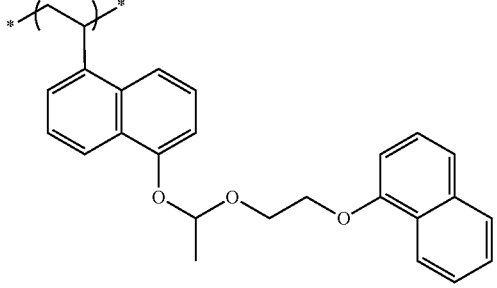
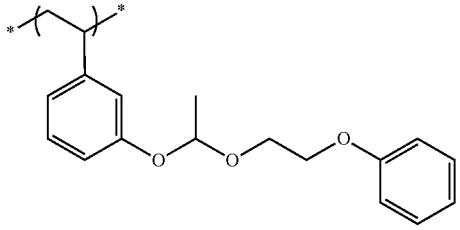
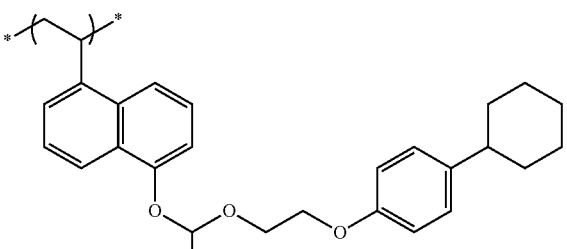
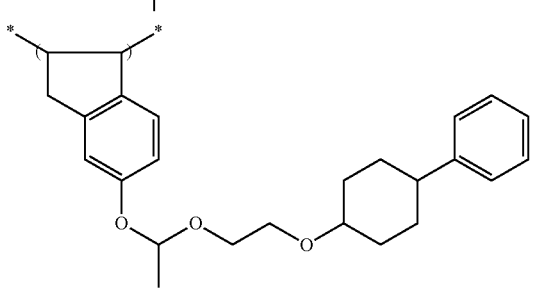
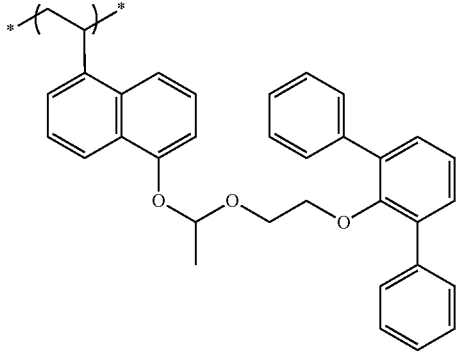

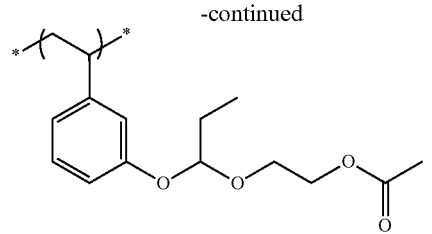
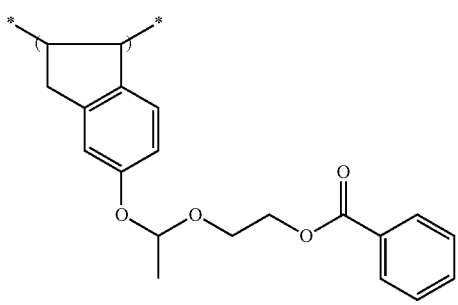
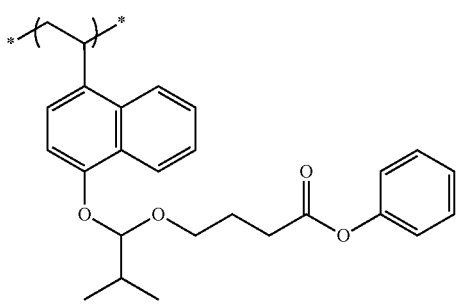
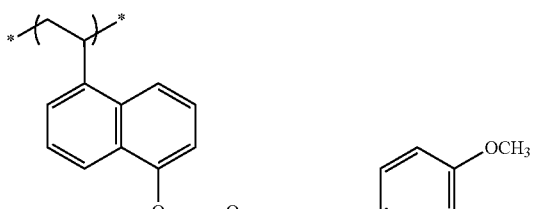
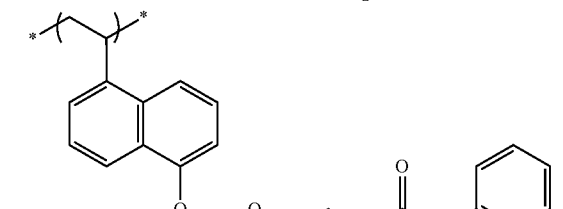
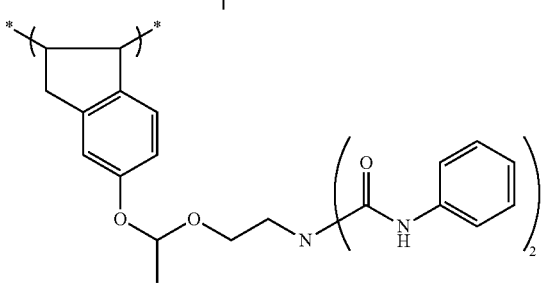
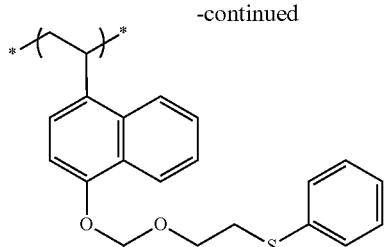
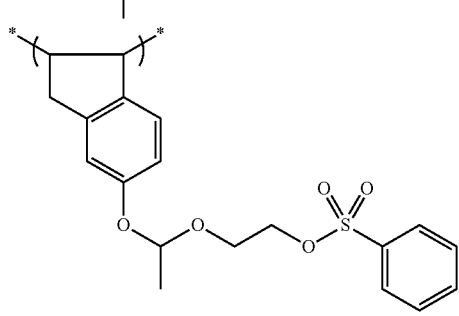
(Other components)
The resin (A) of the invention may also have at least one of the repeating units represented by any of the following formulae (Y2), (Y3) and (Y4).
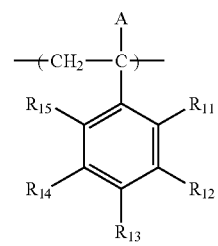
(Y2)
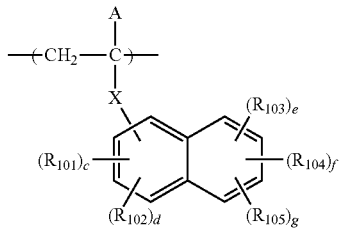
(Y3)
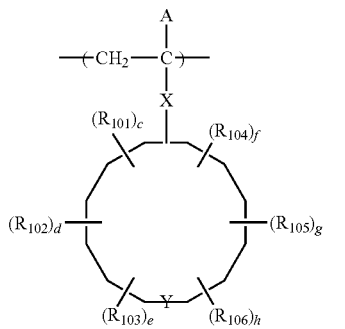
(Y4)
In formulae (Y2) to (Y4), A has the same meaning as A in formula (1).

X represents a single bond, a —COO— group, an —O— group, or a —CON($R_{16}$)— group. $R_{16}$ represents a hydrogen atom or an alkyl group having 1 to 3 carbon atoms (e.g., a methyl group, an ethyl group, a propyl group, etc.). X preferably represents a single bond, a —COO— group, or a —CON($R_{16}$)— group, and especially preferably a single bond or a —COO— group.

The cyclic structure represented by Y is a polycyclic aromatic hydrocarbon ring structure of tricyclic or more, preferably an anthracene structure, a phenanthrene structure, a tetracene structure, a benzo[c]phenanthrene structure, a chrysene structure, a benzo[a]anthracene structure, a pyrene structure, or a perylene structure.

Each of $R_{11}$ to $R_{15}$ independently represents a hydrogen atom, a halogen atom, an alkyl group, a cycloalkyl group, an aryl group, an alkenyl group, an aralkyl group, an alkoxy group, or an alkylcarbonyloxy group. As the specific examples of these groups, the same groups as R in formula (1) are exemplified.

Each of $R_{101}$ to $R_{106}$ independently represents a hydroxyl group, a halogen atom (e.g., Cl, Br, F, I), an alkyl group, a cycloalkyl group, an alkoxy group, an alkylcarbonyloxy group, an alkylsulfonyloxy group, an alkenyl group, an aryl group, an aralkyl group, or a carboxyl group. As the specific examples of these groups, the same groups as R in formula (1) are exemplified.

Each of c to h independently represents an integer of 0 to 3.

The resin (A) may have a lactone group.

As lactone groups, any group having a lactone structure can be used, but preferably groups having 5- to 7-membered ring lactone structures, and 5- to 7-membered ring lactone structures condensed with other ring structures in the form of forming a bicyclo structure or a spiro structure are preferred. It is more preferred to have a repeating unit having lactone structure represented by any of the following formulae (LC1-1) to (LC1-17). A lactone structure may be directly bonded to the main chain. Preferred lactone structures are (LC1-1), (LC1-4), (LC1-5), (LC1-6), (LC1-13), (LC1-14) and (LC1-17). By the use of a specific lactone structure, resolution is bettered.

LC1-1
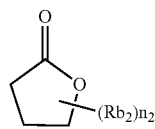

LC1-2
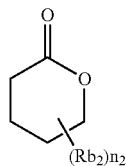

LC1-3
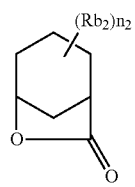

LC1-4
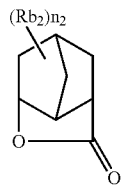

LC1-5
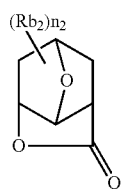

LC1-6
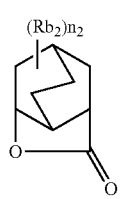

LC1-7
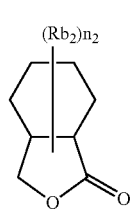

LC1-8
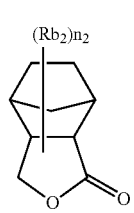

LC1-9
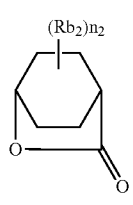

LC1-10
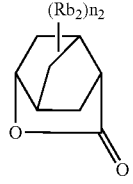

LC1-11
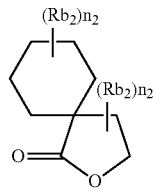

-continued

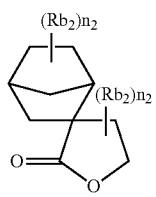
LC1-12

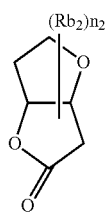
LC1-13

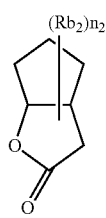
LC1-14

LC1-15

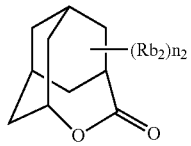
LC1-16

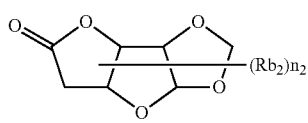
LC1-17

The lactone structural part may have or may not have a substituent ($Rb_2$). As preferred substituents ($Rb_2$), an alkyl group having from 1 to 8 carbon atoms, a cycloalkyl group having from 4 to 7 carbon atoms, an alkoxyl group having from 1 to 8 carbon atoms, an alkoxycarbonyl group having from 2 to 8 carbon atoms, a carboxyl group, a halogen atom, a hydroxyl group, a cyano group, and an acid-decomposable group are exemplified, and more preferred substituents are an alkyl group having from 1 to 4 carbon atoms, a cyano group, and an acid-decomposable group. $n_2$ represents an integer of 0 to 4. When $n_2$ is 2 or more, each substituent may be the same with or different from every other substituent. A plurality of substituents ($Rb_2$) may be bonded to each other to form a ring.

As repeating unit having a lactone structure, a repeating unit represented by the following formula (AII) is preferred.

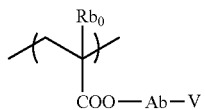
(AII)

In formula (AII), $Rb_0$ represents a hydrogen atom, a halogen atom, or an alkyl group having from 1 to 4 carbon atoms. As the examples of preferred substituents that the alkyl group represented by $Rb_0$ may have, a hydroxyl group and a halogen atom are exemplified. As the halogen atom represented by $Rb_0$, a fluorine atom, a chlorine atom, a bromine atom, and an iodine atom are exemplified. $Rb_0$ preferably represents a hydrogen atom, a methyl group, a hydroxymethyl group, or a trifluoromethyl group, and especially preferably a hydrogen atom or a methyl group.

Ab represents a single bond, an alkylene group, a divalent linking group having a monocyclic or polycyclic alicyclic hydrocarbon structure, an ether bond, an ester bond, a carbonyl group, or a divalent group of combining these groups, and preferably a single bond or a linking group represented by $-Ab_1-CO_2-$.

$Ab_1$ represents a straight chain or branched alkylene group, or a monocyclic or polycyclic cycloalkylene group, and preferably a methylene group, an ethylene group, a cyclohexylene group, an adamantylene group, or a norbornylene group.

V represents a group having a lactone structure. Specifically, V represents a group having a structure represented by any of formulae (LC1-1) to (LC1-17).

Of the repeating units represented by formula (AII), as repeating units having an especially preferred lactone group when Ab represents a single bond, the following repeating units are exemplified. In the specific examples, Rx represents H, $CH_3$, $CH_2OH$, or $CF_3$.

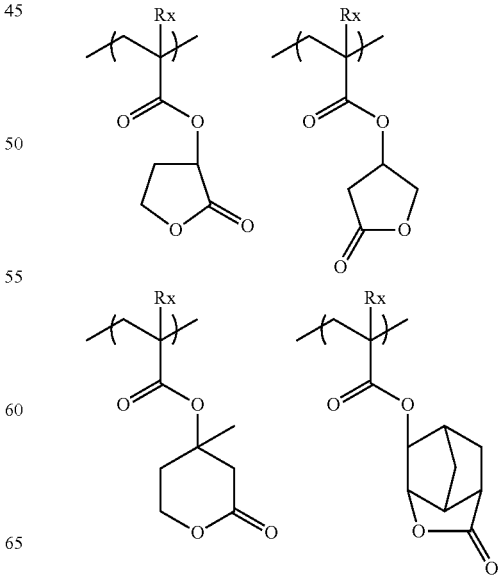

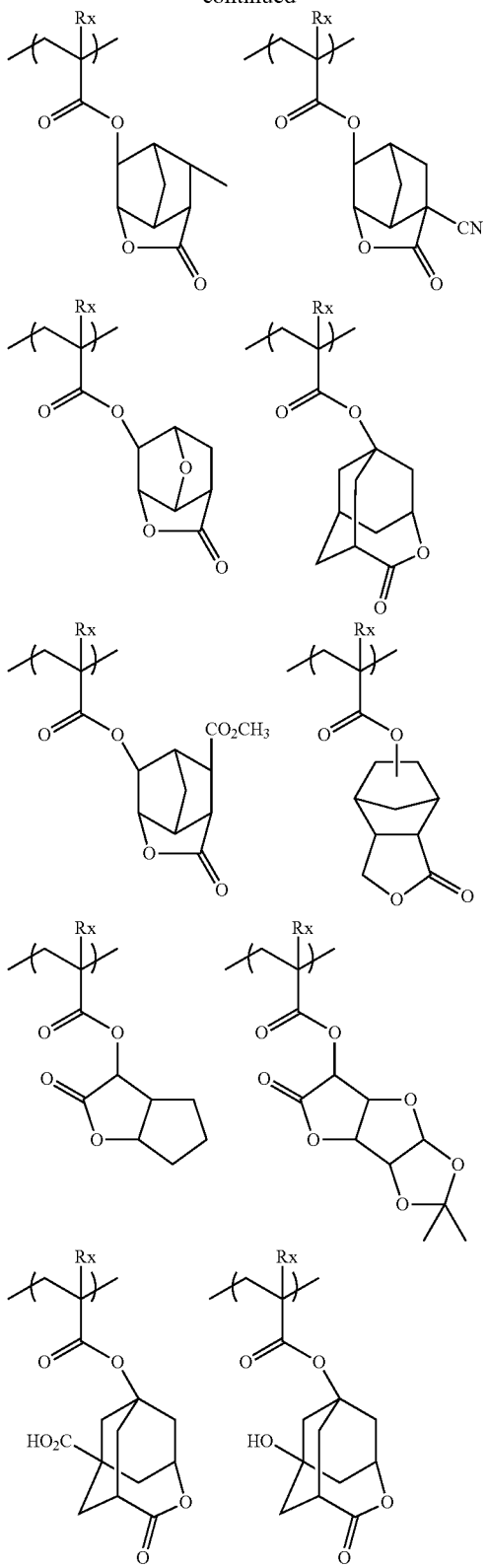

The resin (A) preferably contains a repeating unit having a lactone structure represented by the following formula (3).

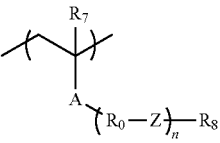

In formula (3), A represents an ester bond (a group represented by —COO—) or a group represented by —CONH—.

$R_0$ represents an alkylene group, a cycloalkylene group, or a combination of these groups, and when two or more $R_0$'s are present, each $R_0$ may be the same as or different from every other $R_0$.

Z represents a single bond, an ether bond, an ester bond, an amido bond, a urethane bond, or a urea bond, and when two or more Z's are present, each Z may be the same as or different from every other Z. An ether bond or an ester bond is preferred.

$R_8$ represents a monovalent organic group having a lactone structure.

n is the repeating number of the structure represented by —$R_0$—Z— in the repeating unit represented by formula (3), and preferably represents an integer of 1 to 5, and more preferably 1.

$R_7$ represents a hydrogen atom, a halogen atom or an alkyl group.

The alkylene group and the cycloalkylene group represented by $R_0$ may have a substituent.

Z represents an ether bond or an ester bond, and especially preferably an ester bond.

The alkyl group represented by $R_7$ is preferably an alkyl group having 1 to 4 carbon atoms, more preferably a methyl group or an ethyl group, and especially preferably a methyl group. The alkyl group represented by $R_7$ may be substituted, and the examples of the substituents include a halogen atom, e.g., a fluorine atom, a chlorine atom, and a bromine atom, a mercapto group, an alkoxy group, e.g., a hydroxyl group, a methoxy group, an ethoxy group, an isopropoxy group, a t-butoxy group, a benzyloxy group, etc., and an acetoxy group, e.g., an acetyl group, a propionyl group, etc. $R_7$ preferably represents a hydrogen atom, a methyl group, a trifluoromethyl group, or a hydroxymethyl group.

The preferred chain alkylene group represented by $R_0$ is preferably a chain alkylene group having 1 to 10 carbon atoms, and more preferably having 1 to 5 carbon atoms, e.g., a methylene group, an ethylene group, and a propylene group are exemplified. The preferred cyclic alkylene group is a cyclic alkylene group having 1 to 20 carbon atoms, e.g., cyclohexylene, cyclopentylene, norbornylene, and adamantylene are exemplified.

The organic group having a lactone structure represented by $R_8$ is not restricted so long as it has a lactone structure, and lactone structures represented by any of the formulae (LC1-1) to (LC1-17) are exemplified as specific examples. Of these structures, the structure represented by (LC1-4) is especially preferred. Further, $n_2$ in formulae (LC1-1) to (LC1-17) is more preferably 2 or less.

$R_8$ more preferably represents a monovalent organic group having a lactone structure having a cyano group (cyanolactone) as a substituent.

The specific examples of repeating units having a group having the lactone structure represented by formula (3) are shown below, but the invention is not restricted thereto.

In the specific examples shown below, R represents a hydrogen atom, an alkyl group which may have a substituent, or a halogen atom, preferably represents a hydrogen atom, a methyl group, or a hydroxymethyl or acetoxymethyl group, i.e., an alkyl group having a substituent.

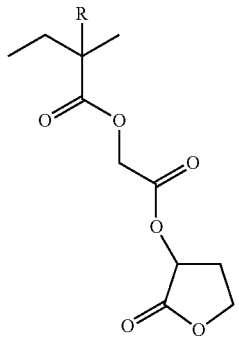

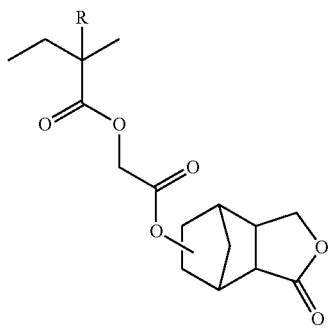

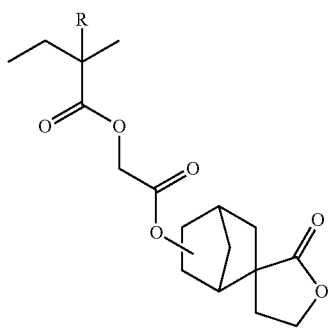

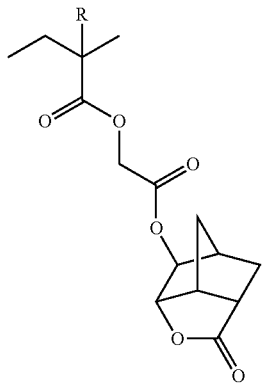

As the repeating unit having a lactone structure, a repeating unit represented by the following formula (3-1) is more preferred.

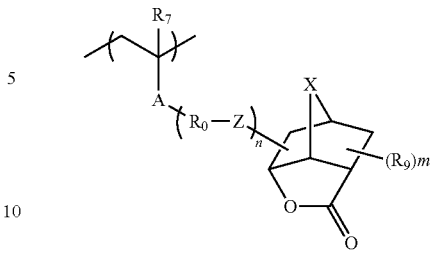

In formula (3-1), Ry, A $R_0$, Z and n are the same as those in formula (3).

$R_9$ represents an alkyl group, a cycloalkyl group, an alkoxycarbonyl group, a cyano group, a hydroxyl group or an alkoxy group, and when two or more $R_9$'s are present, each $R_9$ may be the same as or different from every other $R_9$ or two of $R_9$'s may be bonded to each other to form a ring.

X represents an alkylene group, an oxygen atom or a sulfur atom.

m is the number of the substituents and represents an integer of 0 to 5. m is preferably 0 or 1.

The alkyl group represented by $R_9$ is preferably an alkyl group having 1 to 4 carbon atoms, more preferably a methyl group or an ethyl group, and most preferably a methyl group. As the cycloalkyl group represented by $R_9$, a cyclopropyl group, a cyclobutyl group, a cyclopentyl group, and a cyclohexyl group are exemplified. As the alkoxycarbonyl group, an alkoxycarbonyl group having 2 to 5 carbon atoms is preferred, and a methoxycarbonyl group, an ethoxycarbonyl group, an n-butoxy-carbonyl group, and a t-butoxycarbonyl group are exemplified. As the examples of the substituents, an alkoxy group, e.g., a hydroxyl group, a methoxy group, and an ethoxy group, a cyano group, and a halogen atom, e.g., a fluorine atom, are exemplified, and more preferably a cyano group.

As the alkylene group represented by X, a methylene group and an ethylene group are exemplified, and preferably a methylene group.

The specific examples of the repeating units having a group having the lactone structure represented by formula (3-1) are shown below, but the invention is not restricted to these examples. In the following formulae R represents a hydrogen atom, a substituted or unsubstituted alkyl group, or a halogen atom, and preferably represents a hydrogen atom, a methyl group, or a hydroxymethyl or acetoxymethyl group, i.e., an alkyl group having a substituent.

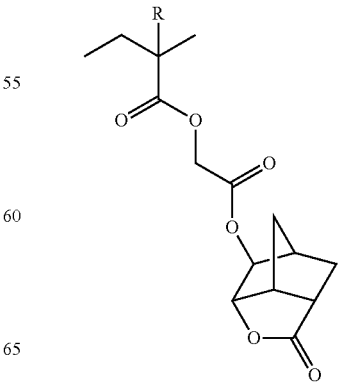

-continued
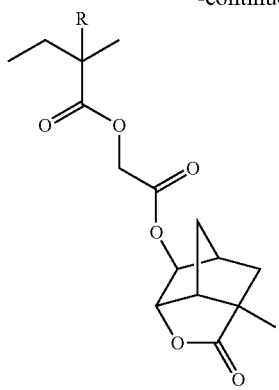
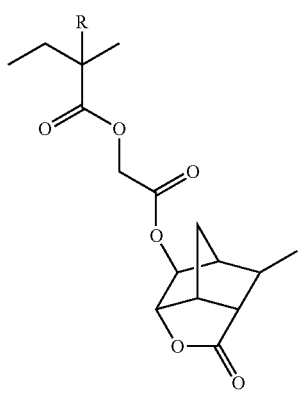
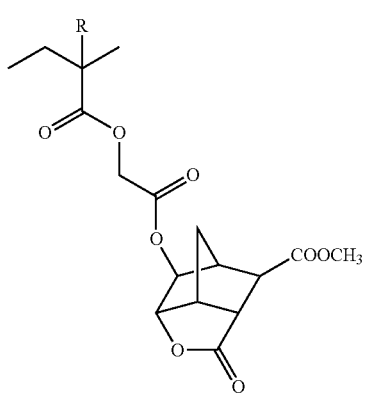
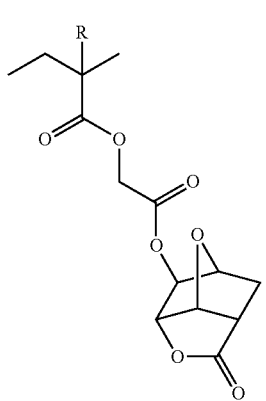
-continued
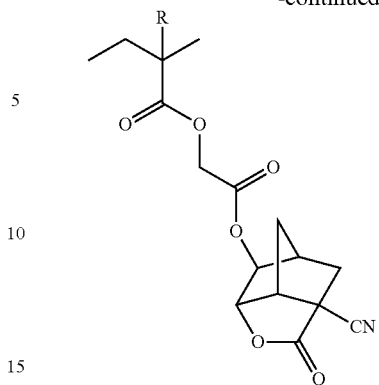
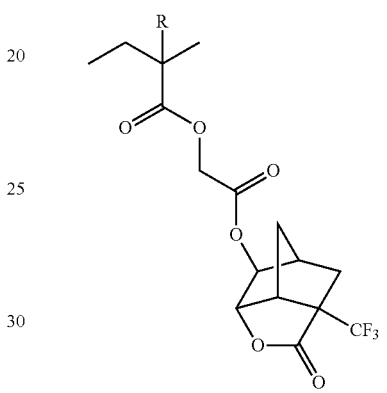
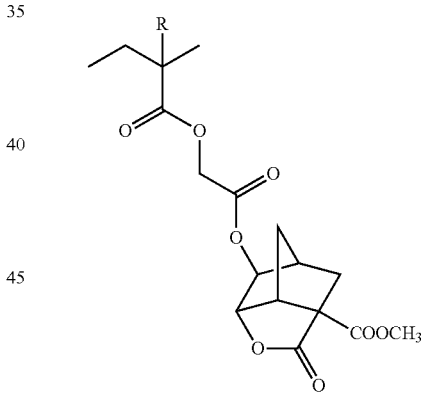
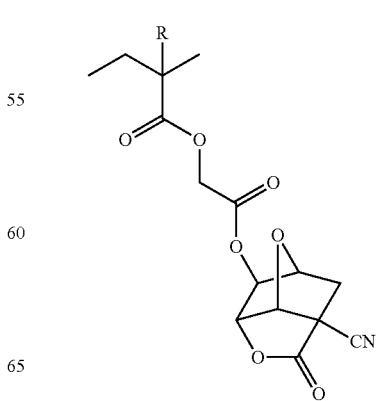

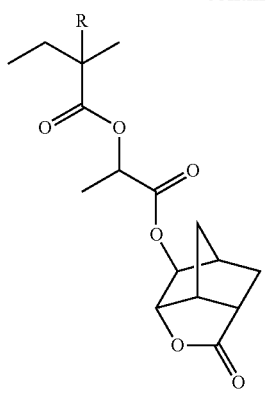
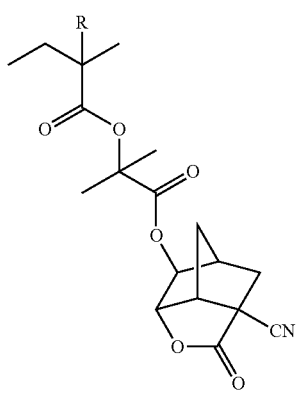
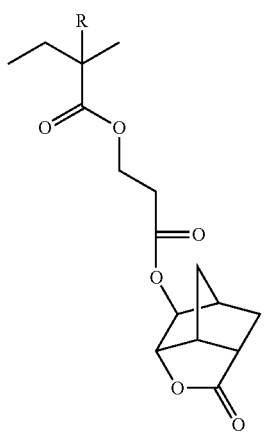
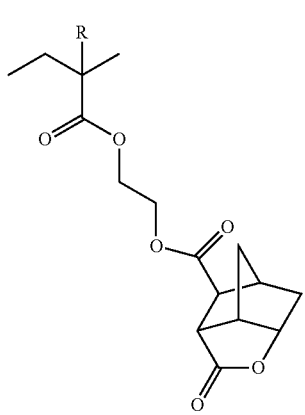
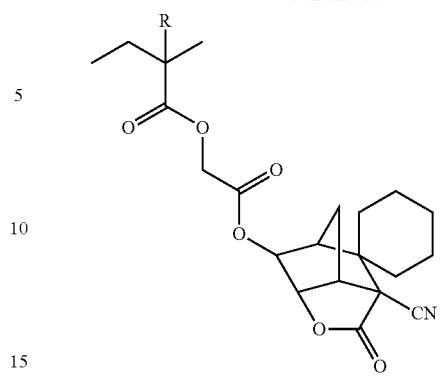
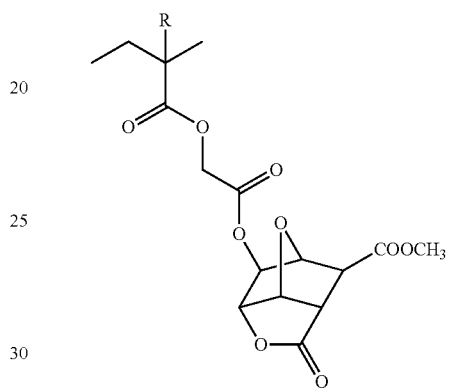
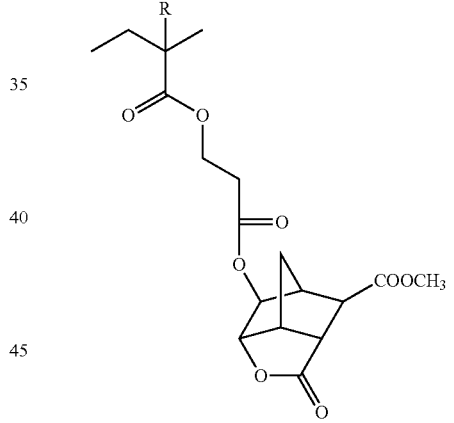
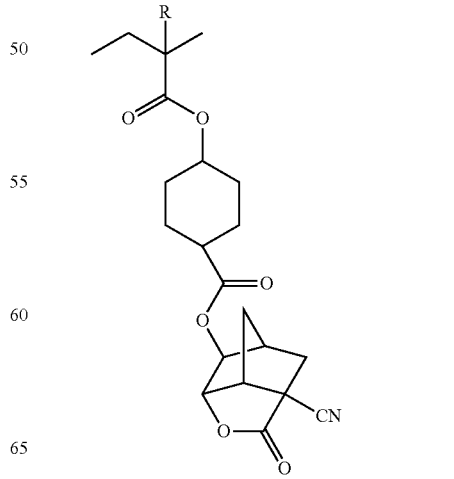

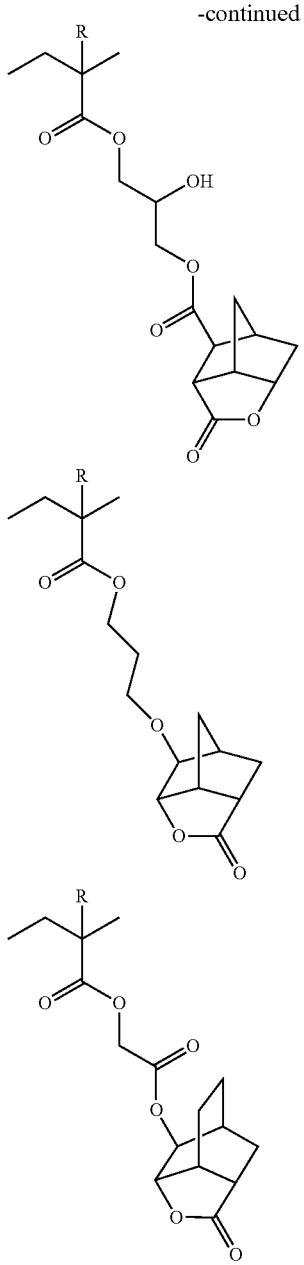

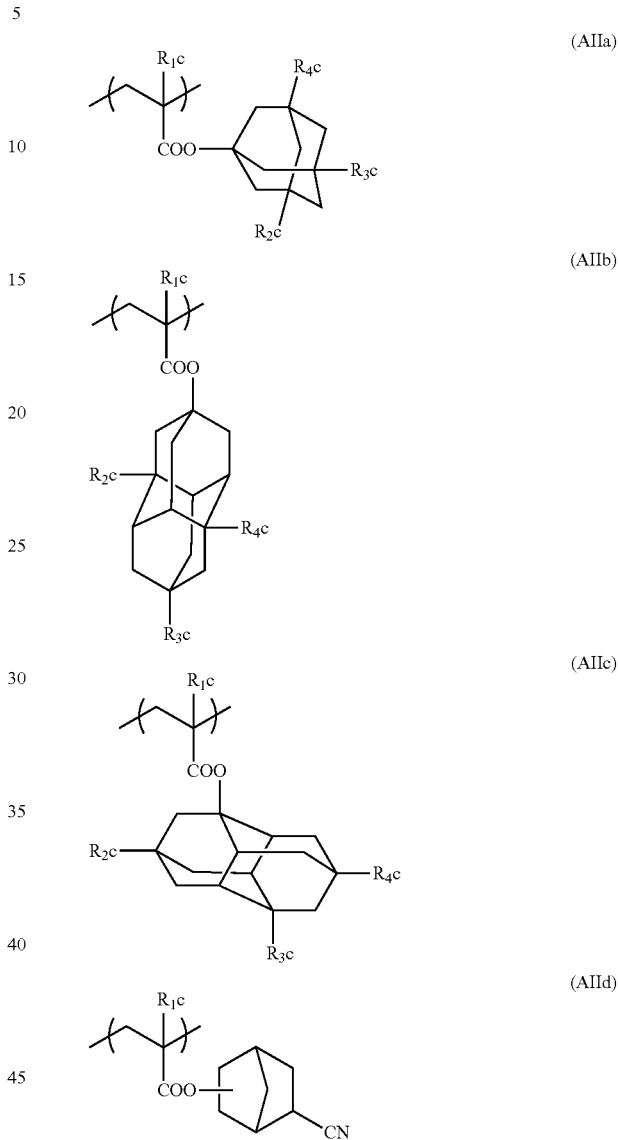

As the repeating units having the above atomic groups, repeating units represented by any of the following formulae (AIIa) to (AIId) are exemplified.

Repeating units having a lactone structure generally have optical isomers, and any optical isomer may be used.

The resin (A) may have a repeating unit having a hydroxyl group or a cyano group, by which adhesion to a substrate and affinity with a developer are improved. The repeating unit having a hydroxyl group or a cyano group is preferably a repeating unit having an alicyclic hydrocarbon structure substituted with a hydroxyl group or a cyano group. As the alicyclic hydrocarbon structure in the alicyclic hydrocarbon structure substituted with a hydroxyl group or a cyano group, an adamantyl group, a diamantyl group and a norbornyl group are preferred. As preferred alicyclic hydrocarbon structure substituted with a hydroxyl group or a cyano group, a monohydroxyadamantyl group, a dihydroxyadamantyl group, a monohydroxy-diamantyl group, a dihydroxydiamantyl group, and a norbornyl group substituted with a cyano group are exemplified.

In formulae (AIIa) to (AIId), $R_1c$ represents a hydrogen atom, a methyl group, a trifluoromethyl group or a hydroxymethyl group.

Each of $R_2c$ to $R_4c$ independently represents a hydrogen atom, a hydroxyl group or a cyano group. However, at least one of $R_2c$ to $R_4c$ represents a hydroxyl group or a cyano group, preferably one or two of $R_2c$ to $R_4c$ represent a hydroxyl group and the remainder represent(s) a hydrogen atom. In formula (AIIa), it is more preferred that two of $R_2c$ to $R_4c$ represent a hydroxyl group and the remainder represents a hydrogen atom.

In the case where the resin (A) for use in the invention contains a repeating unit having a hydroxyl group or a cyano group, the content of the repeating unit having a hydroxyl group or a cyano group is preferably 1 to 40 mol %, more preferably 5 to 30 mol %, still more preferably 5 to 25 mol %, based on all the repeating units.

The specific examples of the repeating units having a hydroxyl group or a cyano group are shown below, but the invention is not restricted thereto.

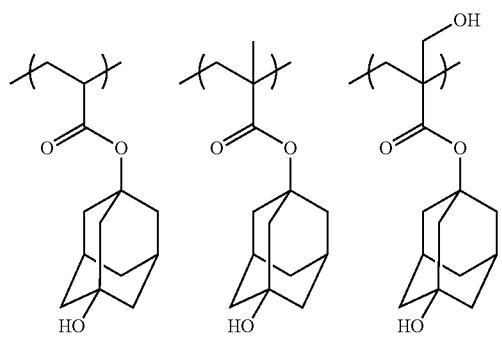

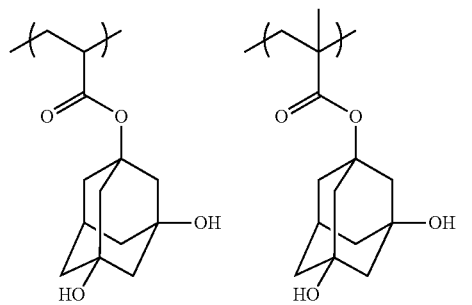

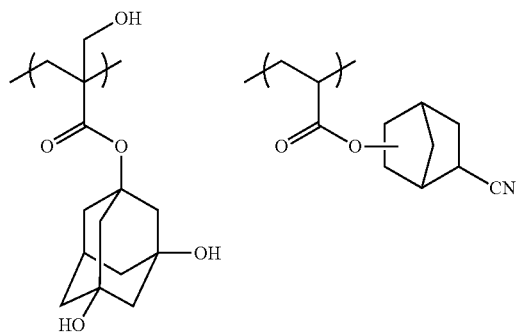

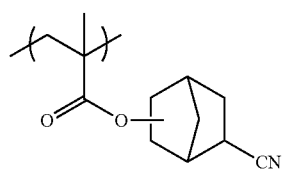

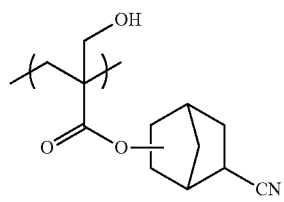

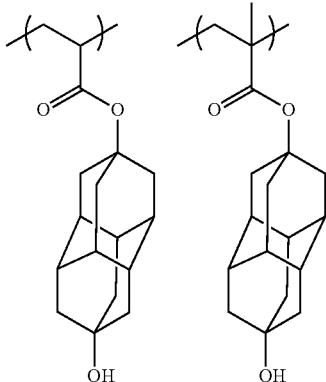

The resin (A) of the invention may have a repeating unit having an alkali-soluble group other than the repeating unit represented by formula (1). As the alkali-soluble groups, a carboxyl group, a sulfonamide group, a sulfonylimido group, bissulfonylimido group, aliphatic alcohol the α-position of which is substituted with an electron attractive group (e.g., a hexafluoroisopropanol group), and a phenol group are exemplified. It is more preferred to have a repeating unit having a carboxyl group. As the repeating unit having an alkali-soluble group, there are a repeating unit having an alkali-soluble group directly bonding to the main chain of a resin such as a repeating unit by acrylic acid or methacrylic acid, a repeating unit having an alkali-soluble group bonding to the main chain of a resin through a linking group, and a repeating unit having an alkali-soluble group at the terminal of a polymer chain introduced by polymerization with a polymerization initiator or a chain transfer agent having an alkali-soluble group, and any of these repeating units can be preferably used. The linking group may have a monocyclic or polycyclic hydrocarbon structure. Particularly preferred repeating unit is a repeating unit by acrylic acid or methacrylic acid.

The specific examples of the repeating units having an alkali-soluble group are shown below, but the invention is not restricted thereto. In the specific examples, Rx represents H, CH$_3$, CH$_2$OH or CF$_3$.

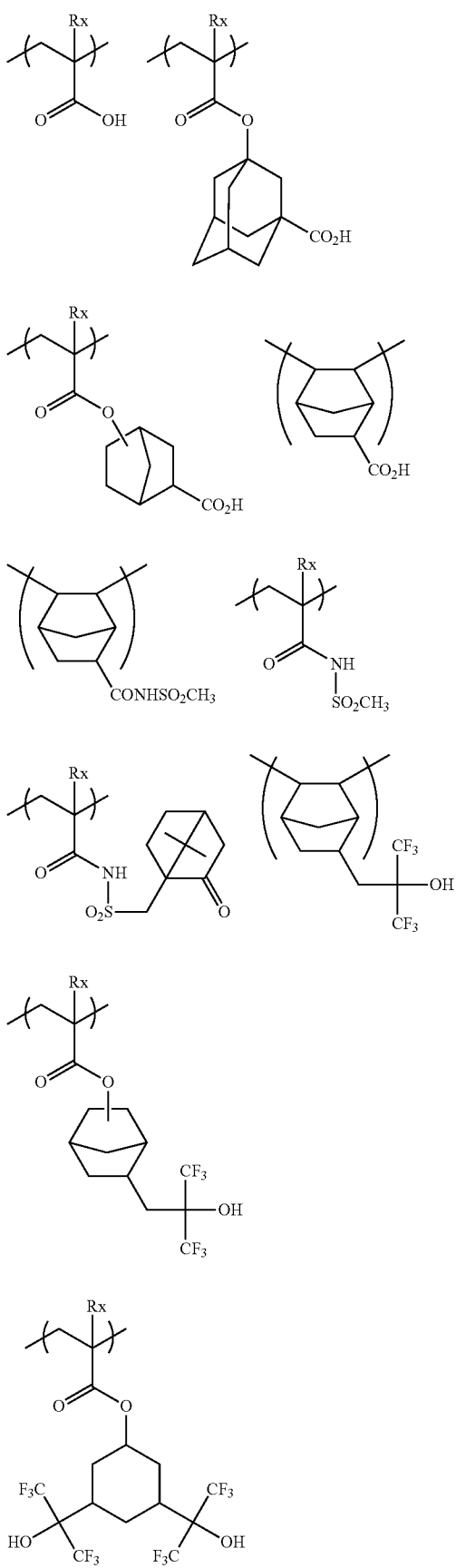

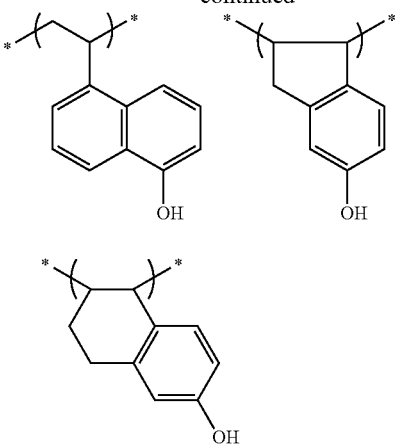

The resin (A) of the invention may also have a repeating unit having a cyclic hydrocarbon structure not having a polar group and not showing acid-decomposing property, by which developing property can be adjusted. As such a repeating unit, a repeating unit represented by the following formula (4) is exemplified.

(4)

$$\text{structure with Ra, C(=O)-O-R}_5$$

In formula (4), $R_5$ represents a hydrocarbon group having at least one cyclic structure and not having a polar group (e.g., hydroxyl, cyano).

Ra represents a hydrogen atom, an alkyl group which may have a substituent, or a —$CH_2$—O—$Ra_2$ group. $Ra_2$ represents a hydrogen atom, an alkyl group or an acyl group. Ra preferably represents a hydrogen atom, a methyl group, a hydroxymethyl group, or a trifluoromethyl group, and especially preferably a hydrogen atom or a methyl group.

The cyclic structure of $R_5$ includes a monocyclic hydrocarbon group and a polycyclic hydrocarbon group. As the monocyclic hydrocarbon group, for example, a cycloalkyl group having 3 to 12 carbon atoms, such as cyclopentyl group, cyclohexyl group, cycloheptyl group and cyclooctyl group, and a cycloalkenyl group having 3 to 12 carbon atoms, such as cyclohexenyl group, are exemplified. A preferred monocyclic hydrocarbon group is a monocyclic hydrocarbon group having 3 to 7 carbon atoms.

The polycyclic hydrocarbon group includes a ring gathering hydrocarbon group and a crosslinked ring hydrocarbon group.

Examples of the ring gathering hydrocarbon group include a bicyclohexyl group, a perhydronaphthalenyl group, a biphenyl group and a 4-cyclohexylphenyl group. As the crosslinked ring hydrocarbon ring, a dicyclic hydrocarbon ring, a tricyclic hydrocarbon ring, and a tetracyclic hydrocarbon ring are exemplified. Further, a condensed ring hydrocarbon ring (e.g., a condensed ring formed by condensation of a plurality of 5- to 8-membered cycloalkane rings) is also included in the crosslinked ring hydrocarbon ring. As preferred crosslinked ring hydrocarbon rings, a norbornyl group, an adamantyl group, a bicyclooctanyl group and a tricycle[5,2,1,0$^{2,6}$]decanyl group are exemplified, and a norbornyl group and an adamantly group are more preferred.

These cyclic hydrocarbon rings may have a substituent. As preferred substituents, a halogen atom, an alkyl group, a hydroxyl group protected with a protective group, and an amino group protected with a protective group, are exemplified. As preferred halogen atoms, bromine, chlorine and fluorine atoms, and as preferred alkyl groups, methyl, ethyl, butyl and t-butyl groups are respectively exemplified. The above alkyl groups may further have a substituent, and as such further substituents, a halogen atom, an alkyl group, a hydroxyl group protected with a protective group, and an amino group protected with a protective group, are exemplified.

As the protective groups, e.g., an alkyl group, a cycloalkyl group, an aralkyl group, a substituted methyl group, a substituted ethyl group, an alkoxycarbonyl group, and an aralkyloxycarbonyl group are exemplified. Preferred alkyl groups are alkyl groups having 1 to 4 carbon atoms, preferred substituted methyl groups are a methoxymethyl group, a methoxythiomethyl group, a benzyloxymethyl group, a t-butoxymethyl group, and a 2-methoxyethoxymethyl group, preferred substituted ethyl groups are a 1-ethoxyethyl group and a 1-methyl-1-methoxyethyl group, preferred acyl groups are aliphatic acyl groups having 1 to 6 carbon atoms, e.g., a formyl group, an acetyl group, a propionyl group, a butyryl group, an isobutyryl group, a valeryl group, and a pivaloyl group, and preferred alkoxycarbonyl groups are alkoxycarbonyl groups having 1 to 4 carbon atoms.

$R_6$ may be an aryl group or an aralkyl group.

The aryl group is preferably an aryl group having 6 to 12 carbon atoms, and specific examples thereof include a phenyl group, a naphthyl group and a biphenyl group. The aryl group may be further substituted with an alkyl group, a cycloalkyl group or the like.

The aralkyl group is preferably an aralkyl group having 7 to 15 carbon atoms, and specific examples thereof include a benzyl group, a naphthylmethyl group and a naphthylethyl group. The aralkyl group may be further substituted with an alkyl group, a cycloalkyl group or the like.

The specific examples of the repeating unit having a cyclic hydrocarbon structure not having a polar group and not showing acid-decomposing property are shown below, but the invention is not restricted thereto. In the formulae, Ra represents H, $CH_3$, $CH_2OH$ or $CF_3$.

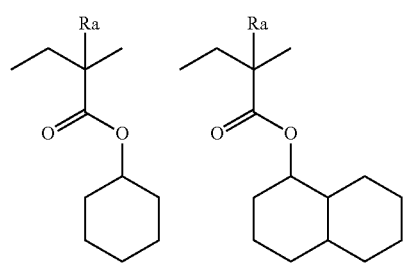

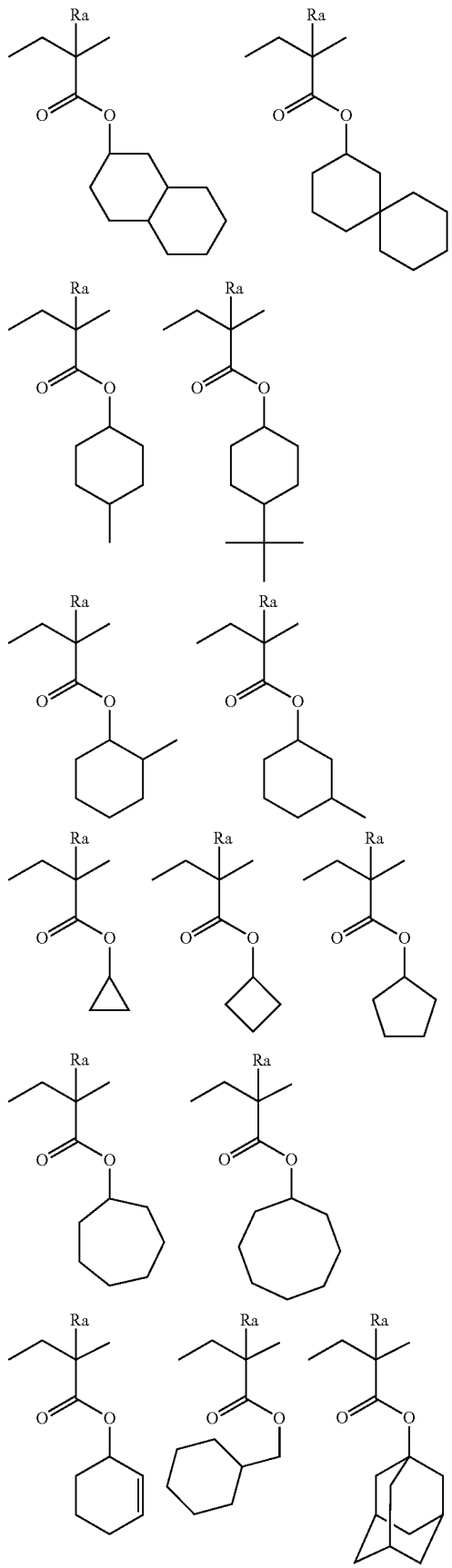

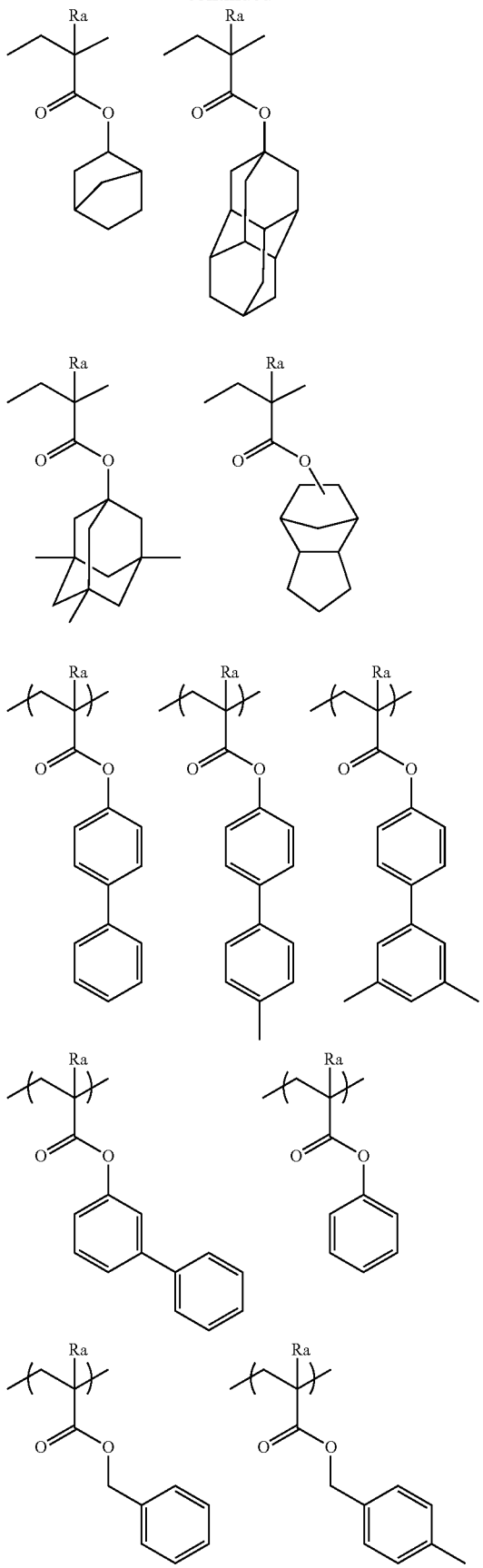

The resin (A) may or may not contain a repeating unit having a polar group-free cyclic hydrocarbon structure and not showing acid-decomposing property, but in the case of containing the repeating unit, the content thereof is preferably 1 to 40 mol %, more preferably 3 to 20 mol %, based on all the repeating units in the resin (A).

The resin (A) for use in the actinic ray-sensitive or radiation-sensitive resin compositions in the invention may contain various kinds of repeating units besides the above-described repeating structural units for the purpose of improving dry etching resistance and substrate adhesion and adjusting film-forming properties.

As such repeating structural units, compounds having one addition polymerizable unsaturated bond selected from acrylic esters, methacrylic esters, acrylamides, methacrylamides, allyl compounds, vinyl ethers and vinyl esters can be exemplified.

In addition to the above, addition polymerizable unsaturated compounds copolymerizable with the monomers corresponding to the above various repeating structural units may be copolymerized.

In the resin (A) for use in the actinic ray-sensitive or radiation-sensitive resin compositions in the invention, the molar ratios of the contents of the above various repeating units are arbitrarily set for adjusting not only sensitivity and pattern form but also dry etching resistance, substrate adhesion, film-forming properties and other various characteristics.

When the resin (A) of the invention is resin A-1, the content of the repeating unit represented by formula (1) is preferably in the range of 1 to 40 mol % based on all the repeating units, more preferably in the range of 5 to 30 mol %, especially preferably in the range of 5 to 20 mol %, and most preferably in the range of 5 to 20 mol %.

When the resin (A) of the invention is resin A-2, the content of the repeating unit represented by formula (1) is not especially restricted, but the content is preferably in the range of 3 to 95 mol % based on all the repeating units, more preferably in the range of 5 to 85 mol %, and especially preferably in the range of 20 to 85 mol %.

When the resin (A) of the invention is resin A-1, the content of the repeating unit represented by formula (AI) in the resin is preferably in the range of 20 to 70 mol % based on all the repeating units, and more preferably 30 to 50 mol %.

When the resin (A) of the invention is resin A-2, the content of the repeating unit (B) in the resin is preferably in the range of 5 to 97 mol % based on all the repeating units, more preferably in the range of 15 to 90 mol %, and especially preferably in the range of 15 to 80 mol %.

As the preferred specific examples of resin A-1, for example, a resin having the repeating unit represented by formula (1)/the repeating unit represented by formula (AI), a resin having the repeating unit represented by formula (1)/the repeating unit represented by formula (AI)/one or more repeating units selected from formulae (AIIa) to (AIId), a resin having the repeating unit represented by formula (1)/the repeating unit represented by formula (AI)/one or more repeating units selected from formulae (Y2) to (Y4)/one or more repeating units selected from formulae (AIIa) to (AIId), and a resin having the repeating unit represented by formula (1)/the repeating unit represented by formula (AI)/one or more repeating units selected from formulae (AIIa) to (AIId)/ the repeating unit represented by formula (AII) are exemplified, but the invention is not restricted thereto.

As the preferred specific examples of resin A-2, for example, a resin having the repeating unit represented by formula (1)/the repeating unit represented by formula (I), and a resin having the repeating unit represented by formula (1)/ the repeating unit represented by formula (I)/one or more repeating units selected from formulae (Y2) to (Y4) are exemplified, but the invention is not restricted thereto.

The form of the resin (A) may be any type of random, block, comb and star types.

The resin (A) can be synthesized by, for example, radical polymerization, cationic polymerization, or anionic polymerization of unsaturated monomer corresponding to each structure. It is also possible to obtain an objective resin by polymerization with an unsaturated monomer corresponding to precursor of each structure, and then by performing polymer reaction.

The molecular weight of the resin (A) in the invention is not especially restricted, but the weight average molecular weight is preferably in the range of 1,000 to 100,000, more preferably in the range of 1,500 to 70,000, especially preferably in the range of 2,000 to 50,000, and most preferably in the range of 2,000 to 30,000. The weight average molecular weight of the resin here shows the polystyrene equivalent molecular weight measured by GPC (carrier: THF or N-methyl-2-pyrrolidone (NMP)).

Polydispersity (Mw/Mn) is preferably 1.00 to 5.00, more preferably 1.03 to 3.50, and still more preferably 1.05 to 2.50.

The resin (A) for use in the invention may be used by one kind alone, or two or more in combination.

The content of the resin (A) is preferably 30 to 99.9% by mass based on all the solids content in the radiation-sensitive resin compositions in the invention, more preferably 50 to 99.9% by mass, and especially preferably 70 to 99.9% by mass.

[2] (B) Compounds Generating an Acid Upon Irradiation with Actinic Ray or Radiation The composition in the invention contains a compound generating an acid upon irradiation with actinic ray or radiation (hereinafter also referred to as "acid generator").

Known acid generators are not particularly restricted, but compounds capable of generating an organic acid, for example, at least any of sulfonic acid, bis(alkylsulfonyl)imide, and tris(alkylsulfonyl)methide, upon irradiation with actinic ray or radiation are preferred.

More preferably the compounds represented by any of the following formulae (ZI), (ZII) and (ZIII) can be exemplified.

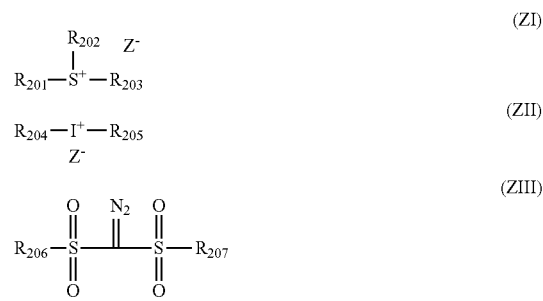

In formula (ZI), each of $R_{201}$, $R_{202}$ and $R_{203}$ independently represents an organic group.

The number of carbon atoms of the organic groups represented by $R_{201}$, $R_{202}$ and $R_{203}$ is generally 1 to 30, and preferably 1 to 20.

Two of $R_{201}$, $R_{202}$ and $R_{203}$ may be bonded to each other to form a cyclic structure, and an oxygen atom, a sulfur atom, an ester bond, an amido bond or a carbonyl group may be contained in the ring. As the group formed by bonding two of $R_{201}$, $R_{202}$ and $R_{203}$, an alkylene group (e.g., a butylene group, a pentylene group) can be exemplified.

$Z^-$ represents a non-nucleophilic anion (an anion having an extremely low ability of causing nucleophilic reaction).

The examples of the non-nucleophilic anions include, e.g., a sulfonate anion (an aliphatic sulfonate anion, an aromatic sulfonate anion, a camphor sulfonate anion), a carboxylate anion (an aliphatic carboxylate anion, an aromatic carboxylate anion, an aralkylcarboxylate anion), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be an alkyl group or a cycloalkyl group, preferably a straight chain or branched alkyl group having 1 to 30 carbon atoms and a cycloalkyl group having 3 to 30 carbon atoms are exemplified.

The aromatic group in the aromatic sulfonate anion and the aromatic carboxylate anion is preferably an aryl group having 6 to 14 carbon atoms, e.g., a phenyl group, a tolyl group, and a naphthyl group are exemplified.

The alkyl group, cycloalkyl group and aryl group described above may have a substituent. As the specific examples of the substituents, a nitro group, a halogen atom, e.g., a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), a cycloalkylalkyloxyalkyloxy group (preferably having 8 to 20 carbon atoms), etc., are exemplified. In connection with the aryl group and the cyclic structure of each group, an alkyl group (preferably having 1 to 15 carbon atoms) can further be exemplified as the substituent.

As the aralkyl group in the aralkylcarboxylate anion, preferably an aralkyl group having 6 to 12 carbon atoms, e.g., a benzyl group, a phenethyl group, a naphthylmethyl group, a naphthylethyl group, and a naphthylmethyl group can be exemplified.

As the sulfonylimide anion, e.g., a saccharin anion can be exemplified.

The alkyl group in the bis(alkylsulfonyl)imide anion and tris(alkylsulfonyl)-methide anion is preferably an alkyl group having 1 to 5 carbon atoms. As the substituents on these alkyl groups, a halogen atom, an alkyl group substituted with a halogen atom, an alkoxy group, an alkylthio group, an alkyloxysulfonyl group, an aryloxysulfonyl group, and a cycloalkylaryloxysulfonyl group can be exemplified, and a fluorine atom or an alkyl group substituted with a fluorine atom is preferred.

The alkyl groups in the bis(alkylsulfonyl)imide anion may be bonded to each other to form a cyclic structure, by which acid strength is heightened.

As other non-nucleophilic anions, e.g., fluorinated phosphorus (for example, $PF_6^-$), fluorinated boron (for example, $BF_4^-$) and fluorinated antimony (for example, $SbF_6^-$) can be exemplified.

As the non-nucleophilic anions, an aliphatic sulfonate anion in which at least the α-position of the sulfonic acid is substituted with a fluorine atom, an aromatic sulfonate anion substituted with a fluorine atom or a group having a fluorine atom, a bis(alkylsulfonyl)imide anion in which the alkyl group is substituted with a fluorine atom, and a tris(alkylsulfonyl)methide anion in which the alkyl group is substituted with a fluorine atom are preferred. More preferred non-nucleophilic anions are an aliphatic perfluorosulfonate anion (still more preferably having 4 to 8 carbon atoms), and a benzenesulfonate anion having a fluorine atom, and still more preferred non-nucleophilic anions are a nonafluorobutanesulfonate anion, a perfluorooctanesulfonate anion, a pentafluorobenzenesulfonate anion, and a 3,5-bis(trifluoromethyl)benzenesulfonate anion.

From the viewpoint of acid strength, pKa of a generated acid is preferably −1 or less in view of the improvement of sensitivity.

As non-nucleophilic anion, an anion represented by the following formula (AN1) is also exemplified as preferred embodiment.

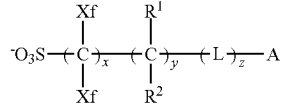

(AN1)

In formula (AN1), each of Xf independently represents a fluorine atom, or an alkyl group substituted with at least one fluorine atom.

Each of $R^1$ and $R^2$ independently represents a hydrogen atom, a fluorine atom, an alkyl group, or an alkyl group substituted with at least one fluorine atom, and each $R^1$ and $R^2$, when a plurality of $R^1$ and $R^2$ are present, may be the same with or different from every other $R^1$ and $R^2$.

L represents a single bond or a divalent linking group, and each L, when a plurality of L are present, may be the same with or different from every other L.

A represents a group having a cyclic structure.

x represents an integer of 1 to 20, y represents an integer of 0 to 10, and z represents an integer of 0 to 10.

Formula (AN1) will be described in further detail.

The alkyl group in the alkyl group substituted with a fluorine atom represented by Xf is preferably an alkyl group having 1 to 10 carbon atoms, and more preferably 1 to 4 carbon atoms. The alkyl group substituted with a fluorine atom represented by Xf is preferably a perfluoroalkyl group.

Xf preferably represents a fluorine atom or a perfluoroalkyl group having 1 to 4 carbon atoms. Specifically, a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$ are exemplified, and a fluorine atom and $CF_3$ are preferred of all.

The alkyl group and the alkyl group in the alkyl group substituted with at least one fluorine atom represented by each of $R^1$ and $R^2$ is preferably an alkyl group having 1 to 4 carbon atoms.

x is preferably 1 to 10, and more preferably 1 to 5.

y is preferably 0 to 4, and more preferably 0.

z is preferably 0 to 5, and more preferably 0 to 3.

The divalent linking group represented by L is not especially restricted, and —COO—, —OCO—, —CO—, —O—, —S—, —SO—, —SO$_2$—, an alkylene group, a cycloalkylene group, and an alkenylene group are exemplified. Of these, —COO—, —OCO—, —CO— and —O— are preferred, and —COO— and —OCO— are more preferred.

The group having a cyclic structure represented by A is not especially limited so long as it has a cyclic structure, and an alicyclic group, an aryl group, and a group having a heterocyclic structure (including not only those having an aromatic property but also those not having an aromatic property) are exemplified.

The alicyclic group may be monocyclic or polycyclic, and monocyclic cycloalkyl groups, e.g., a cyclopentyl group, a cyclohexyl group, and a cyclooctyl group, and polycyclic cycloalkyl groups, e.g., a norbornyl group, a tricyclodecanyl group, a tetracyclodecanyl group, a tetracyclododecanyl group, and an adamantyl group are preferably exemplified. Of these groups, alicyclic groups having 7 or more carbon atoms and a bulky structure such as a norbornyl group, a tricyclodecanyl group, a tetracyclodecanyl group, a tetracyclododecanyl group, and an adamantyl group are preferred for capable of controlling diffusibility in a film in the heating process after exposure and from the viewpoint of the improvement of MEEF.

As the aryl group, a benzene ring, a naphthalene ring, a phenanthrene ring, and an anthracene ring are exemplified.

As the group having a heterocyclic structure, a furan ring, a thiophene ring, a benzofuran ring, a benzothiophene ring, a dibenzofuran ring, and a pyridine ring are exemplified, and a furan ring, a thiophene ring and a pyridine ring are preferred of all.

The groups having a cyclic structure may have a substituent. As the substituents, an alkyl group (which may be any of straight chain, branched and cyclic, and preferably having 1 to 12 carbon atoms), an aryl group (preferably having 6 to 14 carbon atoms), a hydroxyl group, an alkoxy group, an ester group, an amido group, a urethane group, a ureido group, a thioether group, a sulfonamide group, and a sulfonic acid ester group are exemplified.

As the organic group represented by each of $R_{201}$, $R_{202}$ and $R_{203}$, an aryl group, an alkyl group, and a cycloalkyl group are exemplified.

Preferably at least one of $R_{201}$, $R_{202}$ and $R_{203}$ represents an aryl group, and more preferably all of $R_{201}$, $R_{202}$ and $R_{203}$ represent an aryl group. Besides a phenyl group and a naphthyl group, hetero aryl groups such as an indole residue and a pyrrole residue are also included in the aryl group. The alkyl group and cycloalkyl group of $R_{201}$ to $R_{203}$ are preferably a straight chain or branched alkyl group having 1 to 10 carbon atoms and a cycloalkyl group having 3 to 10 carbon atoms. More preferred examples of the alkyl group include a methyl group, an ethyl group, an n-propyl group, an i-propyl group and an n-butyl, and more preferred examples of the cycloalkyl group include a cyclopropyl group, a cyclobutyl group, a cyclopentyl group, a cyclohexyl group and a cycloheptyl group. These groups may further have a substituent. As the substituents, a nitro group, a halogen atom, e.g., a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms) are exemplified, but the invention is not restricted thereto.

When two of $R_{201}$, $R_{202}$ and $R_{203}$ are bonded to each other to form a cyclic structure, the structure is preferably a structure represented by the following formula (A1).

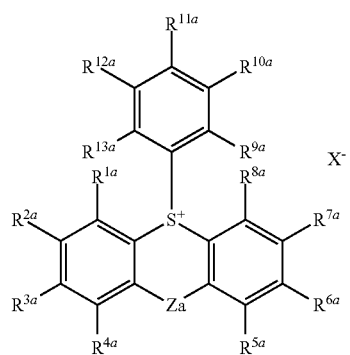

(A1)

In formula (A1), each of $R^{1a}$ to $R^{13a}$ independently represents a hydrogen atom or a substituent.

Preferably one to three of $R^{1a}$ to $R^{13a}$ do not represent a hydrogen atom, and more preferably any one of $R^{1a}$ to $R^{13a}$ does not represent a hydrogen atom.

Za represents a single bond or a divalent linking group.

$X^-$ is the same as $Z^-$ in formula (ZI).

When each of $R^{1a}$ to $R^{13a}$ does not represent a hydrogen atom, the specific examples include a halogen atom, a straight chain, branched, or cyclic alkyl group, an alkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazine group, a ureido group, a boronic acid group (—B(OH)$_2$), a phosphato group (—OPO(OH)$_2$), a sulfato group (—OSO$_3$H), and other known substituents.

When each of $R^{1a}$ to $R^{13a}$ does not represent a hydrogen atom, a straight chain, branched, or cyclic alkyl group substituted with a hydroxyl group is preferably exemplified.

As the divalent linking group represented by Za, an alkylene group, an arylene group, a carbonyl group, a sulfonyl group, a carbonyloxy group, a carbonylamino group, a sulfonylamido group, an ether bond, a thioether bond, an amino group, a disulfide group, —(CH$_2$)$_n$—CO—, —(CH$_2$)$_n$—SO$_2$—, —CH═CH—, an aminocarbonylamino group, and an aminosulfonylamino group are exemplified (n is an integer of 1 to 3).

Preferred structures in the case where at least one of $R_{201}$, $R_{202}$ and $R_{203}$ is not an aryl group may take cationic structures, such as the compounds disclosed in JP-A-2004-233661, paragraphs 0047 and 0048, JP-A-2003-35948, paragraphs 0040 to 0046, U.S. Patent Application 2003/0224288A1, compounds (I-1) to (I-70), and U.S. Patent Application 2003/0077540A1, compounds (IA-1) to (IA-54), (IB-1) to (IB-24).

In formulae (ZII) and (ZIII), each of $R_{204}$ to $R_{207}$ independently represents an aryl group, an alkyl group or a cycloalkyl group.

The aryl group, alkyl group and cycloalkyl group represented by each of $R_{204}$ to $R_{207}$ are the same with the aryl group, alkyl group and cycloalkyl group represented by each of $R_{201}$ to $R_{203}$ in formula (ZI).

The aryl group, alkyl group and cycloalkyl group represented by each of $R_{204}$ to $R_{207}$ may have a substituent. As the examples of the substituents, the same substituents as those that the aryl group, alkyl group and cycloalkyl group represented by each of $R_{201}$ to $R_{203}$ in formula (ZI) may have are exemplified.

$Z^-$ represents a non-nucleophilic anion, and the same non-nucleophilic anions as represented by $Z^-$ in formula (ZI) can be exemplified.

As acid generators, the compounds represented by the following formula (ZIV), (ZV) or (ZVI) are also exemplified.

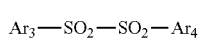

(ZIV)

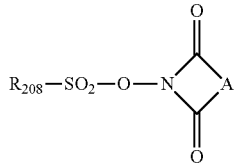

(ZV)

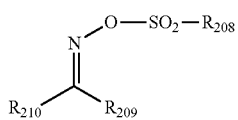
(ZVI)

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group, or an aryl group.

A represents an alkylene group, an alkenylene group, or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formulae (ZI).

Specific examples of the alkyl group and cycloalkyl group of $R_{208}$, $R_{209}$ and $R_{210}$ are the same as specific examples of the alkyl group and cycloalkyl group, respectively, of $R_{201}$, $R_{202}$ and $R_{203}$ in formulae (ZI).

The alkylene group of A includes an alkylene group having 1 to 12 carbon atoms (e.g., methylene, ethylene, propylene, isopropylene, butylene, isobutylene), the alkenylene group of A includes an alkenylene group having 2 to 12 carbon atoms (e.g., ethenylene, propenylene, butenylene), and the arylene group of A includes an arylene group having 6 to 10 carbon atoms (e.g., phenylene, tolylene, naphthylene).

Of the acid generators, especially preferred examples are shown below.

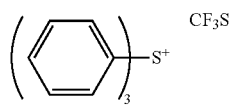
(z1)

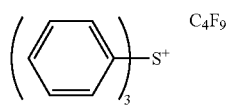
(z2)

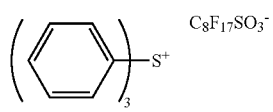
(z3)

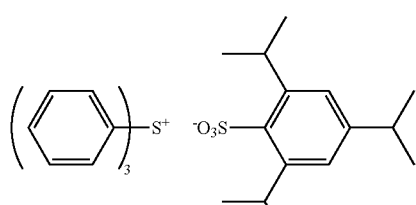
(z4)

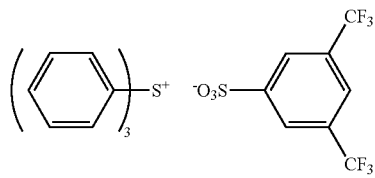
(z5)

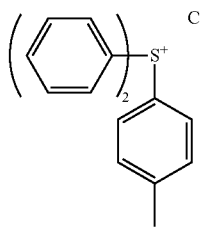
(z6)

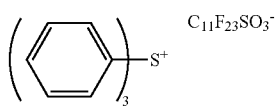
(z7)

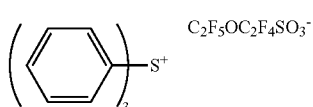
(z8)

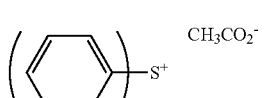
(z9)

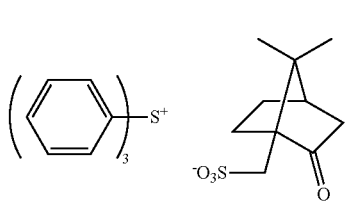
(z10)

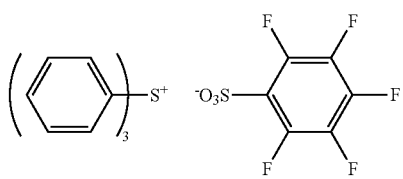
(z11)

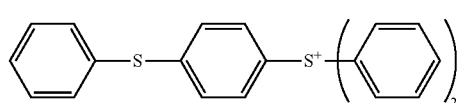
(z12)

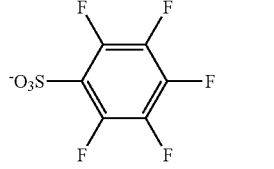

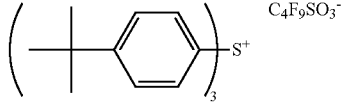
(z13)

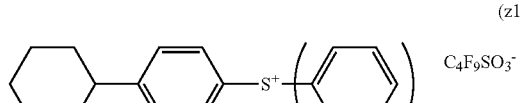
(z14)

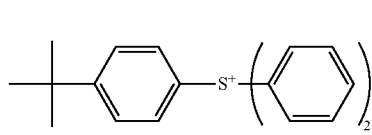
(z15)

-continued
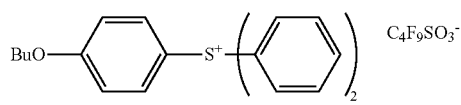 (z16)
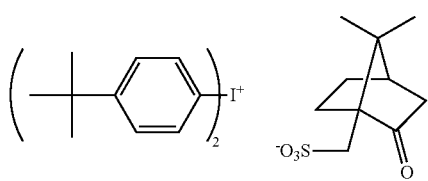 (z17)
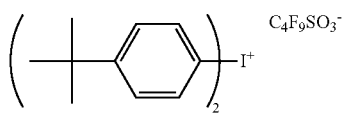 (z18)
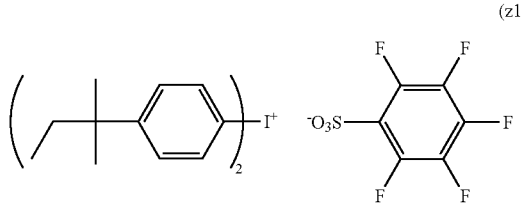 (z19)
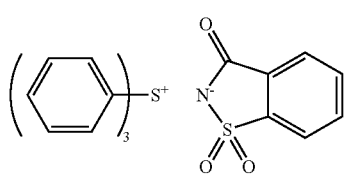 (z20)
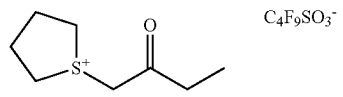 (z21)
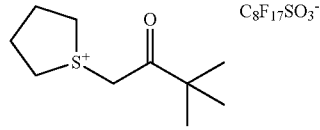 (z22)
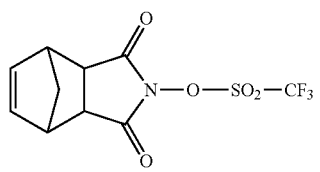 (z23)
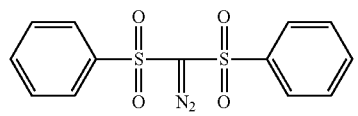 (z24)
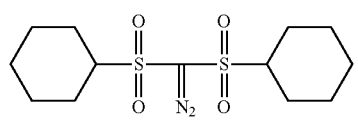 (z25)
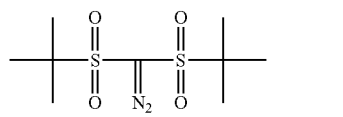 (z26)
-continued
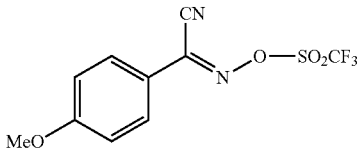 (z27)
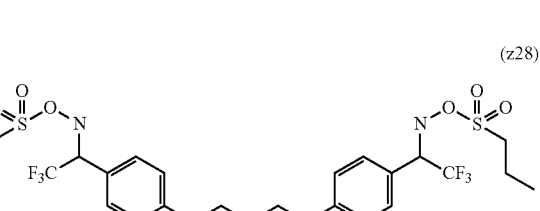 (z28)
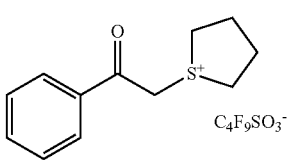 (z29)
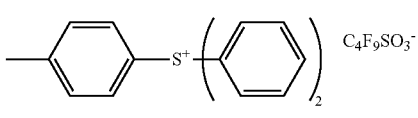 (z30)
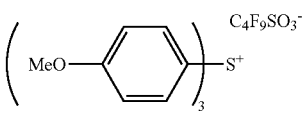 (z31)
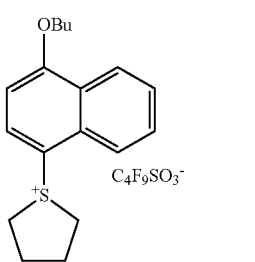 (z32)
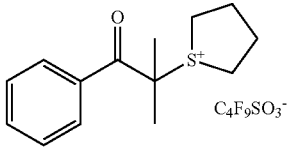 (z33)
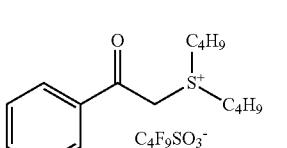 (z34)
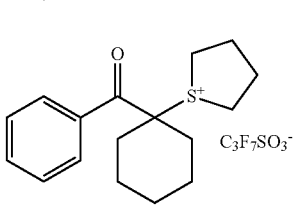 (z35)

(z36) 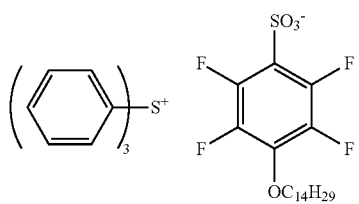
(z37) 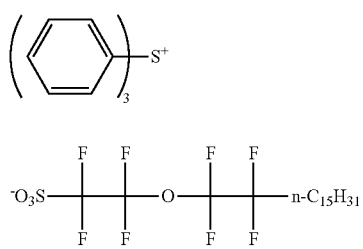
(z38) 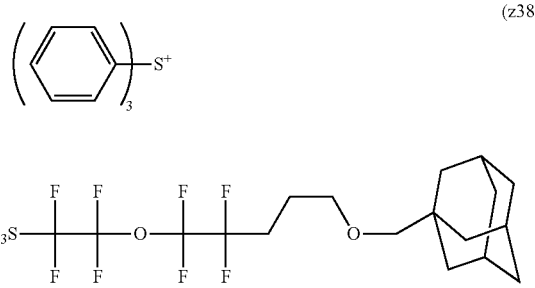
(z39) 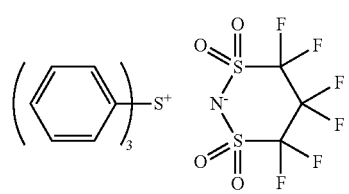
(z40) 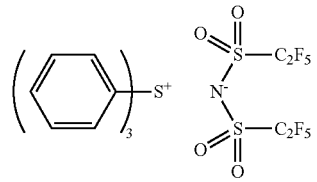
(z41) 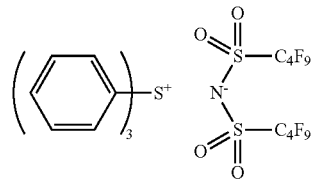
(z42) 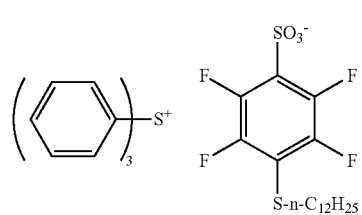
(z43) 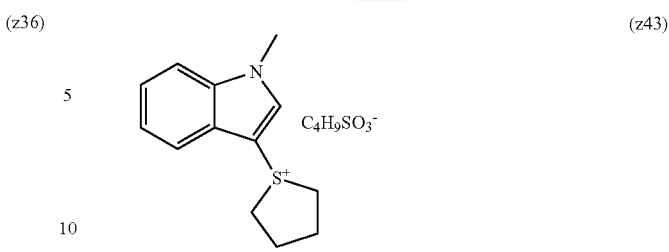
(z44) 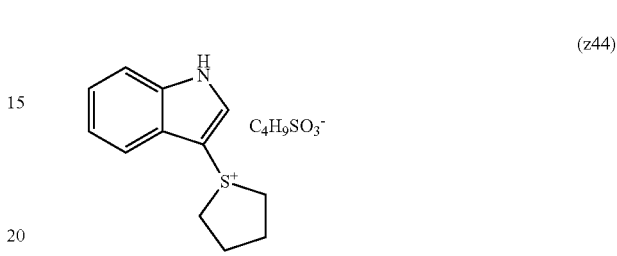
(z45) 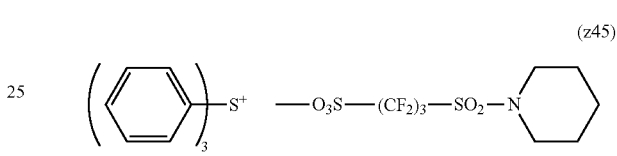
(z46) 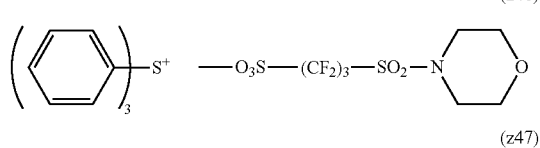
(z47) 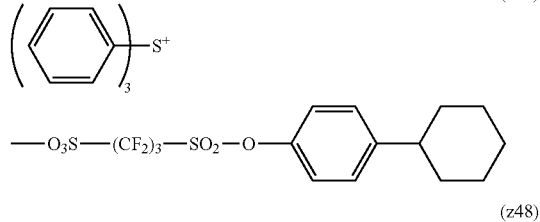
(z48) 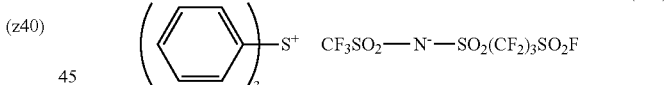
(z49) 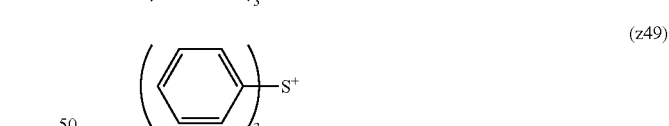
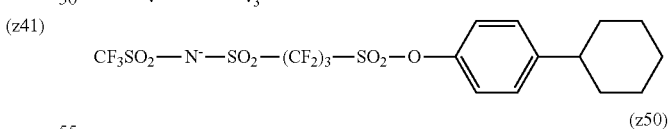
(z50) 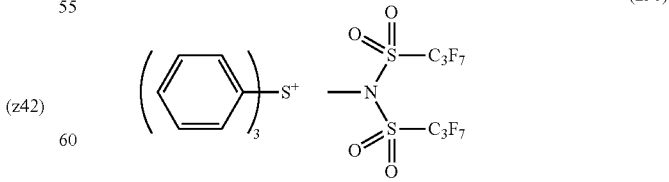
(z51) 

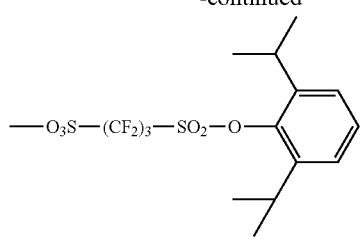
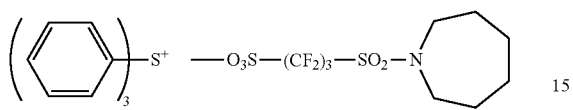 (z52)
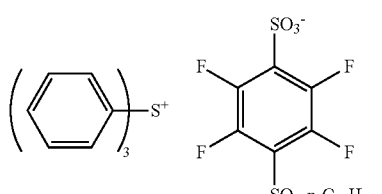 (z53)
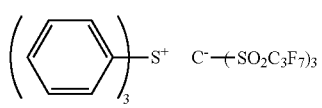 (z54)
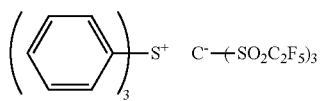 (z55)
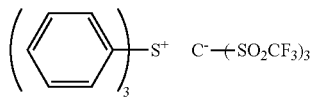 (z56)
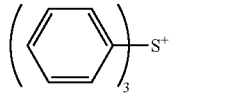 (z57)
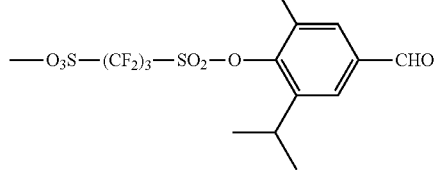
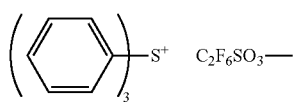 (z58)
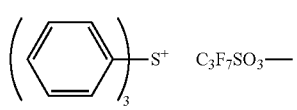 (z59)
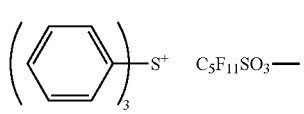 (z60)
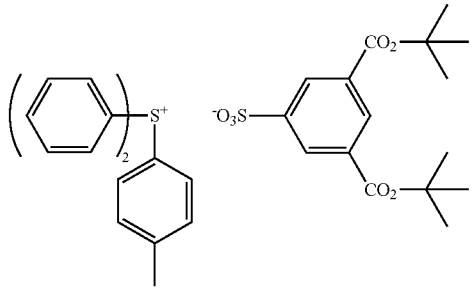 (z61)
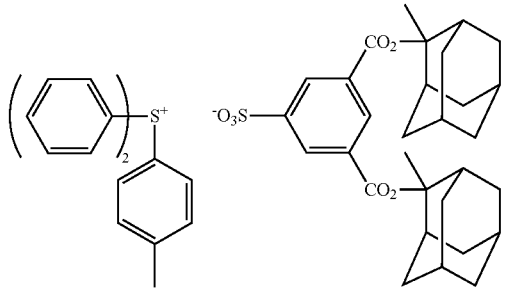 (z62)
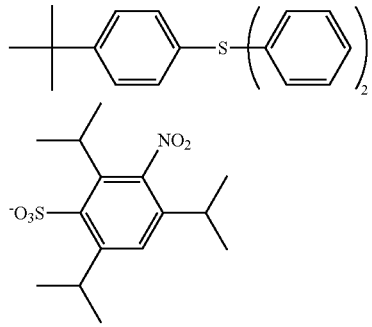 (z63)
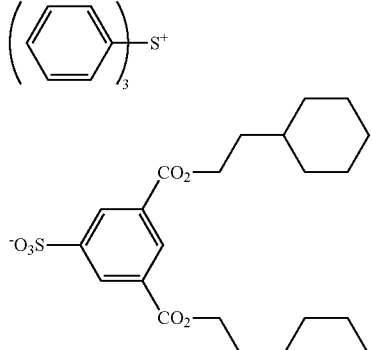 (z64)
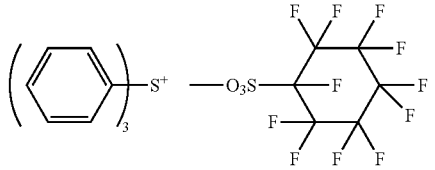 (z65)
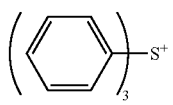 (z66)

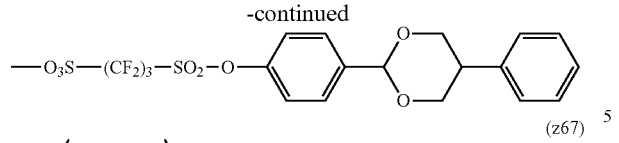
(z67)
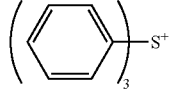
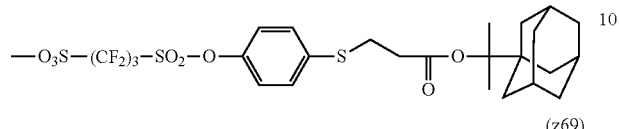
(z69)
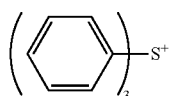
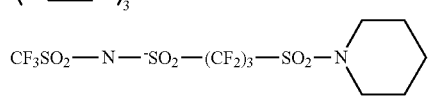
(z70)
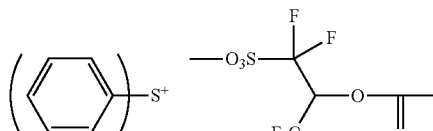
(z71)
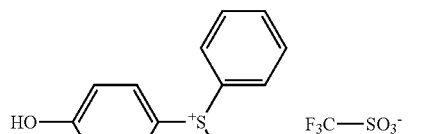
(z72)
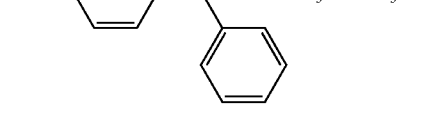
(z73)
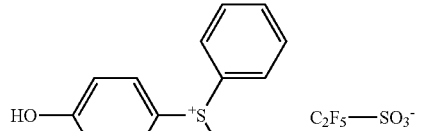
(z74)
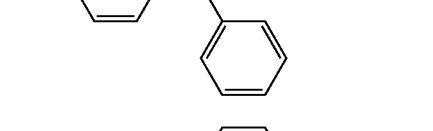
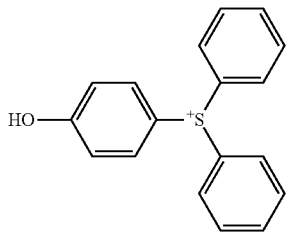  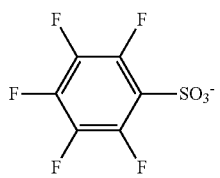
(z75)
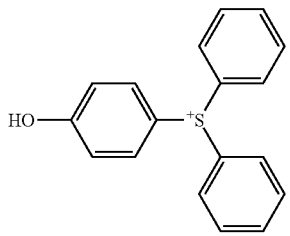  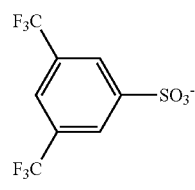
(z76)
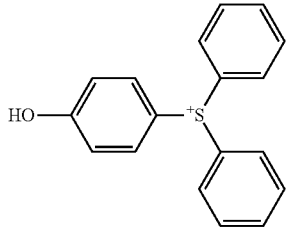  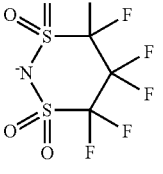
(z77)
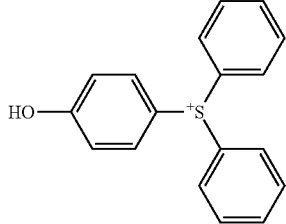  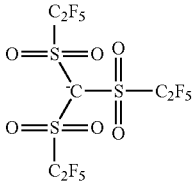
(z78)
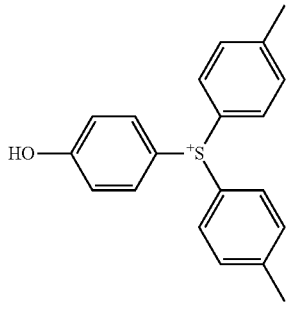  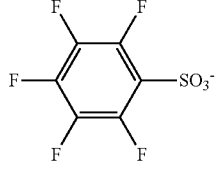
(z79)

(z80)
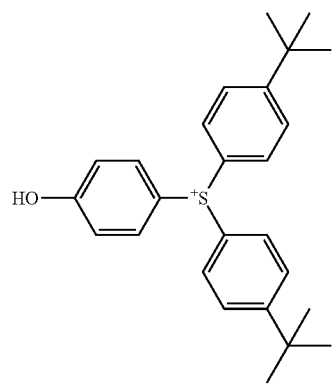
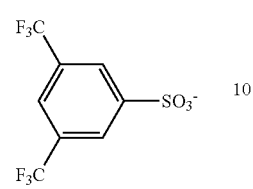
(z81)
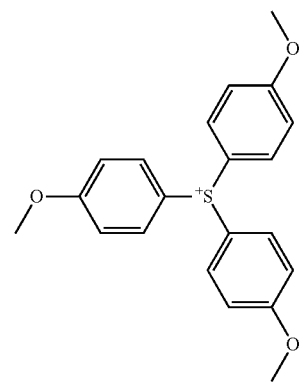
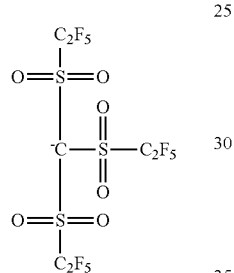
(z82)
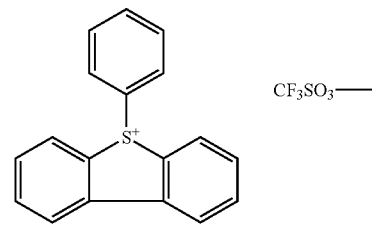
(z83)
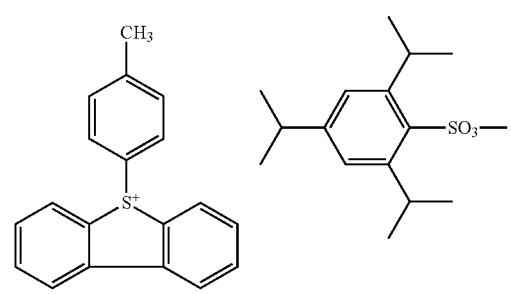
(z84)
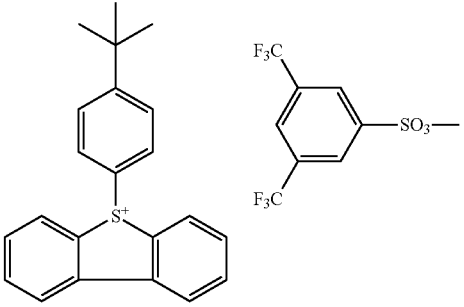
(z85)
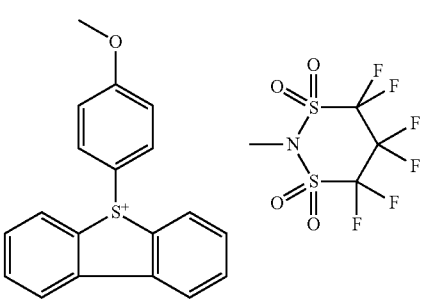
(z86)
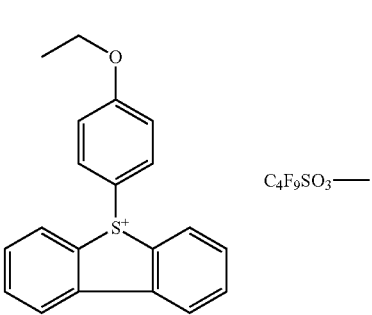
(z87)
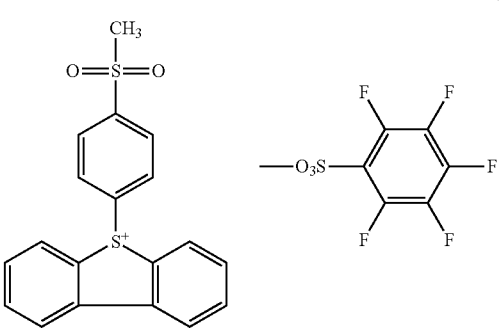
(z88)
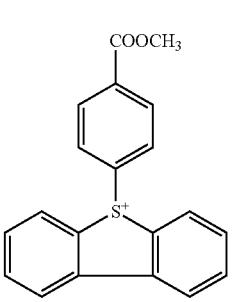
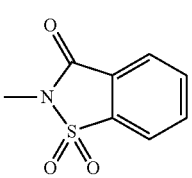

-continued
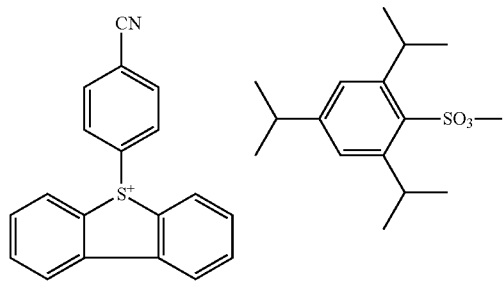(z89)
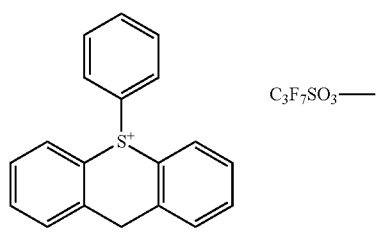(z90)
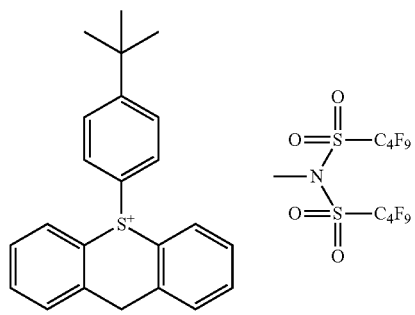(z91)
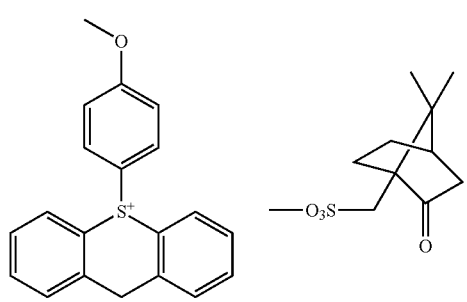(z92)
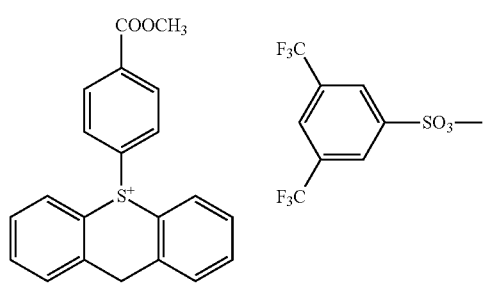(z93)
-continued
(z94)
(z95)
(z96)
(z97)
(z98)

-continued
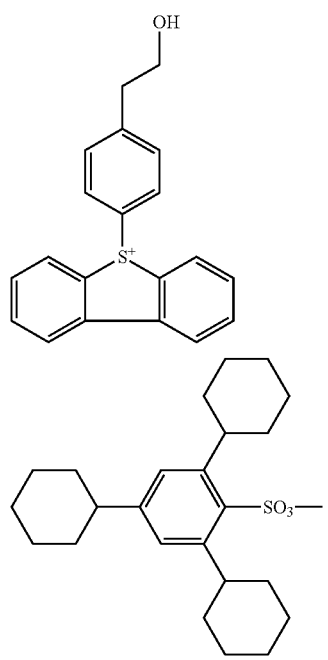
(z99)
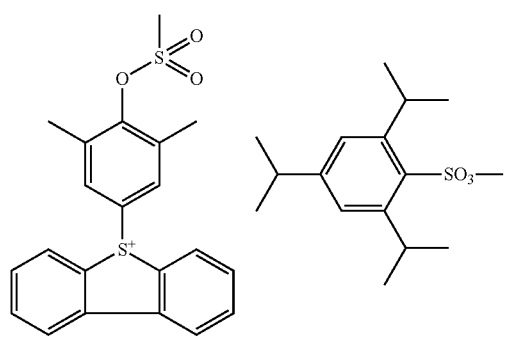
(z100)
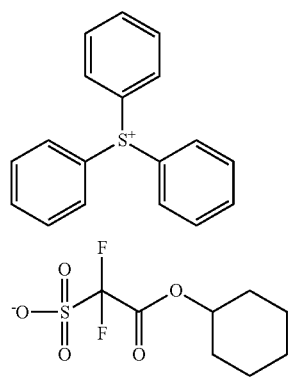
(z101)
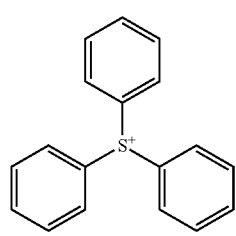
(z102)
-continued
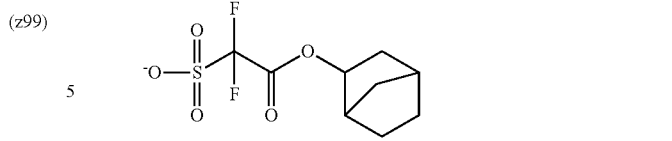
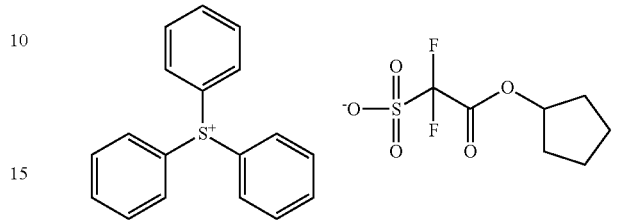
(z103)
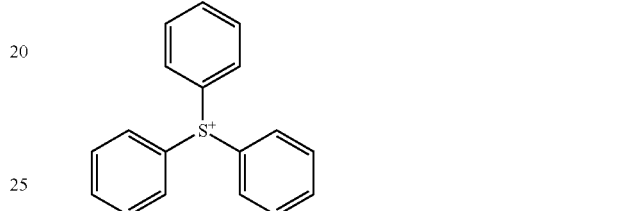
(z104)
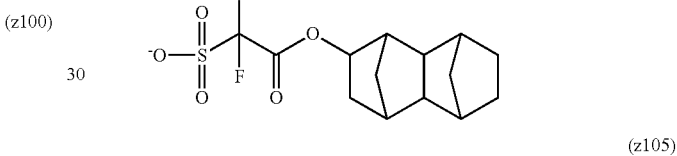
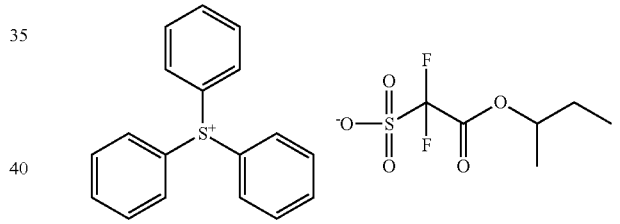
(z105)
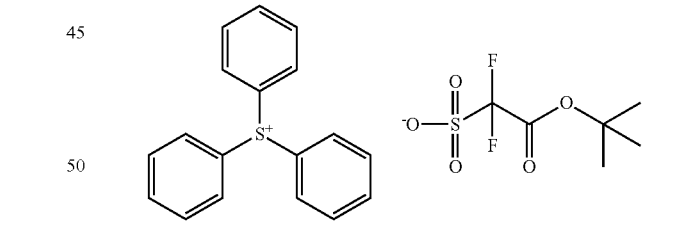
(z106)
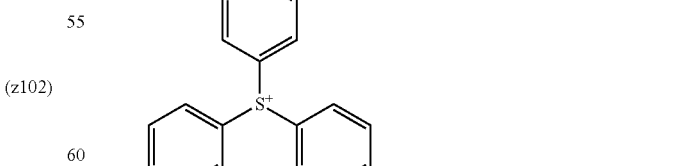
(z107)
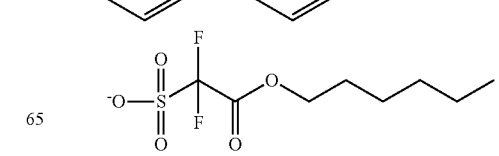

(z108)

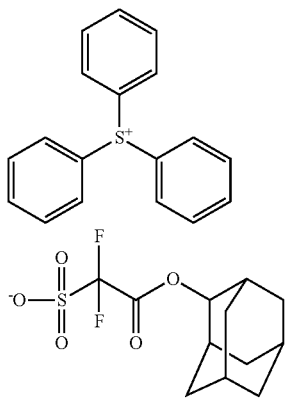

(z109)

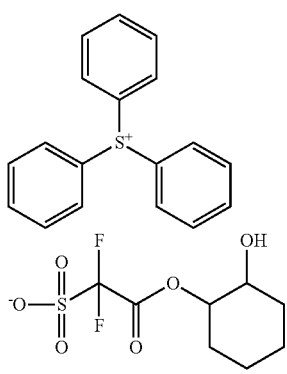

(z110)

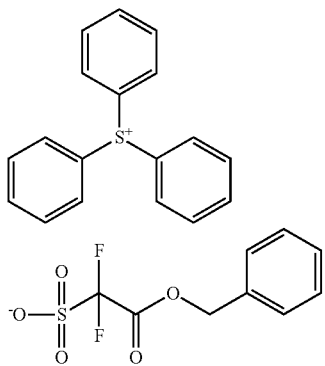

(z111)

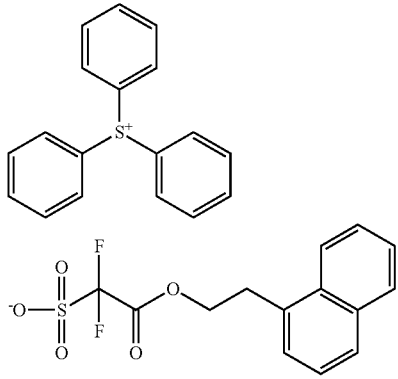

One kind of acid generator may be used alone, or two or more kinds may be used in combination.

The content of the acid generator in the composition is preferably 0.1 to 30% by mass based on all the solids content in the composition, more preferably 0.5 to 20% by mass, and still more preferably 1 to 15% by mass.

[3] (C) Resist Solvents (Coating Solvents)

The solvents usable in preparing the composition are not especially restricted so long as they are capable of dissolving the components, for example, alkylene glycol monoalkyl ether carboxylate (propylene glycol monomethyl ether acetate (PGMEA, another name: 1-methoxy-2-acetoxypropane), etc.), alkylene glycol monoalkyl ether (propylene glycol monomethyl ether (PGME, 1-methoxy-2-propanol), etc.), alkyl lactate (ethyl lactate, methyl lactate, etc.), cyclic lactone (γ-butyrolactone, etc., preferably having 4 to 10 carbon atoms), chain or cyclic ketone (2-heptanone, cyclohexanone, etc., preferably having 4 to 10 carbon atoms), alkylene carbonate (ethylene carbonate, propylene carbonate, etc.), alkyl carboxylate (alkyl acetate such as butyl acetate is preferred), and alkyl alkoxyacetate (ethyl ethoxypropionate) are exemplified. As other usable solvents, the solvents disclosed in U.S. Patent Application 2008/0248425A1, paragraphs from [0244] downward are exemplified.

Of the above solvents, alkylene glycol monoalkyl ether carboxylate and alkylene glycol monoalkyl ether are preferred.

One kind of these solvents may be used alone, or two or more kinds may be mixed. When two or more kinds are mixed, it is preferred to mix a solvent having a hydroxyl group and a solvent not having a hydroxyl group. The mass ratio of the solvent having a hydroxyl group and the solvent not having a hydroxyl group is 1/99 to 99/1, preferably 10/90 to 90/10, and more preferably 20/80 to 60/40.

As the solvent having a hydroxyl group, alkylene glycol monoalkyl ether is preferred, and as the solvent not having a hydroxyl group, alkylene glycol monoalkyl ether carboxylate is preferred.

[4] Basic Compounds

It is preferred that the actinic ray-sensitive or radiation-sensitive resin composition in the invention contains a basic compound.

The basic compound is preferably a nitrogen-containing organic basic compound.

Usable compounds are not especially limited and, for example, compounds classified into the following (1) to (4) are preferably used.

(1) Compound Represented by the Following Formula (BS-1)

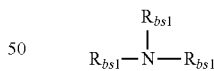

(BS-1)

In formula (BS-1), each of $R_{bs1}$ independently represents any of a hydrogen atom, an alkyl group (straight chain or branched), a cycloalkyl group (monocyclic or polycyclic), an aryl group, and an aralkyl group. However, not all three $R_{bs1}$ represent a hydrogen atom.

The carbon atom number of the alkyl group represented by $R_{bs1}$ is not especially restricted and is generally 1 to 20, and preferably 1 to 12.

The carbon atom number of the cycloalkyl group represented by $R_{bs1}$ is not especially restricted and is generally 3 to 20, and preferably 5 to 15.

The carbon atom number of the aryl group represented by $R_{bs1}$ is not especially restricted and is generally 6 to 20, and preferably 6 to 10. Specifically a phenyl group and a naphthyl group are exemplified.

The carbon atom number of the aralkyl group represented by $R_{bs1}$ is not especially restricted and is generally 7 to 20, and preferably 7 to 11. Specifically a benzyl group is exemplified.

The hydrogen atom of each of the alkyl group, cycloalkyl group, aryl group or aralkyl group represented by $R_{bs1}$ may be substituted with a substituent. As the substituents, an alkyl group, a cycloalkyl group, an aryl group, an aralkyl group, a hydroxyl group, a carboxyl group, an alkoxy group, an aryloxy group, an alkylcarbonyloxy group, and an alkylcarbonyl group are exemplified.

In the compound represented by formula (BS-1), it is preferred that one alone of three $R_{bs1}$ represents a hydrogen atom, and it is more preferred that none of $R_{bs1}$ represent a hydrogen atom.

As the specific examples of the compound represented by formula (BS-1), tri-n-butylamine, tri-n-pentylamine, tri-n-octylamine, tri-n-decylamine, triisodecyl-amine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, and N,N-dihexylaniline are exemplified.

Further, in formula (BS-1), a compound in which at least one $R_{bs1}$ is an alkyl group substituted with a hydroxyl group is exemplified as a preferred embodiment. As the specific compounds, triethanolamine and N,N-dihydroxyethylaniline are exemplified.

Further, the alkyl group represented by $R_{bs1}$ may have an oxygen atom in the alkyl chain to form an oxyalkylene chain. As the oxyalkylene chain, —$CH_2CH_2O$— is preferred. As the specific examples, tris(methoxyethoxyethyl)amine and the compounds disclosed in U.S. Pat. No. 6,040,112, column 3, line 60 and after, are exemplified.

(2) Compound Having a Nitrogen-Containing Heterocyclic Structure

As the heterocyclic structure, the compound may not have an aromatic property. Further, a plurality of nitrogen atoms may be contained, and hetero atoms other than nitrogen atom may be contained. Specifically, a compound having an imidazole structure, (2-phenylbenzimidazole, 2,4,5-triphenylimidazole), a compound having a piperidine structure (N-hydroxyethylpiperidine, bis(1,2,2,6,6-pentamethyl-4-piperidyl)sebacate), a compound having a pyridine structure (4-dimethylamino-pyridine), a compound having an antipyrine structure (antipyrine, hydroxyantipyrine) are exemplified.

A compound having two or more cyclic structures is also preferably used. Specifically, 1,5-diazabicyclo[4.3.0]non-5-ene, 1,8-diazabicyclo[5.4.0]undeca-7-ene are exemplified.

(3) Amine Compound Having a Phenoxy Group

An amine compound having a phenoxy group is a compound having a phenoxy group at the terminal on the opposite side to the nitrogen atom of the alkyl group of an amine compound. The phenoxy group may have a substituent, e.g., an alkyl group, an alkoxy group, a halogen atom, a cyano group, a nitro group, a carboxyl group, a carboxylic acid ester group, a sulfonic acid ester group, an aryl group, an aralkyl group, an acyloxy group, or an aryloxy group.

More preferably, the compound is a compound having at least one alkyleneoxy chain between the phenoxy group and the nitrogen atom. The number of alkyleneoxy chains in one molecule is preferably 3 to 9, and more preferably 4 to 6. Of alkyleneoxy chains, —$CH_2CH_2O$— is preferred.

As the specific examples, 2-{2-[2-(2,2-dimethoxyphenoxyethoxy)ethyl]-bis-(2-methoxyethyl)}amine, and Compounds (C1-1) to (C1-3) disclosed in U.S. Patent Application 2007/0224539A1, paragraph [0066] are exemplified.

(4) Ammonium Salt

Ammonium salts are also arbitrarily used. Preferred compound is hydroxide or carboxylate. More specifically, tetraalkylammonium hydroxide represented by tetrabutylammonium hydroxide is preferred. Besides the above, ammonium salts derived from the amines in the above (1) to (3) can be used.

As other basic compounds, the compounds synthesized in JP-A-2002-363146 and the compounds disclosed in JP-A-2007-298569, paragraph [0108] can also be used.

Basic compounds are used alone or in combination of two or more.

The use amount of basic compound is generally 0.001 to 10% by mass based on the solid content of the composition, and preferably 0.01 to 5% by mass.

The molar ratio of acid generator/basic compound is preferably 2.5 to 300. That is, the molar ratio of 2.5 or more is preferred from the point of sensitivity and resolution, and 300 or less is preferred from the point of inhibition of the reduction of resolution by the thickening of the pattern in aging after exposure until heat treatment. The molar ratio is more preferably 5.0 to 200 and still more preferably 7.0 to 150.

[5] Surfactants

The composition in the invention may or may not further contain a surfactant. In the case of containing a surfactant, the surfactant is preferably a fluorine/silicon surfactant.

As such surfactants, MEGAFAC F176, MEGAFAC R08 (manufactured by Dainippon Ink and Chemicals Inc.), PF656, PF6320 (manufactured by OMNOVA Solution Inc.), Troy Sol S-366 (manufactured by Troy Chemical Co., Ltd.), Fluorad FC430 (manufactured by Sumitomo 3M Limited), and polysiloxane polymer KP-341 (manufactured by Shin-Etsu Chemical Co., Ltd.) are exemplified.

It is also possible to use surfactants other than fluorine/silicon surfactants. More specifically, polyoxyethylene alkyl ethers and polyoxyethylene alkylaryl ethers are exemplified.

Well-known surfactants other than the above can also be arbitrarily used. As usable surfactants, for example, the surfactants disclosed in U.S. Patent Application 2008/0248425A1, paragraphs from [0273] downward are exemplified.

One kind of surfactant may be used alone, or two or more kinds may be used in combination.

The use amount of surfactant is preferably 0.0001 to 2% by mass based on all the solids content of the composition, and more preferably 0.001 to 1% by mass.

[6] Other Additives

Other than the above-described components, the composition of the invention can arbitrarily contain a carboxylic acid, a carboxylic acid onium salt, dissolution inhibiting compounds having a molecular weight of 3,000 or less as described in Proceeding of SPIE, 2724, 355 (1996), etc., a dye, a plasticizer, a photo-sensitizer, a photo-absorber, and an antioxidant. In particular, a carboxylic acid is preferably used for the improvement of performances. As the carboxylic acid, aromatic carboxylic acids such as a benzoic acid and naphthoic acid are preferred.

The content of the carboxylic acid is preferably 0.01 to 10% by mass in all the solid content concentration of the composition, more preferably 0.01 to 5% by mass, and still more preferably 0.01 to 3% by mass.

[Uses]

The pattern-forming method of the invention is preferably used in the formation of semiconductor fine circuit such as the manufacture of super LSI and high capacity microchips. At the time of forming a semiconductor fine circuit, a resist film formed with a pattern is subjected to circuit formation and etching, and then the residual resist film part is finally removed with a solvent, so that the resist film resulting from the actinic ray-sensitive or radiation-sensitive resin composition of the invention does not remain on the final product such as microchips unlike what is called a permanent resist for use in a print substrate and the like.

EXAMPLES

The invention will be further specifically explained with reference to examples but the invention is not restricted to these examples.

Synthesis Example 1

Synthesis of Resin (A1-1)

In nitrogen current, 20 g of cyclohexanone is put in a three-neck flask and heated at 80° C. (solvent 1). M-1, M-2, M-3 and M-4 shown below are dissolved in cyclohexanone at a molar rate of 40/10/40/10 to prepare a monomer solution (200 g) of 22% by mass. Further, a solution obtained by adding 6 mol % of initiator V-601 (manufactured by Wako Pure Chemical Industries) to the monomer and dissolving is dripped into solvent 1 over 6 hours. After termination of dripping, the reaction solution is further reacted at 80° C. for 2 hours. The reaction solution is allowed to be cooled, and then poured into a mixed solution comprising 1,400 ml of hexane and 600 ml of ethyl acetate. The powder precipitated is collected by filtration and dried to obtain 37 g of resin (A1-1). From GPC, weight average molecular weight (Mw: polystyrene-equivalent) of resin (A1-1) is 10,000, and polydispersity (Mw/Mn) is 1.6.

M-1
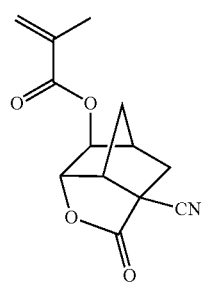

M-2
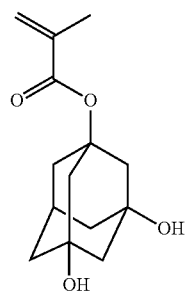

M-3
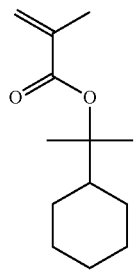

M-4
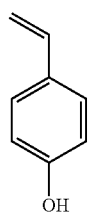

(A1-1)
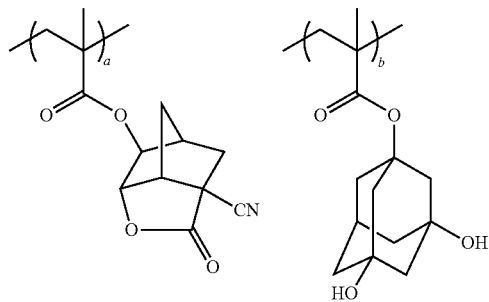

a/b/c/d = 40/10/40/10 mol %
Mw = 10000, Mw/Mn = 1.60

Resins (A1-2) to (A1-8) are synthesized in the similar method.

(A1-2)
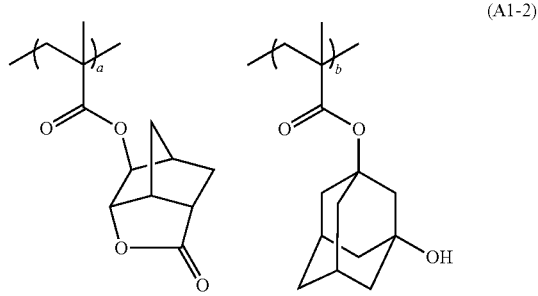

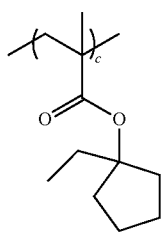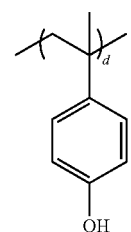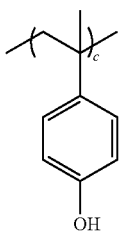
a/b/c/d = 45/10/40/5 mol %
Mw = 11000, Mw/Mn = 1.85
a/b/c = 50/30/20 mol %
Mw = 19700
Mw/Mn = 1.81
(A1-3)
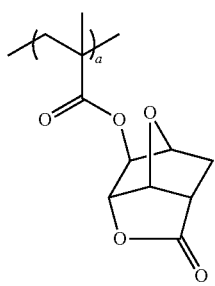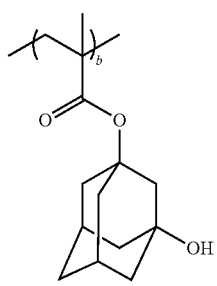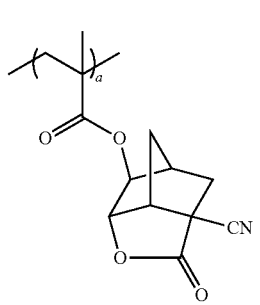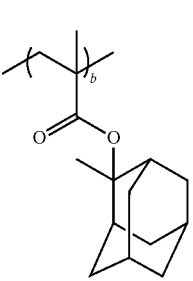
(A1-6)
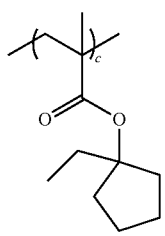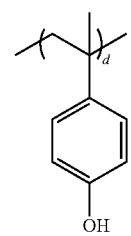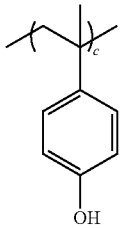
a/b/c/d = 35/5/45/15 mol %
Mw = 7000, Mw/Mn = 1.55
a/b/c = 50/25/25 mol %
Mw = 13700
Mw/Mn = 1.96
(A1-4)
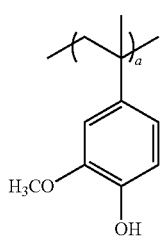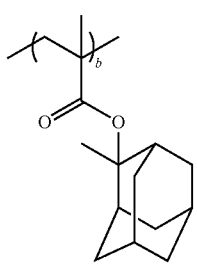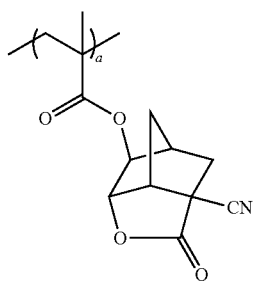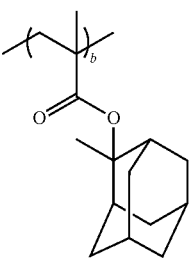
(A1-7)
a/b = 50/50 mol %
Mw = 5500, Mw/Mn = 1.41
(A1-5)
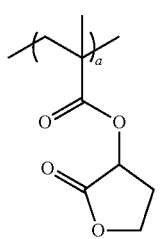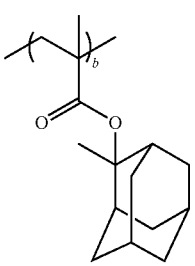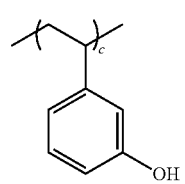
a/b/c = 46/25/29 mol %
Mw = 19700
Mw/Mn = 1.81

-continued

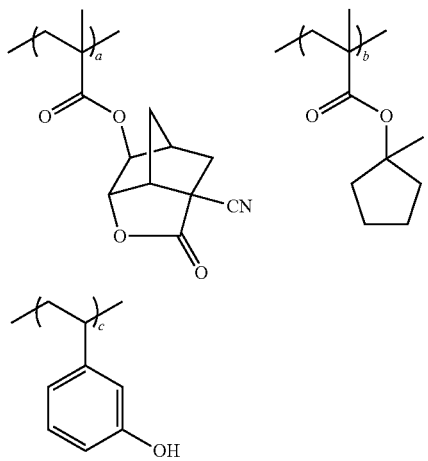

a/b/c = 31/35/34 mol %
Mw = 24700
Mw/Mn = 1.42

Synthesis Example 2

Synthesis of Resin (A2-1)

In nitrogen current, 4.66 parts by mass of 1-methoxy-2-propanol is heated at 80° C. A mixed solution comprising 7.0 parts by mass of 4-hydroxystyrene, 3.0 parts by mass of monomer (M-5), 18.6 parts by mass of 1-methoxy-2-propanol, and 1.36 parts by mass of dimethyl-2,2'-azobisisobutyrate (V-601, manufactured by Wako Pure Chemical Industries) is dripped into the above liquid over two hours while stirring the liquid. After termination of dripping, the reaction solution is stirred at 80° C. for further 4 hours. The reaction solution is allowed to be cooled, and then the reaction product is re-precipitated with a large amount of hexane/ethyl acetate and vacuum dried to obtain 5.9 parts by mass of resin (A2-1) of the invention.

From GPC, weight average molecular weight (Mw: polystyrene-equivalent) of resin (A2-1) is Mw=15,100, and polydispersity (Mw/Mn) is 1.40.

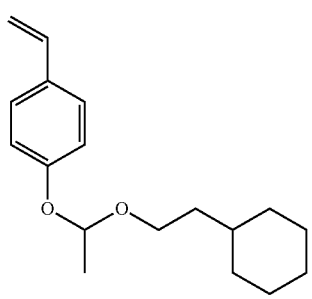

M-5

-continued

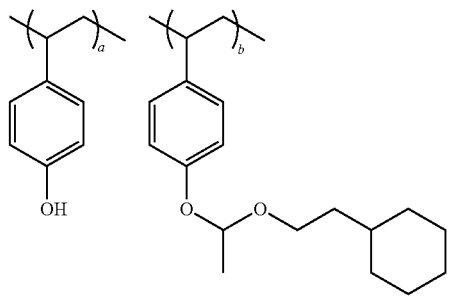

a/b = 70/30 mol %
Mw = 15100, Mw/Mn = 1.40

Resins (A2-2) to (A2-6) are synthesized in the similar method.

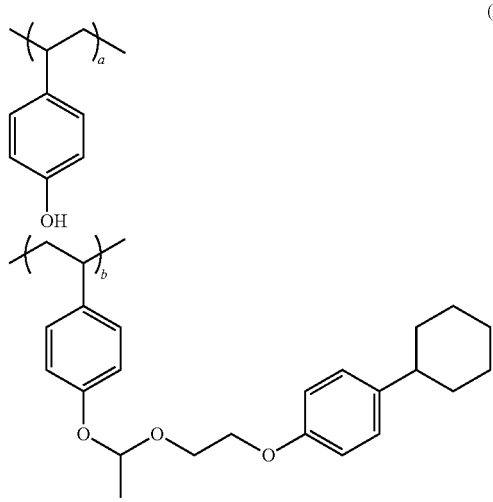

a/b = 82/18 mol %
Mw = 8000, Mw/Mn = 1.50

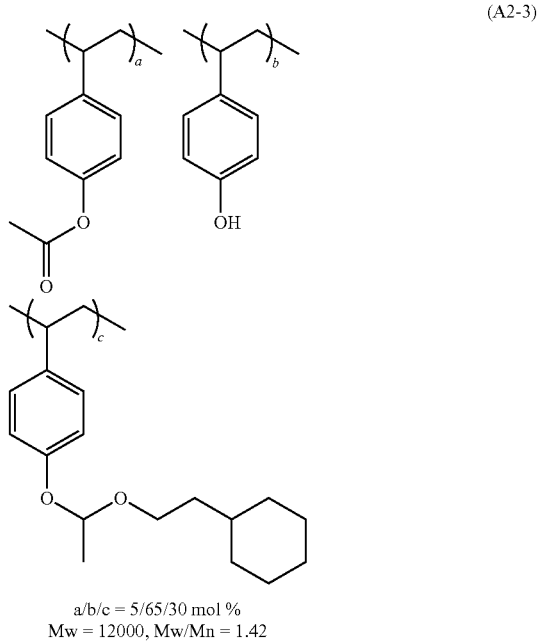

a/b/c = 5/65/30 mol %
Mw = 12000, Mw/Mn = 1.42

-continued (A2-4)

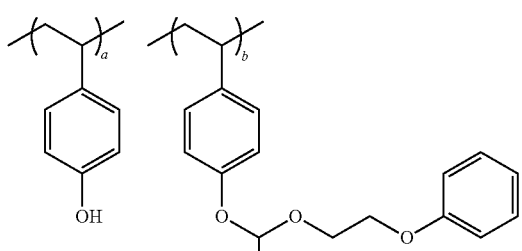

a/b = 50/50 mol %
Mw = 8000, Mw/Mn = 1.22

(A2-5)

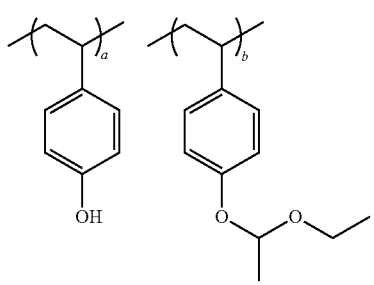

a/b = 55/45 mol %
Mw = 12700
Mw/Mn = 1.10

(A2-6)

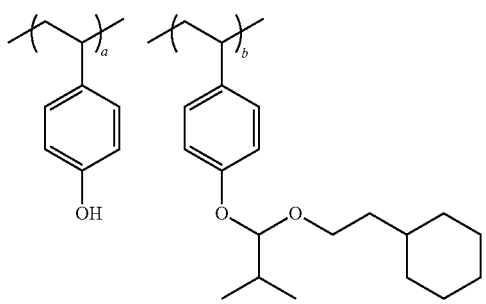

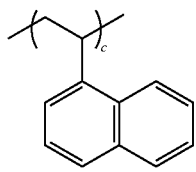

a/b/c = 70/25/5 mol %
Mw = 4300
Mw/Mn = 1.20

2.1 EB Exposure

Examples 1 to 18

(1) Preparation of Coating Solutions of Actinic Ray-Sensitive or Radiation-Sensitive Resin Compositions, and Application Thereof The solution of the actinic ray-sensitive or radiation-sensitive resin composition is obtained by precisely filtering the coating solution composition having the composition shown in Table 1 through a membrane filter having a pore size of 0.1 μm. In Table 1, the ratio in the case of using two or more components is a mass ratio.

The solution of the actinic ray-sensitive or radiation-sensitive resin composition is applied on a 6-inch Si wafer having been subjected to HMDS treatment in advance with a spin coater Mark 8 (manufactured by Tokyo Electron Limited), dried on a hot plate at 100° C. for 60 seconds, and a resist film having a thickness of 0.08 μm is obtained.

(2) Evaluation of EB Exposure

Pattern irradiation is performed on the resist film obtained in the above (1) with an electron beam imaging apparatus (HL750, accelerating voltage: 50 KeV, manufactured by Hitachi Ltd.). In the irradiation, the drawing is performed in a manner that an imaged part by electron beam and a non-imaged part are alternately repeated by a width of 10 μm. After irradiation, the resist film is heated at 105° C. for 60 seconds on a hot plate.

Subsequently, the resist film is subjected to spray development with an organic solvent for 30 seconds, and then dried at high speed revolution of 2,000 rpm for 20 seconds.

When solvent is specified in the item of rinsing liquid in the table, after performing spray development with an organic solvent for 30 seconds, rinsing is further carried out for 30 seconds with the specified organic solvent while revolving the wafer at 1,500 rpm, and after that the wafer is dried at high speed revolution of 2,000 rpm for 20 seconds.

Comparative Example 1

The solution of the actinic ray-sensitive or radiation-sensitive resin composition is prepared and pattern formation is conducted in the same manner as in Example 1 except for changing the composition and rinsing liquid as shown in Table 1 and performing development with the alkali aqueous solution (TMAH, tetramethyl ammonium hydroxide aqueous solution (2.38% by mass).

Comparative Example 2

Pattern formation is performed in the same manner as in Example 1 except for changing to the composition using polymethyl methacrylate (PMMA) as the resin of component (A) and the rinsing liquid as shown in Table 1.

Sensitivity, resolution and pattern form of the obtained pattern are evaluated by the following methods. The results of evaluations are shown in the following table.

(2-1) Sensitivity (Eo)

The obtained pattern is observed with a scanning electron microscope (S-9220, manufactured by Hitachi Limited). Irradiation quantity of electron beam for resolving a 0.10 μm line pattern (line and space: 1/1) is taken as sensitivity (Eo).

(2-2) Resolution

Limiting resolution at the irradiation dose showing the above sensitivity (the minimum line width capable of separation resolving the line and space) is taken as resolution.

(2-3) Pattern Form

The sectional form of a line pattern having a line width of 0.10 μm (line and space: 1/1) at the irradiation dose showing the above sensitivity is observed with a scanning electron microscope (S-4800, manufactured by Hitachi Limited).

TABLE 1

| Ex. No. | Resin (A) | Acid Generator (B) | Solvent (40 g) (mass ratio) | Basic Cpd. | Surfactant (5 mg) | Developer (mass ratio) | Rinsing Liquid | Sensitivity (μC/cm²) | Resolution (μm) | Pattern Form |
|---|---|---|---|---|---|---|---|---|---|---|
| Ex. 1 | A1-1 (0.938 g) | z2 (0.060 g) | S-1 | D-1 (1 mg) | W-1 | S-5 | S-8 | 15.0 | 0.0375 | Rectangle |
| Ex. 2 | A1-2 (0.845 g) | z108 (0.150 g) | S-1/S-2 (80/20) | D-1 (2 mg) | W-2 | S-5 | S-10 | 18.0 | 0.0375 | Rectangle |
| Ex. 3 | A1-3 (0.917 g) | z10 (0.05 g) | S-1/S-2 (60/40) | D-4 (3 mg) | W-3 | S-5 | S-8 | 28.0 | 0.0625 | Rectangle |
| Ex. 4 | A2-1 (0.911 g) | z4 (0.080 g) | S-1 | D-1 (9 mg) | W-4 | S-7 | S-10 | 9.0 | 0.050 | Rectangle |
| Ex. 5 | A2-2 (0.750 g) | z99 (0.230 g) | S-1/S-2 (30/70) | D-3 (20 mg) | W-1 | S-7 | S-12 | 9.0 | 0.0625 | Rectangle |
| Ex. 6 | A2-3 (0.870 g) | z5 (0.120 g) | S-1 | D-2 (10 mg) | W-2 | S-7 | — | 13.0 | 0.0625 | Rectangle |
| Ex. 7 | A1-1 (0.855 g) | z45 (0.140 g) | S-1/S-4 (80/20) | D-1 (1 mg) | W-3 | S-6 | S-9 | 14.0 | 0.0375 | Rectangle |
| Ex. 8 | A1-2 (0.948 g) | z18 (0.050 g) | S-1/S-4 (60/40) | D-1 (2 mg) | W-4 | S-5 | S-11 | 19.0 | 0.050 | Rectangle |
| Ex. 9 | A1-3 (0.860 g) | z39 (0.130 g) | S-1/S-2 (70/30) | D-3 (3 mg) | W-1 | S-5/S-6 (80/20) | — | 27.0 | 0.0625 | Rectangle |
| Ex. 10 | A1-4 (0.875 g) | z19 (0.100 g) | S-1 | D-3 (25 mg) | W-1 | S-5 | — | 50.0 | 0.075 | Round top |
| Ex. 11 | A2-4 (0.872 g) | z10 (0.120 g) | S-1 | D-2 (8 mg) | W-1 | S-5 | — | 22.0 | 0.075 | Round top |
| Ex. 12 | A1-1 (0.938 g) | z2 (0.060 g) | S-1 | D-1 (1 mg) | W-1 | S-13 | S-8 | 15.0 | 0.050 | Rectangle |
| Ex. 13 | A1-5 (0.938 g) | z2 (0.060 g) | S-1 | D-1 (2 mg) | W-1 | S-5 | S-9 | 25.0 | 0.075 | Rectangle |
| Ex. 14 | A1-6 (0.938 g) | z2 (0.060 g) | S-1 | D-2 (2.5 mg) | W-2 | S-6 | S-11 | 28.0 | 0.075 | Rectangle |
| Ex. 15 | A1-7 (0.938 g) | z10 (0.05 g) | S-1/S-2 (60/40) | D-4 (3 mg) | W-3 | S-5 | S-8 | 29.5 | 0.075 | Rectangle |
| Ex. 16 | A1-8 (0.938 g) | z10 (0.05 g) | S-1/S-2 (60/40) | D-3 (5 mg) | W-4 | S-5 | S-10 | 40.0 | 0.075 | Rectangle |
| Ex. 17 | A2-5 (0.870 g) | z5 (0.120 g) | S-1 | D-1 (10 mg) | W-1 | S-14 | S-10 | 14.5 | 0.050 | Rectangle |
| Ex. 18 | A2-6 (0.870 g) | z5 (0.120 g) | S-1 | D-4 (10 mg) | W-2 | S-7 | — | 12.0 | 0.050 | Rectangle |
| Comp. Ex. 1 | A1-3 (0.942 g) | z1 (0.050 g) | S-1 | D-3 (12 mg) | W-1 | TMAH | Pure water | 100 | 0.150 | Round top |
| Comp. Ex. 2 | PMMA (1.0 g) | — | S-3 | — | W-1 | S-5 | S-10 | 100 | 0.050 | Rectangle |

The abbreviations in the table are those of the specific examples or show the following compounds.

<Resin (A)>

PMMA: Polymethyl methacrylate, Mw = 300,000, Mw/Mn = 1.8

<Organic basic compound>

D-1: Tetra-(n-butyl)ammonium hydroxide
D-2: 1,8-Diazabicyclo[5.4.0]-7-undecene
D-3: 2,4,5-Triphenylimidazole
D-4: Tridecylamine <Surfactant>

W-1: Megafac F176 (fluorine surfactant, manufactured by Dainippon Ink and Chemicals Inc.)
W-2: Megafac R08 (fluorine/silicon surfactant, manufactured by Dainippon Ink and Chemicals Inc.)
W-3: Polysiloxane polymer KP-341 (silicon surfactant, manufactured by Shin-Etsu Chemical Co., Ltd.)
W-4: PF6320 (fluorine surfactant, manufactured by OMNOVA)

<Coating solvent>

S-1: Propylene glycol monomethyl ether acetate (PGMEA)
S-2: Propylene glycol monoethyl ether
S-3: Tetrahydrofuran
S-4: Cyclohexanone <Developer, rinsing liquid>

S-5: Butyl acetate
S-6: Pentyl acetate
S-7: Anisole
S-8: 1-Hexanol
S-9: 4-Methyl-2-pentanol
S-10: Decane
S-11: Octane
S-12: Ethylbenzene
S-13: Propylene glycol monomethyl ether acetate (PGMEA)
S-14: Ethoxybenzene
TMAH: Tetramethylammonium hydroxide 2.3% by mass aqueous solution
2.2 EUV exposure S-7: Anisole Examples 19 to 36

(3) Preparation of Coating Solutions of Actinic Ray-Sensitive or Radiation-Sensitive Resin Compositions, and Application Thereof A solution of the actinic ray-sensitive or radiation-sensitive resin composition is obtained by precisely filtering the coating solution composition shown in Table 2 through a membrane filter having a pore size of 0.05 μm.

The solution of the actinic ray-sensitive or radiation-sensitive resin composition is applied on a 6-inch Si wafer having been subjected to HMDS treatment in advance with a spin coater Mark 8 (manufactured by Tokyo Electron Limited), dried on a hot plate at 120° C. for 90 seconds, and a resist film having a thickness of 0.08 μm is obtained.

The obtained resist film is evaluated by the following methods. The results of evaluations are shown in Table 2 below.

The abbreviations are the same as those described above. The ratio in the case of using two or more kinds of components is shown as mass ratio.

Comparative Example 3

Preparation of the solution of the actinic ray-sensitive or radiation-sensitive resin composition and resist film formation are conducted in the same manner as in Example 1 except for changing the composition and rinsing liquid as shown in Table 2 and performing development with the alkali aqueous solution (TMAH, tetramethyl ammonium hydroxide aqueous solution (2.38% by mass), and the following exposure evaluation is performed.

Comparative Example 4

Preparation of the solution of the actinic ray-sensitive or radiation-sensitive resin composition and resist film formation are performed in the same manner as in Example 1 except for changing to the composition using polymethyl methacrylate (PMMA) as the resin of component (A) and the rinsing liquid as shown in Table 2, and the following exposure evaluation is performed.

(4) Evaluation of EUV Exposure

The resist film is subjected to plane exposure with EUV ray (wavelength: 13 nm) by varying the exposure quantity by every 0.5 mJ/cm² within the range of 0 to 10.0 mJ/cm².

After irradiation, the resist film is heated at 110° C. for 90 seconds on a hot plate.

Subsequently, the resist film is subjected to shower development with an organic solvent for 30 seconds, and then dried at high speed revolution of 2,000 rpm for 20 seconds.

When solvent is specified in the item of rinsing liquid in the table, after performing spray development with an organic solvent for 30 seconds, rinsing is further carried out for 30 seconds with the specified organic solvent while revolving the wafer at 1,500 rpm, and after that the wafer is dried at high speed revolution of 2,000 rpm for 20 seconds.

Sensitivity (Eth) and film residual rate are evaluated according to the following methods by using the obtained sensitivity-film residual curve.

(4-1) Sensitivity (Eth)

The exposure quantity giving film residual rate of 50% is taken as sensitivity (Eth).

(4-2) Film Residual Rate

[(Film thickness after development/film thickness before development)×100] in the irradiation quantity of 3 magnifications of the obtained sensitivity (Eth) is taken as film residual rate (%).

TABLE 2

| Ex. No. | Resin (A) | Acid Generator (B) | Solvent (40 g) (mass ratio) | Basic Compound | Surfactant (5 mg) | Developer (mass ratio) | Rinsing Liquid | Sensitivity (μC/cm²) | Film Residual Rate (%) |
|---|---|---|---|---|---|---|---|---|---|
| Ex. 19 | A1-1 (0.938 g) | z2 (0.060 g) | S-1 | D-1 (1 mg) | W-1 | S-5 | S-8 | 5.0 | 98 |
| Ex. 20 | A1-2 (0.845 g) | z108 (0.150 g) | S-1/S-2 (80/20) | D-1 (2 mg) | W-2 | S-5 | S-10 | 4.5 | 97 |
| Ex. 21 | A1-3 (0.917 g) | z10 (0.05 g) | S-1/S-2 (60/40) | D-4 (3 mg) | W-3 | S-5 | S-8 | 5.5 | 88 |
| Ex. 22 | A2-1 (0.911 g) | z4 (0.080 g) | S-1 | D-1 (9 mg) | W-4 | S-7 | S-10 | 2.0 | 94 |
| Ex. 23 | A2-2 (0.750 g) | z99 (0.230 g) | S-1/S-2 (30/79) | D-3 (20 mg) | W-1 | S-7 | S-12 | 2.0 | 90 |
| Ex. 24 | A2-3 (0.870 g) | z5 (0.120 g) | S-1 | D-2 (10 mg) | W-2 | S-7 | — | 3.0 | 90 |
| Ex. 25 | A1-1 (0.855 g) | z45 (0.140 g) | S-1/S-4 (80/20) | D-1 (1 mg) | W-3 | S-6 | S-9 | 3.5 | 94 |
| Ex. 26 | A1-2 (0.948 g) | z18 (0.050 g) | S-1/S-4 (60/40) | D-1 (2 mg) | W-4 | S-5 | S-11 | 5.0 | 90 |
| Ex. 27 | A1-3 (0.860 g) | z39 (0.130 g) | S-1/S-2 (70/30) | D-1 (3 mg) | W-1 | S-5/S-6 (80/20) | — | 6.5 | 88 |
| Ex. 28 | A1-4 (0.875 g) | z19 (0.100 g) | S-1 | D-3 (25 mg) | W-1 | S-5 | — | 13.0 | 40 |
| Ex. 29 | A2-4 (0.872 g) | z10 (0.120 g) | S-1 | D-2 (8 mg) | W-1 | S-5 | — | 5.5 | 60 |
| Ex. 30 | A1-1 (0.938 g) | z2 (0.060 g) | S-1 | D-1 (1 mg) | W-1 | S-13 | S-8 | 4.0 | 60 |
| Ex. 31 | A1-5 (0.938 g) | z2 (0.060 g) | S-1 | D-1 (2 mg) | W-1 | S-5 | S-9 | 8.0 | 85 |
| Ex. 32 | A1-6 (0.938 g) | z2 (0.060 g) | S-1 | D-2 (2.5 mg) | W-2 | S-6 | S-11 | 9.0 | 82 |
| Ex. 33 | A1-7 (0.938 g) | z10 (0.05 g) | S-1/S-2 (60/40) | D-4 (3 mg) | W-3 | S-5 | S-8 | 10.0 | 80 |
| Ex. 34 | A1-8 (0.938 g) | z10 (0.05 g) | S-1/S-2 (60/40) | D-3 (5 mg) | W-4 | S-5 | S-10 | 13.0 | 72 |
| Ex. 35 | A2-5 (0.870 g) | z5 (0.120 g) | S-1 | D-1 (10 mg) | W-1 | S-14 | S-10 | 4.5 | 95 |
| Ex. 36 | A2-6 (0.870 g) | z5 (0.120 g) | S-1 | D-4 (10 mg) | W-2 | S-7 | — | 3.5 | 90 |

TABLE 2-continued

| Ex. No. | Resin (A) | Acid Generator (B) | Solvent (40 g) (mass ratio) | Basic Compound | Surfactant (5 mg) | Developer (mass ratio) | Rinsing Liquid | Sensitivity ($\mu C/cm^2$) | Film Residual Rate (%) |
|---|---|---|---|---|---|---|---|---|---|
| Comp. Ex. 3 | A1-3 (0.942 g) | z1 (0.050 g) | S-1 | D-3 (12 mg) | W-1 | TMAH | Pure water | 25 | 60 |
| Comp. Ex. 4 | PMMA (1.0 g) | — | S-3 | — | W-1 | S-5 | S-10 | 35 | 93 |

From the results shown in Tables 1 and 2, it has been found that, according to the pattern-forming method using the actinic ray-sensitive or radiation-sensitive resin composition of the invention and the developer comprising an organic solvent, excellent sensitivity, resolution, pattern form and film residual rate are obtained in the pattern forming with electron beam or EUV ray, and good performance is secured.

Sensitivity, resolution and pattern form of the obtained pattern are evaluated in the same manner as in "(2-1) Sensitivity (Eo), (2-2) Resolution, and (2-3) Pattern form" in the above-mentioned (2) Evaluation of EB exposure. The results of evaluations are shown in the following Table 3. The ratio in the case of using two or more kinds of components is shown as mass ratio.

TABLE 3

| Ex. No. | Resin (A) | Acid Generator (B) | Solvent (40 g) (mass ratio) | Basic Cpd. | Surfactant | Developer (mass ratio) | Rinsing Liquid | Sensitivity ($\mu C/cm^2$) | Resolution ($\mu m$) | Pattern Form |
|---|---|---|---|---|---|---|---|---|---|---|
| Ex. 37 | A1-3 (0.860 g) | Z39 (0.130 g) | S-1/S-2 (70/30) | D-1 (10 mg) | W-1 | S-5 | S-9 | 45.0 | 0.0500 | Rectangle |

2.3 Double Development (EB Exposure)

Example 37

(5) Preparation of Coating Solution of Resist, and Application Thereof

A resist solution is obtained by precisely filtering the coating composition shown in Table 3 through a membrane filter having a pore size of 0.05 μm.

The resist solution is applied on a 6-inch Si wafer having been subjected to HMDS treatment in advance with a spin coater Mark 8 (manufactured by Tokyo Electron Limited), dried on a hot plate at 120° C. for 90 seconds, and a resist film having a thickness of 0.08 μm is obtained.

(6) Evaluation of EB Exposure Using an Organic Solvent and an Alkali Aqueous Solution in Combination Pattern irradiation is performed on the resist film obtained in the above (5) with an electron beam imaging apparatus (HL750, accelerating voltage: 50 KeV, manufactured by Hitachi Ltd.). In the irradiation, the drawing is performed in a manner that an imaged part by electron beam having a width of 10 μm and a non-imaged part having a width of 30 μm are alternately repeated. After irradiation, the resist film is heated at 105° C. for 60 seconds on a hot plate.

Subsequently, the resist film is subjected to paddle development (positive development) for 30 seconds with a 2.38% by mass TMAH aqueous solution, and rinsing is carried out for 30 seconds with pure water while revolving the wafer at 1,500 rpm, and after that the wafer is dried at high speed revolution of 2,000 rpm for 20 seconds.

After that, spray development (negative development) is carried out with butyl acetate for 30 seconds, and further rinsing is conducted with 4-methyl-2-pentanol for 30 seconds while revolving the wafer at 1,500 rpm, and after that the wafer is dried at high speed revolution of 2,000 rpm for 20 seconds.

2.4 Double Development (EUV Exposure)

Example 38

(7) Evaluation of EUV Exposure Using an Organic Solvent and an Alkali Aqueous Solution in Combination The resist film obtained in the above (5) is subjected to plane exposure with EUV ray (wavelength: 13 nm) by varying the exposure quantity by every 0.5 $mJ/cm^2$ within the range of 0 to 10.0 $mJ/cm^2$.

Subsequently, the resist film is subjected to paddle development (positive development) for 30 seconds with a 2.38% by mass TMAH aqueous solution, and rinsing is carried out for 30 seconds with pure water while revolving the wafer at 1,500 rpm, and after that the wafer is dried at high speed revolution of 2,000 rpm for 20 seconds.

After that, spray development (negative development) is carried out with butyl acetate for 30 seconds, and further rinsing is conducted with 4-methyl-2-pentanol for 30 seconds while revolving the wafer at 1,500 rpm, and after that the wafer is dried at high speed revolution of 2,000 rpm for 20 seconds.

As a result, it has been shown that the film in the area of intermediate exposure strength alone is left, and a pattern that is finer than a usual pattern can be formed.

Industrial Applicability

According to the invention, a pattern-forming method capable of satisfying high sensitivity, high resolution, a good pattern form and a residual film rate even in a super fine processing region with an electron beam or an EUV ray can be provided.

The entire disclosure of Japanese Patent Application No. 2009-038666 filed on Feb. 20, 2009, from which the benefit of foreign priority has been claimed in the present application, is incorporated herein by reference, as if fully set forth.

The invention claimed is:

1. A pattern-forming method comprising, in the following order:

(1) a process of forming a film with an actinic ray-sensitive or radiation-sensitive resin composition comprising a resin which contains an acid-decomposable repeating unit and is capable of decreasing the solubility in an organic solvent by the action of an acid;
(2) a process of exposing the film with an electron beam or an EUV ray; and
(4) a process of developing the film with a developer containing an organic solvent,
wherein the actinic ray-sensitive or radiation-sensitive resin composition comprises:
(A) the resin containing an acid-decomposable repeating unit and being capable of decreasing the solubility in an organic solvent by the action of an acid;
(B) a compound generating an acid upon irradiation with an actinic ray or radiation; and
(C) a solvent;
and further wherein the resin (A) is a resin containing from 1 to 40 mol % of a repeating unit represented by the following formula (1):

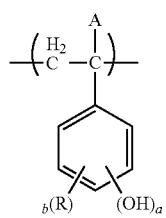

(1)

wherein
A represents a hydrogen atom, an alkyl group, a cycloalkyl group, a halogen atom, or a cyano group;
R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group or an aryloxycarbonyl group, and when two or more R's are present, each R may be the same as or different from every other R or when two or more R's are present, they may form a ring in combination with each other;
a represents an integer of 1 to 3; and
b represents an integer of 0 to (3-a).

2. The pattern-forming method as claimed in claim 1, further comprising:
a process of developing the film with an alkali aqueous solution.

3. The pattern-forming method as claimed in claim 1, wherein
the organic solvent contained in the developer used in the process (4) is one or more solvents selected from the group consisting of an ester solvent, a ketone solvent, an alcohol solvent, an amide solvent, an ether solvent, and a hydrocarbon solvent.

4. The pattern-forming method as claimed in claim 1, wherein
the organic solvent contained in the developer used in the process (4) is a solvent represented by the following formula (S1):

R—C(=O)—O—R'    (S1)

wherein
each of R and R' independently represents a hydrogen atom, an alkyl group, a cycloalkyl group, an alkoxy group, an alkoxycarbonyl group, a carboxyl group, a hydroxyl group, a cyano group, or a halogen atom, and R and R' may be bonded to each other to form a ring.

5. The pattern-forming method as claimed in claim 3, wherein
the organic solvent contained in the developer used in the process (4) is a solvent represented by the following formula (S2):

R''—C(=O)—O—R'''—O—R''''    (S2)

wherein
each of R'' and R'''' independently represents a hydrogen atom, an alkyl group, a cycloalkyl group, an alkoxy group, an alkoxycarbonyl group, a carboxyl group, a hydroxyl group, a cyano group, or a halogen atom, and R'' and R'''' may be bonded to each other to form a ring; and
R''' represents an alkylene group or a cycloalkylene group.

6. The pattern-forming method as claimed in claim 1, wherein
the organic solvent contained in the developer used in the process (4) is one or more solvents selected from the group consisting of butyl acetate, pentyl acetate, isopentyl acetate, propylene glycol monomethyl ether acetate, and anisole.

7. The pattern-forming method as claimed in claim 1, further comprising:
(5) a process of rinsing the film with a rinsing liquid containing an organic solvent after the process (4).

8. The pattern-forming method as claimed in claim 7, wherein
the organic solvent contained in the rinsing liquid used in the process (5) is one or more solvents selected from the group consisting of a monohydric alcohol and a hydrocarbon solvent.

9. The pattern-forming method as claimed in claim 7, wherein
the organic solvent contained in the rinsing liquid used in the process (5) is one or more solvents selected from the group consisting of 1-hexanol, 4-methyl-2-pentanol, and decane.

10. The pattern-forming method as claimed in claim 1, further comprising:
(3) a baking process between the exposure process (2) and the development process (4).

11. The pattern-forming method as claimed in claim 1, wherein
the resin (A) further contains a repeating unit represented by the following formula (AI):

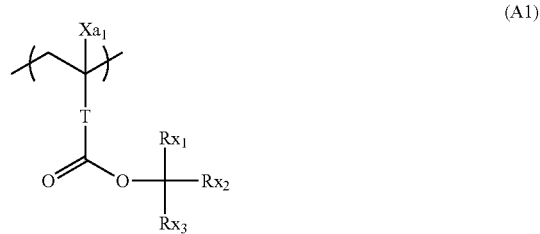

(AI)

wherein
$Xa_1$ represents a hydrogen atom or an alkyl group;
T represents a single bond or a divalent linking group; and
each of $Rx_1$, $Rx_2$ and $Rx_3$ independently represents an alkyl group or a cycloalkyl group, and $Rx_2$ and $Rx_3$ may be bonded to each other to form a cyclic structure.

12. The pattern-forming method as claimed in claim 1, which is a method for forming a fine circuit of a semiconductor device.

13. The pattern-forming method as claimed in claim 12, wherein the content of the repeating unit represented by formula (1) is in the range of 5 to 30 mol % based on all the repeating units.

14. A pattern-forming method comprising, in the following order:
(1) a process of forming a film with an actinic ray-sensitive or radiation-sensitive resin composition comprising a resin which contains an acid-decomposable repeating unit and is capable of decreasing the solubility in an organic solvent by the action of an acid;
(2) a process of exposing the film with an electron beam or an EUV ray; and
(4) a process of developing the film with a developer containing an organic solvent,
wherein the actinic ray-sensitive or radiation-sensitive resin composition comprises:
(A) the resin containing an acid-decomposable repeating unit and being capable of decreasing the solubility in an organic solvent by the action of an acid;
(B) a compound generating an acid upon irradiation with an actinic ray or radiation; and
(C) a solvent; and
the resin (A) is a resin containing a repeating unit having a lactone structure and a repeating unit represented by the following formula (1):

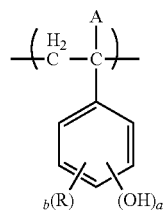

(1)

wherein
A represents a hydrogen atom, an alkyl group, a cycloalkyl group, a halogen atom, or a cyano group;
R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group or an aryloxycarbonyl group, and when two or more R's are present, each R may be the same as or different from every other R or when two or more R's are present, they may form a ring in combination with each other;
a represents an integer of 1 to 3; and
b represents an integer of 0 to (3-a).

15. The pattern-forming method as claimed in claim 14, wherein
the organic solvent contained in the developer used in the process (4) is one or more solvents selected from the group consisting of an ester solvent, a ketone solvent, an alcohol solvent, an amide solvent, an ether solvent, and a hydrocarbon solvent.

16. The pattern-forming method as claimed in claim 14, wherein
the organic solvent contained in the developer used in the process (4) is a solvent represented by the following formula (S1):

R—C(=O)—O—R' (S1)

wherein
each of R and R' independently represents a hydrogen atom, an alkyl group, a cycloalkyl group, an alkoxy group, an alkoxycarbonyl group, a carboxyl group, a hydroxyl group, a cyano group, or a halogen atom, and R and R' may be bonded to each other to form a ring.

17. The pattern-forming method as claimed in claim 14, wherein
the organic solvent contained in the developer used in the process (4) is one or more solvents selected from the group consisting of butyl acetate, pentyl acetate, isopentyl acetate, propylene glycol monomethyl ether acetate, and anisole.

18. The pattern-forming method as claimed in claim 14, further comprising:
(5) a process of rinsing the film with a rinsing liquid containing an organic solvent after the process (4).

19. The pattern-forming method as claimed in claim 14, wherein
the resin (A) further contains a repeating unit represented by the following formula

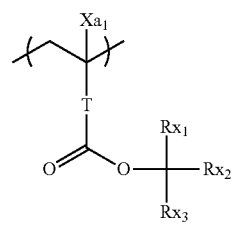

(AI)

wherein
$Xa_1$ represents a hydrogen atom or an alkyl group;
T represents a single bond or a divalent linking group; and
each of $Rx_1$, $Rx_2$ and $Rx_3$ independently represents an alkyl group or a cycloalkyl group, and $Rx_2$ and $Rx_3$ may be bonded to each other to form a cyclic structure.

20. The pattern-forming method as claimed in claim 14, which is a method for forming a fine circuit of a semiconductor device.

21. The pattern-forming method as claimed in claim 14, wherein the repeating unit having a lactone structure is a repeating unit represented by the formula (AII):

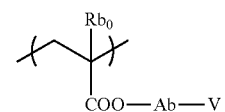

(AII)

wherein in formula (AII), $Rb_0$ represents a hydrogen atom, a halogen atom, or an alkyl group having from 1 to 4 carbon atoms;
Ab represents a single bond, an alkylene group, a divalent linking group having a monocyclic or polycyclic alicyclic hydrocarbon structure, an ether bond, an ester bond, a carbonyl group, a divalent group of combining these groups, or a linking group represented by —$Ab_1$—$CO_2$—;
$Ab_1$ represents a straight chain or branched alkylene group, or a monocyclic or polycyclic cycloalkylene group; and V represents a group having a lactone structure.

22. The pattern-forming method as claimed in claim 14, wherein the repeating unit having a lactone structure is a repeating unit represented by the formula (3-1):

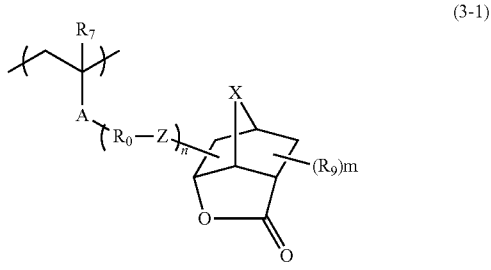

wherein in formula (3-1), $R_7$ represents a hydrogen atom, a halogen atom or an alkyl group;

A represents an ester bond of the formula —COO— or a group represented by —CONH—;

$R_0$ represents an alkylene group, a cycloalkylene group, or a combination of these groups, and when two or more $R_0$'s are present, each $R_0$ may be the same as or different from every other $R_0$;

Z represents a single bond, an ether bond, an ester bond, an amido bond, a urethane bond, or a urea bond, and when two or more Z's are present, each Z may be the same as or different from every other Z;

$R_9$ represents an alkyl group, a cycloalkyl group, an alkoxycarbonyl group, a cyano group, a hydroxyl group or an alkoxy group, and when two or more $R_9$'s are present, each $R_9$ may be the same as or different from every other $R_9$ or two of $R_9$'s may be bonded to each other to form a ring;

X represents an alkylene group, an oxygen atom or a sulfur atom;

m is the number of the substituents $R_9$ and represents an integer of 0 to 5; and n is the repeating number of the structure represented by —$R_0$—Z— in the repeating unit represented by formula (3) and represents an integer of 1 to 5.

23. The pattern-forming method as claimed in claim 19, wherein the content of the repeating unit represented by formula (1) in the resin is in the range of 1 to 40 mol % based on all the repeating units, and the content of the repeating unit represented by formula (AI) in the resin is in the range of 20 to 70 mol % based on all the repeating units.

24. A pattern-forming method comprising, in the following order:
  (1) a process of forming a film with an actinic ray-sensitive or radiation-sensitive resin composition comprising a resin which contains an acid-decomposable repeating unit and is capable of decreasing the solubility in an organic solvent by the action of an acid;
  (2) a process of exposing the film with an electron beam or an EUV ray; and
  (4) a process of developing the film with a developer containing an organic solvent;

wherein the actinic ray-sensitive or radiation-sensitive resin composition comprises:
  (A) the resin containing an acid-decomposable repeating unit and being capable of decreasing the solubility in an organic solvent by the action of an acid;
  (B) a compound generating an acid upon irradiation with an actinic ray or radiation; and
  (C) a solvent; and the resin (A) is a resin containing a repeating unit having an alicyclic hydrocarbon structure substituted with a hydroxyl group or a cyano group and a repeating unit represented by the following formula (1):

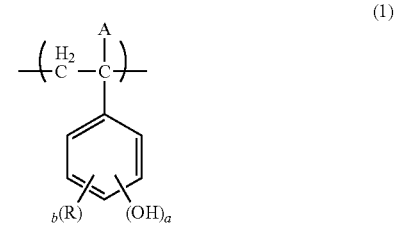

wherein
A represents a hydrogen atom, an alkyl group, a cycloalkyl group, a halogen atom, or a cyano group;
R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group or an aryloxycarbonyl group, and when two or more R's are present, each R may be the same as or different from every other R or when two or more R's are present, they may form a ring in combination with each other;
a represents an integer of 1 to 3; and
b represents an integer of 0 to (3-a).

25. The pattern-forming method as claimed in claim 24, wherein
the organic solvent contained in the developer used in the process (4) is one or more solvents selected from the group consisting of an ester solvent, a ketone solvent, an alcohol solvent, an amide solvent, an ether solvent, and a hydrocarbon solvent.

26. The pattern-forming method as claimed in claim 24, wherein
the organic solvent contained in the developer used in the process (4) is a solvent represented by the following formula (S1):

$$R-C(=O)-O-R' \tag{S1}$$

wherein
each of R and R' independently represents a hydrogen atom, an alkyl group, a cycloalkyl group, an alkoxy group, an alkoxycarbonyl group, a carboxyl group, a hydroxyl group, a cyano group, or a halogen atom, and R and R' may be bonded to each other to form a ring.

27. The pattern-forming method as claimed in claim 24, wherein
the organic solvent contained in the developer used in the process (4) is one or more solvents selected from the group consisting of butyl acetate, pentyl acetate, isopentyl acetate, propylene glycol monomethyl ether acetate, and anisole.

28. The pattern-forming method as claimed in claim 24, further comprising:

(5) a process of rinsing the film with a rinsing liquid containing an organic solvent after the process (4).

29. The pattern-forming method as claimed in claim 24, wherein the resin (A) further contains a repeating unit represented by the following formula (AI):

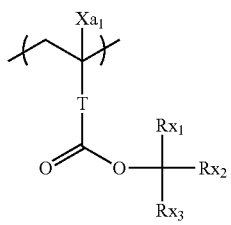

(AI)

wherein $Xa_1$ represents a hydrogen atom or an alkyl group;

T represents a single bond or a divalent linking group; and each of $Rx_1$, $Rx_2$ and $Rx_3$ independently represents an alkyl group or a cycloalkyl group, and $Rx_2$ and $Rx_3$ may be bonded to each other to form a cyclic structure.

30. The pattern-forming method as claimed in claim 24, which is a method for forming a fine circuit of a semiconductor device.

31. The pattern-forming method as claimed in claim 24, wherein the repeating unit having an alicyclic hydrocarbon structure substituted with a hydroxyl group or a cyano group is a repeating unit represented by any of the formula (AIIa) to (AIId):

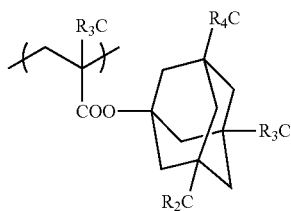

(AIIa)

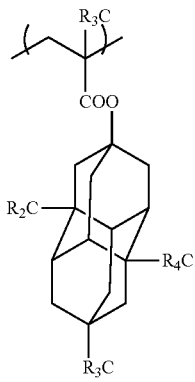

(AIIb)

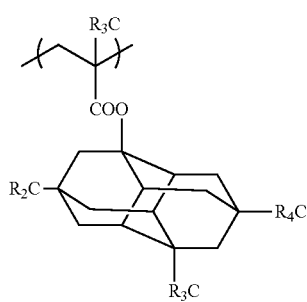

(AIIc)

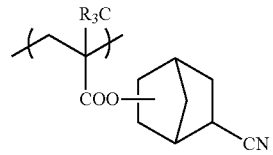

(AIId)

wherein in formulae (AIIa) to (AIId), $R_1c$ represents a hydrogen atom, a methyl group, a trifluoromethyl group or a hydroxymethyl group;

each of $R_2c$ to $R_4c$ independently represents a hydrogen atom, a hydroxyl group or a cyano group, provided that at least one of $R_2c$ to $R_4c$ represents a hydroxyl group or a cyano group.

32. The pattern-forming method as claimed in claim 24, wherein the resin (A) contains a repeating unit having a lactone structure.

33. The pattern-forming method as claimed in claim 29, wherein the content of the repeating unit represented by formula (1) in the resin is in the range of 1 to 40 mol % based on all the repeating units, and the content of the repeating unit represented by formula (AI) in the resin is in the range of 20 to 70 mol % based on all the repeating units, and the content in the resin of the repeating unit having an alicyclic hydrocarbon structure substituted with a hydroxyl group or a cyano group is 1 to 40 mol %, based on all the repeating units.

* * * * *